United States Patent [19]

Iwamura

[11] Patent Number: 5,774,389
[45] Date of Patent: Jun. 30, 1998

[54] ERROR CORRECTION APPARATUS

[75] Inventor: Keiichi Iwamura, Yokohama, Japan

[73] Assignee: Canon Kabushiki Kaisha, Tokyo, Japan

[21] Appl. No.: 701,327

[22] Filed: Aug. 23, 1996

Related U.S. Application Data

[62] Division of Ser. No. 400,521, Mar. 7, 1995, Pat. No. 5,590,138, Ser. No. 90,549, Jul. 13, 1993, abandoned, and Ser. No. 885,248, May 20, 1992, abandoned, and a continuation of Ser. No. 515,682, Apr. 26, 1990, abandoned, and Ser. No. 102,583, Sep. 28, 1987, abandoned.

[30] Foreign Application Priority Data

| Sep. 30, 1986 | [JP] | Japan | 61-232001 |
|---|---|---|---|
| Sep. 30, 1986 | [JP] | Japan | 61-232002 |
| Sep. 30, 1986 | [JP] | Japan | 61-232003 |
| Sep. 30, 1986 | [JP] | Japan | 61-232004 |
| Sep. 30, 1986 | [JP] | Japan | 61-232005 |
| Sep. 30, 1986 | [JP] | Japan | 61-232006 |
| Sep. 30, 1986 | [JP] | Japan | 61-232007 |
| Sep. 30, 1986 | [JP] | Japan | 61-232008 |

[51] Int. Cl.$^6$ ............................ H03M 13/00; G06F 7/552
[52] U.S. Cl. .................................... 364/746.1; 371/37.11
[58] Field of Search .......................... 371/37.1, 37.11; 364/746.1, 753

[56] References Cited

U.S. PATENT DOCUMENTS

| 4,151,510 | 4/1979 | Howell et al. | 340/146.1 |
|---|---|---|---|
| 4,162,480 | 7/1979 | Berlekamp | 340/146.1 |
| 4,216,531 | 8/1980 | Chiu | 364/757 |
| 4,218,582 | 8/1980 | Hellman et al. | 380/30 |
| 4,413,339 | 11/1983 | Riggle et al. | 371/38 |
| 4,476,562 | 10/1984 | Sako et al. | 371/39 |
| 4,498,178 | 2/1985 | Ohhashi | 371/37 |
| 4,567,600 | 1/1986 | Massey et al. | 375/2.1 |
| 4,649,541 | 3/1987 | Lahmeyer | 371/37 |
| 4,658,094 | 4/1987 | Clark | 380/28 |
| 4,675,869 | 6/1987 | Driessen | 371/37 |
| 4,759,063 | 7/1988 | Chaum | 380/30 |
| 4,797,848 | 1/1989 | Walby | 364/754 |

FOREIGN PATENT DOCUMENTS

| 889658 | 11/1981 | Belgium . |
|---|---|---|
| 0071836 | 2/1983 | European Pat. Off. . |
| 0075985 | 4/1983 | European Pat. Off. . |
| 0080528 | 6/1983 | European Pat. Off. . |
| 0096109 | 12/1983 | European Pat. Off. . |
| 0096163 | 12/1983 | European Pat. Off. . |
| 0096165 | 12/1983 | European Pat. Off. . |
| 0129849 | 1/1985 | European Pat. Off. . |
| 0140381 | 5/1985 | European Pat. Off. . |
| 0 147 041 | 7/1985 | European Pat. Off. . |
| 0152702 | 8/1985 | European Pat. Off. . |
| 62-21137 | 10/1983 | Japan . |

OTHER PUBLICATIONS

Arai, et al., Digital Signal Processing Technology for R–DAT, IEEE Transactions on Consumer Electronics, vol. CE–32, No. 3, Aug. 1986, pp. 740–749.

(List continued on next page.)

*Primary Examiner*—Stephen M. Baker
*Attorney, Agent, or Firm*—Fitzpatrick, Cella, Harper & Scinto

[57] ABSTRACT

An error correction apparatus is disclosed for use in erasure correction and error correction in transmission paths of devices such as optical disk devices, upon receipt of input data of various formats. The apparatus has a select signal generating circuit for generating, in response to the format of the input data, a select signal corresponding to the format of the input data. Also taught is an erasure correction and error correction circuit for conducting error correction which includes erasure correction; and a controlling circuit for controlling the erasure correction and error correction in accordance with the select signal so as to conduct correction in conformity with the format of the input data. Thus, erasure correction and error correction can be conducted, regardless of format of the input data.

4 Claims, 45 Drawing Sheets

OTHER PUBLICATIONS

Tanaka, et al., Application of Generalized Product Code for Stationary–Head Type Professional Digital Audio Recorder, The Transactions of the IECE of Japan, vol. E 69, No. 6, Jun. 1986, pp. 416–423.

Hsu, et al., The VLSI Implementation of a Reed–Solomon Encoder Using Berlekamp's Bit–Serial Multiplier Algorithm, IEEE Transactions on Computers, vol. C–33, No. 10, Oct. 1984, pp. 906–911.

Japanese Patent Abstract vol. 7, No. 238 for Kokai No. 58–125175, Jul. 1983.

Wang, et al., VLSI Architectures for Computing Multiplications and Inverses in $GF(2^m)$, 8092 IEEE Transactions on Computers, pp. 709–717, Aug. 1985.

Scott, et al., A Fast VLSI Multiplier for $GF(2^m)$, 8272 IEEE Journal on Selected Areas in Communications SAC–4, pp. 62–66, Jan. 1986.

NASA Tech Brief, Multiplier Architecture for Coding Circuits, 2301 N.T.I.S. Technical Notes, No. 7, p. 1, Jul. 1986.

Redinbo, Fault–Tolerant Digital Filtering Structures for Wafer Scale VLSI, pp. 1189–1192, 1986.

Lin, et al., Error Control Coding, Prentice–Hall, Inc., 1983, pp. 161–167.

Patent Abstracts of Japan, Kokai 58–219851, vol. 8, No. 70, Dec. 1983.

Maki, et al., A VLSI Reed Solomon Encoder: An Engineering Approach, IEEE Custom Integrated Circuits Conference, May 1986, pp. 177–181.

Glover, et al., Practical Error Correction Design for Engineers, 1st Ed., pub. 1982 by Data Systems Technology Corp., pp. 105–118.

Glover, et al., Practical Error Correction Design for Engineers, 2nd Ed., pub. 1982 by Data Systems Technology Corp., p. 106.

| Sc1 | Fc1 |
|---|---|
| 0 | 0 |
| 1 | 0 |
| 2 | 1 |
| 3 | 1 |

(2) C2

| Sc2 \ NC1/LC1 | | 5 OR MORE | 4 | 3 | 2 | 1 | 0 |
|---|---|---|---|---|---|---|---|
| 0 | | 0 | | | | | |
| 1 | | 0 | | | | | |
| 2 | 2 | Fc1 | 0 | | | | |
| | 1 | Fc1 | | 1 | | | |
| | 0 | Fc1 | | | 1 | | |
| 3 | | Fc1 | | | 1 | | |

$$\begin{bmatrix} 1 & 1 & \cdots & 1 & 1 & 1 \\ \alpha^{N-2} & \alpha^{N-3} & \cdots & \alpha^2 & \alpha & 1 \\ \alpha^{2(N-2)} & \alpha^{2(N-3)} & \cdots & \alpha^4 & \alpha^2 & 1 \\ \alpha^{3(N-2)} & \alpha^{3(N-3)} & \cdots & \alpha^6 & \alpha^3 & 1 \end{bmatrix} \begin{pmatrix} i_{n-2} \\ i_{n-3} \\ \vdots \\ i_2 \\ i_1 \\ i_0 \end{pmatrix} = \begin{pmatrix} 0 \\ 0 \\ 0 \\ 0 \end{pmatrix}$$

$$\Downarrow$$

$$\begin{bmatrix} 1 & 1 & \cdots & 1 \\ \alpha^{N-2} & \alpha^{N-3} & \cdots & \alpha^4 \\ \alpha^{2(N-2)} & \alpha^{2(N-3)} & \cdots & \alpha^8 \\ \alpha^{3(N-2)} & \alpha^{3(N-1)} & \cdots & \alpha^{12} \end{bmatrix} \begin{pmatrix} i_{n-2} \\ i_{n-3} \\ \vdots \\ i_4 \end{pmatrix} = \begin{pmatrix} 1 & 1 & 1 & 1 \\ \alpha^3 & \alpha^2 & \alpha & 1 \\ \alpha^6 & \alpha^4 & \alpha^2 & 1 \\ \alpha^9 & \alpha^6 & \alpha^3 & 1 \end{pmatrix} \begin{pmatrix} i_3 \\ i_2 \\ i_1 \\ i_0 \end{pmatrix}$$

$$\Downarrow$$

$$\begin{bmatrix} 1 & 1 & 1 & 1 \\ \alpha^3 & \alpha^2 & \alpha & 1 \\ \alpha^6 & \alpha^4 & \alpha^2 & 1 \\ \alpha^9 & \alpha^6 & \alpha^1 & 1 \end{bmatrix}^{-1} \begin{bmatrix} 1 & 0 & 0 & 0 \\ 0 & \alpha^4 & 0 & 0 \\ 0 & 0 & \alpha^8 & 0 \\ 0 & 0 & 0 & \alpha^{12} \end{bmatrix} \begin{bmatrix} 1 & 1 & \cdots & 1 \\ \alpha^{N-6} & \alpha^{N-7} & \cdots & 1 \\ \alpha^{2(N-6)} & \alpha^{2(N-7)} & \cdots & 1 \\ \alpha^{3(N-6)} & \alpha^{3(N-7)} & \cdots & 1 \end{bmatrix} \begin{pmatrix} i_{n-2} \\ i_{n-3} \\ \vdots \\ i_4 \end{pmatrix} = \begin{pmatrix} i_3 \\ i_2 \\ i_1 \\ i_0 \end{pmatrix}$$

$$\begin{bmatrix} A_{11} & A_{12} & A_{13} & A_{14} \\ A_{21} & A_{22} & A_{23} & A_{24} \\ A_{31} & A_{32} & A_{33} & A_{34} \\ A_{41} & A_{42} & A_{43} & A_{44} \end{bmatrix} \begin{pmatrix} S_0 \\ S_1 \\ S_2 \\ S_3 \end{pmatrix} = \begin{pmatrix} i_1 \\ i_2 \\ i_3 \\ i_4 \end{pmatrix}$$

FIG. 21

| Sci \ Nci/Lci | n ----- 5 | | 4 | 3 | 2 | 1 | 0 |
|---|---|---|---|---|---|---|---|
| (a) 0 | | Fci | | | 0 | | |
| (b) 1 — 1 | | Fci | | | 0 | | |
| (c) 1 — 0 | | Fci | FREE | | 0 | | |
| (d) 2 — 2 | | Fci | | | 0 | | |
| (e) 2 — 1 | | Fci | | | 0 | | |
| (f) 2 — 0 | | Fci | | | 0 | | |
| (g) 3 | | | Fci | | | | |

FIG.46
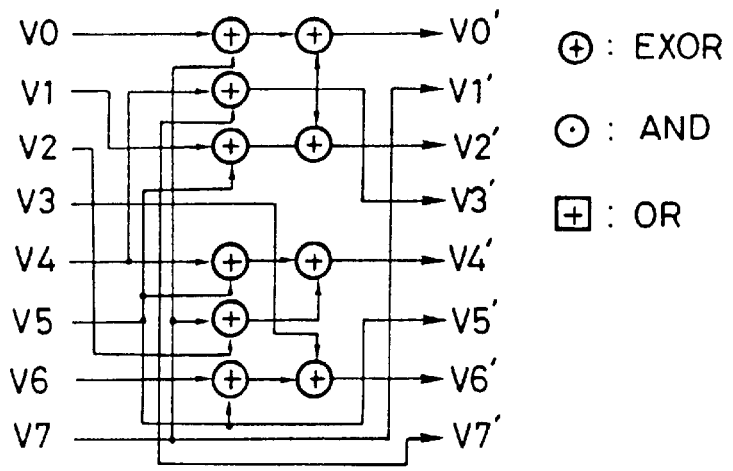
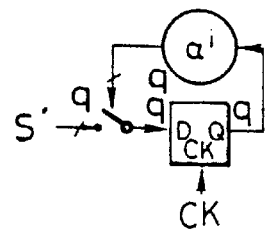
FIG.49
FIG.50
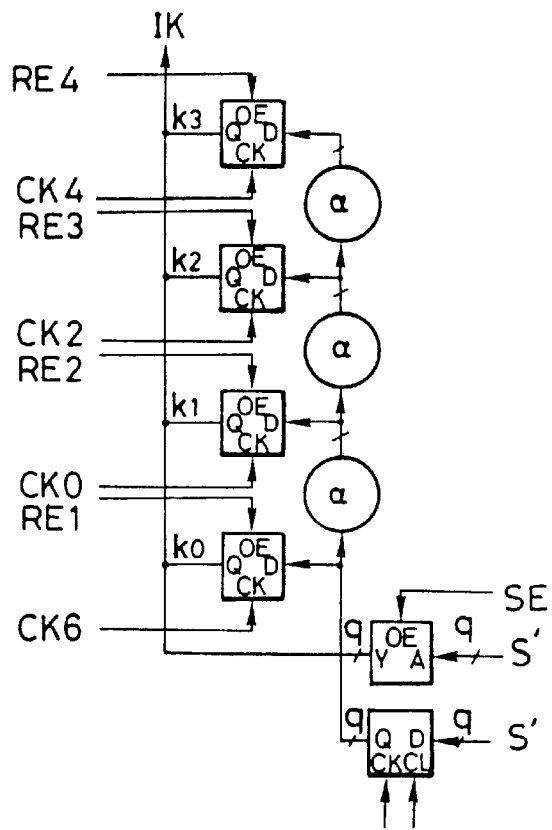

| FIG.60A |
| FIG.60B |

$X^2$ CKT $X^4$ CKT $X^8$ CKT

ERROR CORRECTION APPARATUS

This application is a divisional of application Ser. No. 08/400,521 filed Mar. 7, 1995, now U.S. Pat. No. 5,590,138, which is a divisional of application Ser. No. 08/090,549 filed Jul. 13, 1993, now abandoned, which is a divisional of application Ser. No. 07/885,248 filed May 20, 1992, now abandoned, which is a continuation of application Ser. No. 07/515,682 filed Apr. 26, 1990, now abandoned, which is a continuation of application Ser. No. 07/102,583 filed Sep. 28, 1987, now abandoned.

BACKGROUND OF THE INVENTION

1. Field of the Invention

The present invention relates to the field of error correction, intended for reduction of rate of occurrence of error in the path of transmission from a device such as an optical disk device, opto-magnetic disk device, and so forth.

More particularly, the invention relates to an error correction circuit for use in a digital electronic device such as a digital audio device, particularly a flag strategy setting circuit which is typically a BCH (Bose-Chaudhuri-Hocquenghem) encoding and decoding circuit for use in the error correction circuit.

Still more particularly, the invention is concerned with a syndrome creating circuit incorporated in the BCH encoding and decoding circuit, particularly to an unknown-exponent/vector conversion circuit, multiplication circuit and division circuit on a Galois function. The term, Galois function, in this specification is used to mean a set of a definite number of unknowns which can be processed by addition, subtraction, multiplication and division and usually expressed as GF(q), where q represents the number of unknowns.

2. Related Background Art

Hitherto, error correction apparatus of the type described has been generally designed to operate in response to an error correction code of a predetermined format having factors such as the length of error correction code, correction capacity and interleave. Thus, the known error correction apparatus could not operate when the correction code of a different format is applied and when a plurality of blocks of correction codes of various formats are supplied serially.

Optical disks and opto-magnetic disks are usually kept under sector administration. The sector contains not only ordinary data, but also address data. Protection of these two types of data is a matter of great significance. Conventionally, error correction codes such as read solomon codes have been used as protection means for protecting the ordinary data portion, while error detection codes such as CRC (Cyclic Redundancy Check) codes have been used as means for protecting the address data. An erroneous recognition of the address data will lead to an error of the whole sector. Therefore, in the conventional systems, a greater importance has been given to the detection accuracy than to the correction performance insofar as the address data is concerned. Thus, any error in the address data has been corrected through an over-writing or re-try. There are some types of recording medium which enable the address data to be corrected through re-try, but not through overwriting. An example of such a type of recording medium is an opto-magnetic disk. In the correction of address data in such a recording medium, it is necessary that the disk is rotated three times: namely, first rotation for erasure, second rotation for writing and third rotation for check, each rotation requiring detection of address. Consequently, the number of the re-try cycles is increased, resulting in a longer delay time, particularly in the medium having a greater rate of occurrence of error. It would be possible to use an error correction code for the purpose of correction of address data. In general, however, an error correction device requires a much more complicated construction than the error detecting device. When the correction of address data is to be conducted by means of a correction code, it is necessary to use a pair of error correction devices: namely, one for correction of address data and one for correction of ordinary data.

THE THEORY OF ERROR CORRECTING CODES, written by F. J. Macwiliam and N. J. A. Sloan, published in 1978 by North Holland Publishing Company, U.S.A., proposes CIRC (Cross-Interleaved Read Solomon Code), particularly two-staged decoding having 2-symbol error correction facility. Typical examples of the strategy used in this two-staged decoding are as follows, where C1 decoder and C2 decoder mean the decoders which conduct decoding earlier and later, respectively.

(1) Simple strategy

C1 decoder ..... 1 symbol error correction ..... 3 symbol error detection

C2 decoder ..... 1 symbol error correction ..... 3 symbol error detection (2) Super strategy C1 decoder ..... 2 symbol error correction (Flag is set up in case of 2 symbol error correction)

C2 decoder ..... 2 symbol error correction

In the case of a digital audio equipment, any detection error causes a click noise and, hence, is critical. Any error which cannot be corrected, however, can be compensated for by interpolation to such an extent that it does not substantially impair the audio effect, provided that the error is detected. It is therefore necessary to maximize the error detection capacity at the cost of reduced error correction capacity, as in the simple strategy (1) shown above. When the compensation by, for example, the interpolation is not effective, 2 symbol error correction is performed by the C1 decoder as in the case of the super strategy (2) mentioned above. In this case, a flag is set up to also enhance the error detection capacity, thereby to reduce the rate of error detection failure.

It is thus possible to optimize the format for error detection by selectively changing the strategy, even when the format has an identical construction both in vertical and horizontal directions.

A description will be made hereinunder as to a super strategy (2) on an assumption that C1 decoder (32, 28) and C2 decoder (28, 24) are used.

i) C1 decoder

The following process is conducted in accordance with the result of judgment of received syndrome Sc1.

(a) Sc1="0"→Correction not conducted; Fc1=0

(b) Sc1="1"→1 symbol error corrected; Fc1=0

(c) Sc1="2"→2 symbol error corrected; Fc1=1

(d) Sc1≧"3"→Correction not conducted; Fc1=1 where,

"n": n-symbol error syndrome

Fc1: Flag data created in C1 decoder and sent to C2 decoder

Fc1=0→No error

Fc1=1→Possibility of inclusion of any error ii) C2 decoder

The following process is conducted in accordance with the result of judgment of received syndrome Sc2, and number and positions of flags Fc1 from C1 decoder.

(a) Sc2="0"→Correction not conducted; Fc2=0
(b) Sc2="1"→1 symbol error corrected; Fc2=0
(c) Sc1="2", Nc1≦4, Lc1=2→2 symbol error corrected; Fc2=0, Nc1≦3, Lc1=1 or Nc1≦2, Lc1=0→Correction not conducted; Fc2=1,
Other cases→Correction not conducted; Fc2=Fc1
(d) Sc2≧"3", Nc1≦2 →Correction not conducted Fc2=1
Other cases→Correction not conducted Fc2=Fc1 where,

Nc1: Number of flags Fc1 received by C2 decoder
Lc1: Number of flags Fc1 coincided with error location
Fc2: Flag created in C2 decoder
  Fc2=0→No error
  Fc2=1→All errors
  Fc2=Fc1→Flags created in C1 decoder are copied.

The above-described principle will be more readily understood from FIG. 2. It will be seen that the simple strategy is the strategy in which the C2 decoder has the same construction as the C1 decoder shown in FIG. 2(1).

Conventionally, once the flag strategy in each of the C1 and C2 decoders is set as described above, the thus set strategy is fixed and cannot be freely changed or adjusted.

It is also a conventional way to conduct the BCH encoding by means of a division circuit employing a creating polynomial and to conduct the decoding by means of circuits of the respective algorithms such as those according to Peterson's method or Bharenkamp-Massey.

Thus, the conventional system employs different circuits for encoding and decoding. Attempts have been made to conduct encoding and decoding by making use of the same circuit in a multiplied manner in accordance with, for example, microprogramming. In such a case, however, it is necessary that a delicate difference be made between the encoding process and the decoding process. Therefore, when the encoding and decoding are to be conducted by means of the same circuitboard or chip, the number of circuits or the capacity of ROM is increased inevitably. This in turn causes the size of the device such as an optical disk device to be increased undesirably.

The syndrome creating circuit in conventional BHC encoding or decoding circuit produces the syndrome S as represented by the following formula (2), upon receipt of a word J which, as shown in the following formula (1), has a term of the code word I and a term of error E.

$$\begin{pmatrix} j1 \\ j2 \\ \cdot \\ \cdot \\ \cdot \\ jn-1 \\ jn \end{pmatrix} = \overbrace{\begin{pmatrix} i1 \\ i2 \\ \cdot \\ \cdot \\ \cdot \\ in-1 \\ in \end{pmatrix}}^{I} + \overbrace{\begin{pmatrix} e1 \\ e2 \\ \cdot \\ \cdot \\ \cdot \\ en-1 \\ en \end{pmatrix}}^{E} \quad (1)$$

Namely, in case of double error correction encoding, the syndrome S is created as the product of a check matrix H and the received word J, as shown by the formula (2).

$$\underbrace{\begin{pmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \alpha^{3(n-1)} & \alpha^{3(n-2)} & \ldots & \alpha^3 & 1 \end{pmatrix}}_{H} \cdot \begin{pmatrix} j1 \\ j2 \\ \cdot \\ \cdot \\ \cdot \\ jn-1 \\ jn \end{pmatrix} = \begin{pmatrix} S0 \\ S1 \\ S2 \\ S3 \end{pmatrix} = S \quad (2)$$

where, n represents the code length, H represents the check matrix, J represents the code length, S represents the syndrome, I represents the code word, and E represents the error, From the following formula (3), it will be understood that the thus obtained syndrome (3) is the product of the check matrix H and the error E.

0 (from formula (2))

$$S = H \cdot J = H \cdot (I+E) = H \cdot I + H \cdot E = H \cdot E \quad (3)$$

Normally, the syndrome creating circuit can be expressed as follows for each syndrome Si.

$$Si = \alpha^{i(n-1)} \cdot J1 + \alpha^{i(n-2)} \cdot J2 + \ldots + \alpha \cdot jn-1 + Jn = ((((\alpha^i \cdot j1) + j2) \cdot \alpha^i) + \ldots Jn-1) \cdot \alpha^i + Jn$$

Thus, the syndrome creating circuit on the Galois function GF(2q) can be constructed as shown in FIG. 3. The $\alpha^i$ circuit can be realized by stacking the α circuit of FIG. 4 in i stages, on condition of a primitive, polynomial $p(x)=X^8+X^4+X^3+X^2+1$. Thus, the syndrome creating circuit for realizing S0 to S3 expressed by the formula (2) can be constructed as shown in FIG. 5. In FIG. 5, CK represents clock for each received word Ji, while CL represents the clear for each code length.

Obviously, the size of the construction shown in FIG. 5 becomes large as the number q or the number i becomes large. In addition, the arrangement shown in FIG. 5 is not suitable for use in the case when the syndromes S0 to S3 are interconnected and processed through a BUS line.

There are two types of ways of expression of the unknown of the Galois member: namely, expression in terms of vector and expression in terms of exponent. Representing a Galois function having q unknowns by GF(q), the unknown $\alpha^8$ created on GF($2^8$) from the primitive polynomial $p(x)=X^8+X^4+X^3+X^2+1$ is expressed as follows.

Exponential expression   Vector expression
$\alpha^8 \to 8$   :   000111101

This vector expression shows the bit pattern. Division in terms of vector is complicated and difficult to conduct. Practically, therefore, conversion into exponential expression is conducted as follows.

$\alpha^a \div \alpha^b$ $\underline{\text{VE conversion}}$ $a-b$ $\underline{\text{EV conversion}}$ $\alpha^{a-b}$
vector   exponential The VE (vector to exponent) conversion and EV (exponent to vector) conversion can be conducted utilizing a ROM.

When division is to be completed in the period of 1 (one) clock as shown in FIG. 6, it is necessary to employ 3 (three) ROMs. In contrast, when the division is conducted by employing one ROM for VE conversion and one ROM for EV conversion as shown in FIG. 7, the operation requires a period corresponding to two clocks: first clock period for latching b by means of a register and second clock period for adding a.

Similarly, when multiplication is to be completed in the period of 1 (one) clock as shown in FIG. 8, it is necessary to employ 3 (three) ROMs, whereas, when multiplication is conducted by employing one ROM for VE conversion and one ROM for EV conversion as shown in FIG. 9, the operation requires a period corresponding to two clocks: first clock period for latching a by means of a register and second clock period for adding b.

It would be possible to conduct division or multiplication of two unknown expressed in term of vectors directly by a ROM constituting a VE or EV conversion circuit. In such a case, the ROM will be required to have an impractically large capacity, particularly when the number of unknowns is large.

SUMMARY OF THE INVENTION

Accordingly, it is a first object of the present invention to provide an error correction apparatus capable of conducting, by means of a single erasure/error correction means and a select signal, error correction for various input data having different formats.

It is a second object of the present invention to provide an error correction apparatus which is improved to enable setting of flag strategy, as well as number of flags received by the CI decoder, thereby to make it possible to make any error data from, for example, a MODEM to be alive in C1 decoder.

It is a third object of the present invention to provide an error correction apparatus in which BHC encoding circuit can be realized through a minor change in the decoding circuit, thereby attaining a higher performance of the apparatus while reducing the size of the same.

It is a fourth object of the present invention to provide an error correction apparatus in which the size of the syndrome creating circuit in the BHC encoding or decoding circuit is reduced and the construction of BUS lines is facilitated.

It is a fifth object of the present invention to provide an error correction circuit having an arithmetic circuit which is small in size, but yet capable of conducting division and multiplication, as well as VE and EV conversion, of unknowns of Galois function, without using any ROM.

BRIEF DESCRIPTION OF THE DRAWINGS

FIG. 2 is an illustration of super strategy;

FIG. 16 is a flow chart showing the flow of computation;

FIG. 21 is an illustration of free strategy in the first embodiment of the invention;

FIG. 22 is a table showing the state of error used in double-error correction;

FIG. 23 is a table showing the state of error used in singular-error correction;

FIG. 46 is an illustration of an $X^2$ circuit;

FIG. 49 is an illustration of a K-creating circuit;

FIG. 50 is an illustration of a K-creating circuit for BUS line control;

DESCRIPTION OF THE PREFERRED EMBODIMENTS

[First Embodiment]

Figure 10:
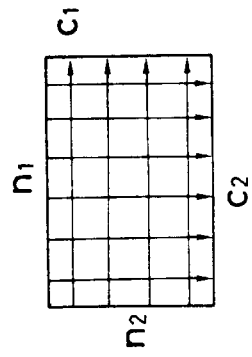
FIG. 10 is an illustration of an interleave.
Figure 11:
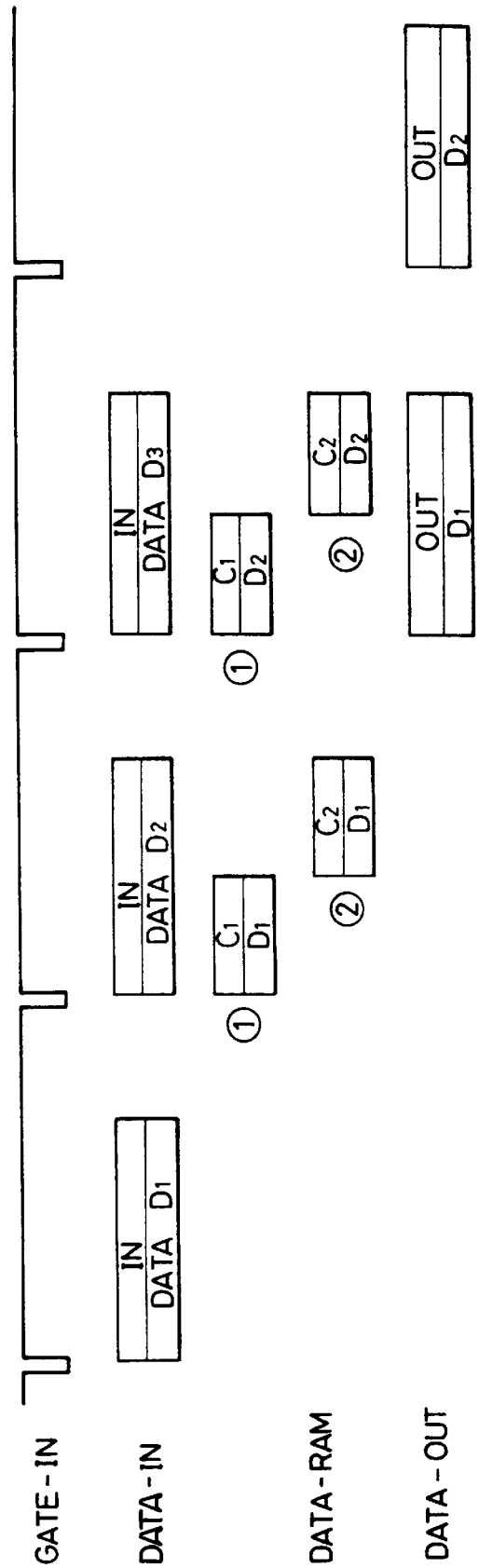
FIG. 11 is a time chart illustrating the operation starting with data-in and ending in data-out after error correction.

A first embodiment of the present invention will be described hereinunder with reference to the accompanying drawings. A description will be made first as to decoding of an error correction code. A Reed Solomon code (referred to as "RS code" hereinafter) as an example of error correction signal typically has a cross-interleaved construction as shown in FIG. 10. This means that each block requires two times of error correction as represented by C1 and C2. When input data is supplied without any interval, the processing delay time will be accumulated unless an erasure correction and error correction unit is provided for each of C1 and C2. In order to simplify the construction of the hardware, therefore, this embodiment is constructed such that a single erasure correction and error correction unit is made to operate at a doubled speed as denoted by ① and ② in FIG. 11 when the input data is supplied without interval. The erasure correction and error correction unit, however, operate at a normal speed in the when there is no interleave or when the data transmission speed is high. Referring to FIG. 11, data is input as represented by data-in in response to gate-in and, after a computation for error correction is completed, the corrected data is output as represented by data-out. As will be understood from this Figure, the data input/output time in the doubled speed mode ① and ② is one half that of the normal input/output time.

Figure 12:
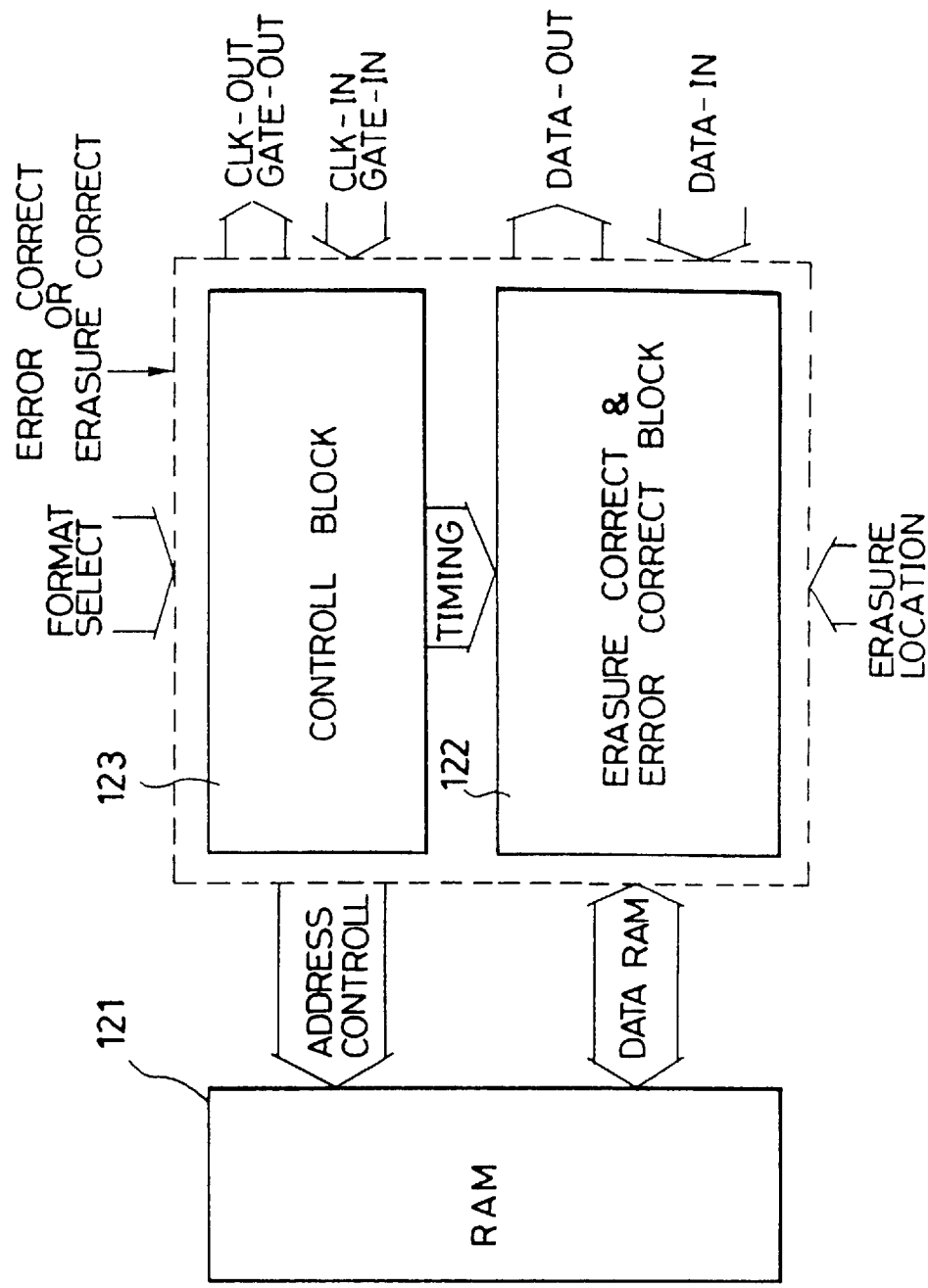
FIG. 12 is an illustration of hardware of a error correction unit.

Therefore, the erasure correction and error correction unit has, as shown in FIG. 12, a RAM 121 for storing the input data, an erasure correct and error correct block 122 and a control block 123 for varying the timing signal for driving the block 122 in accordance with an input format select signal.

Figure 13:
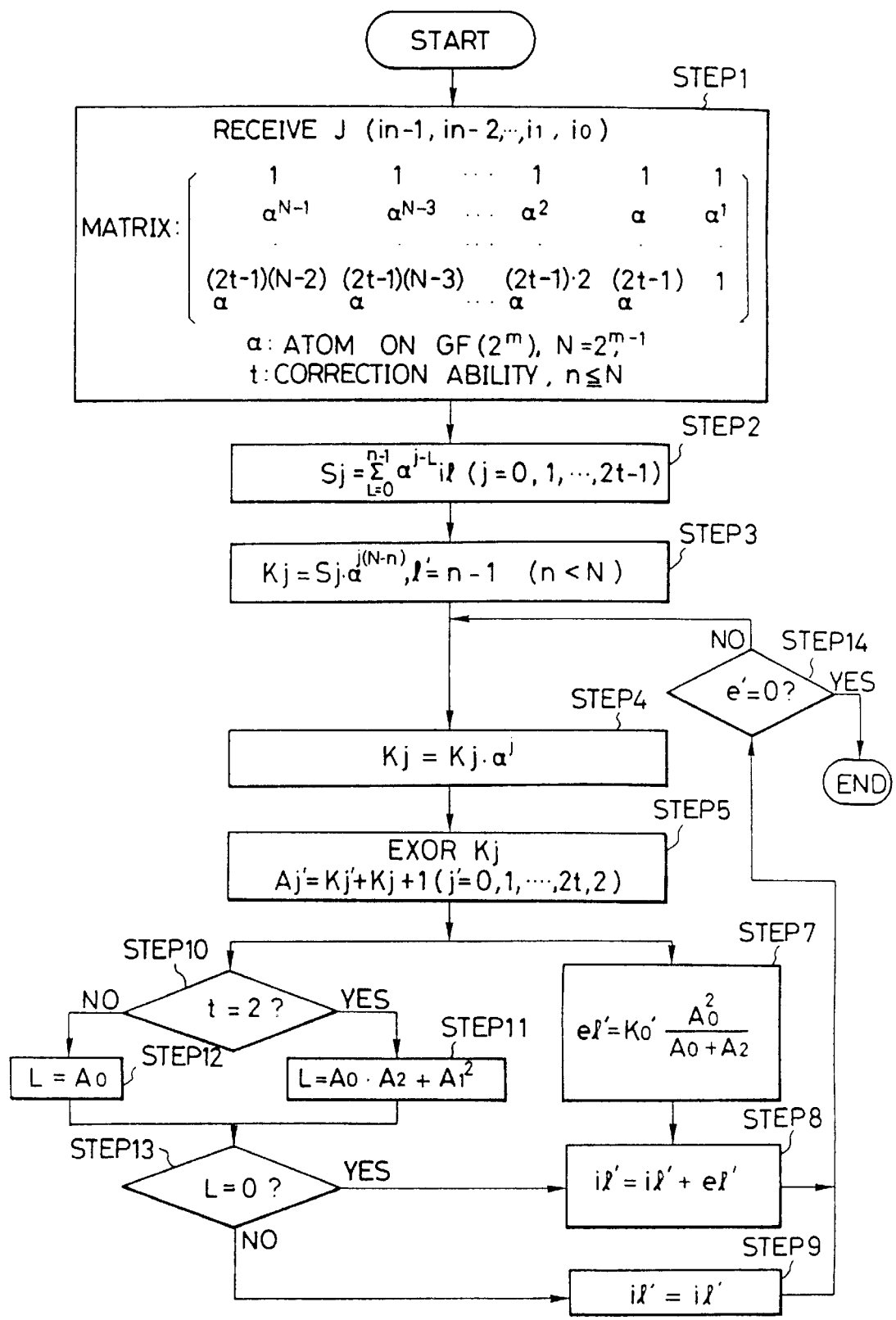
FIG. 13 is a flow chart of an error correcting process.
Figure 14:
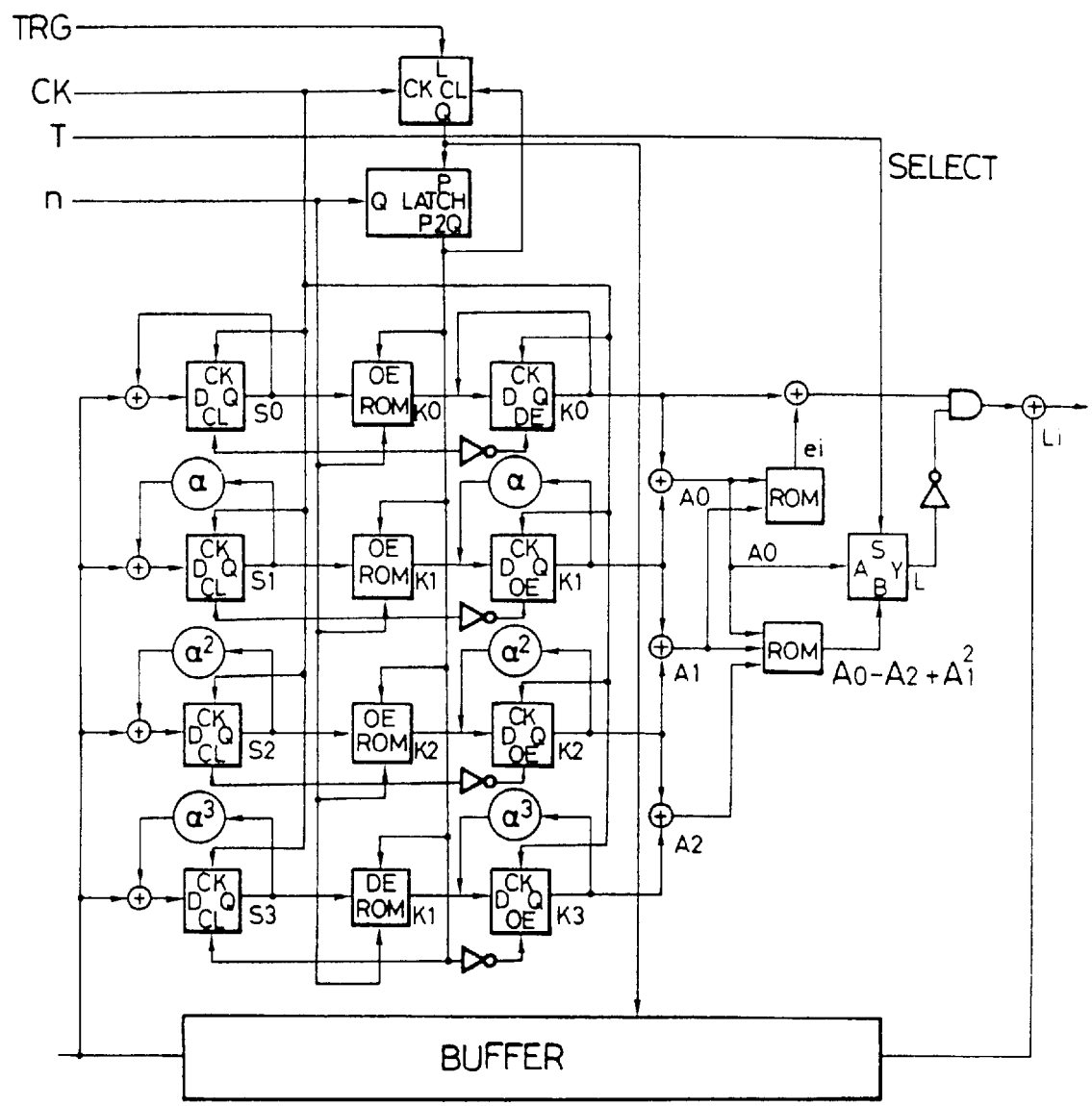
FIG. 14 is an illustration of a decoding hardware.

Among various error correction methods proposed hitherto, this embodiment makes use of an algorithm as shown in FIG. 13, which can simplify the hardware construction and, hence, facilitates the operation under the condition when the timing signal is variable. FIG. 14 shows the construction of decoding hardware adopted when this algorithm is used.

Figure 15:
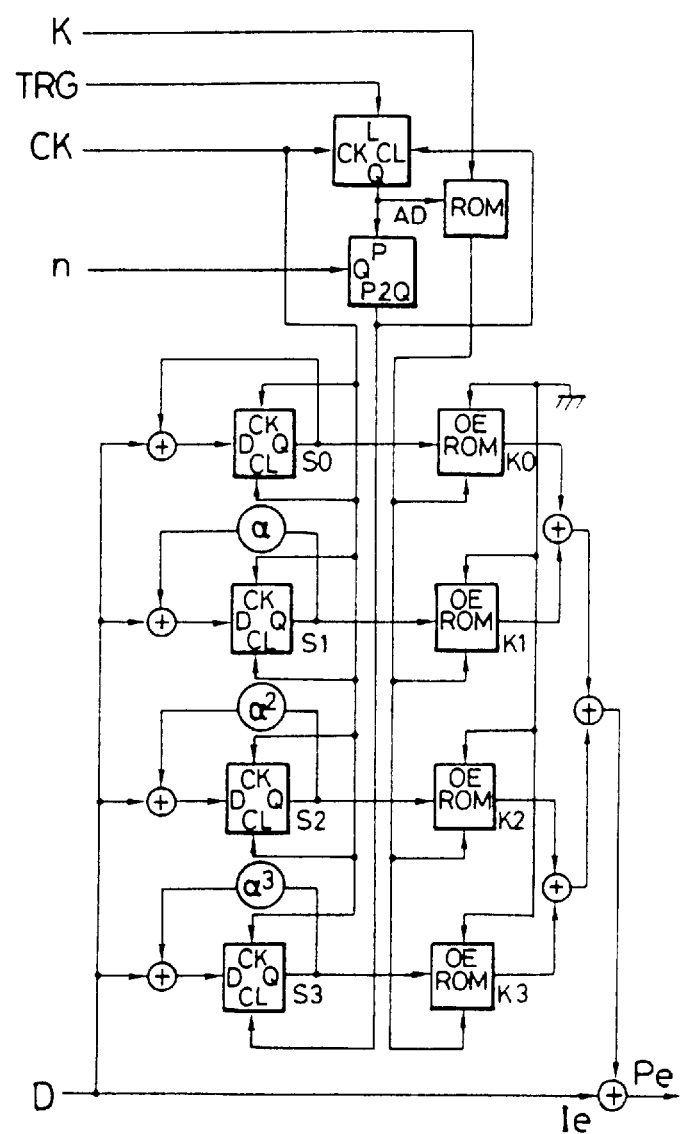
FIG. 15 is an illustration of an encoding hardware.

Usually, the encoding is conducted by dividing data by creating a polynomial. In this embodiment, however, the encoding is conducted by varying the control of the error correction unit which is used in decoding. The construction of hardware used for this purpose is shown in FIG. 15.

FIG. 16 shows the flow of the process for creating parity bit.

Figure 17:
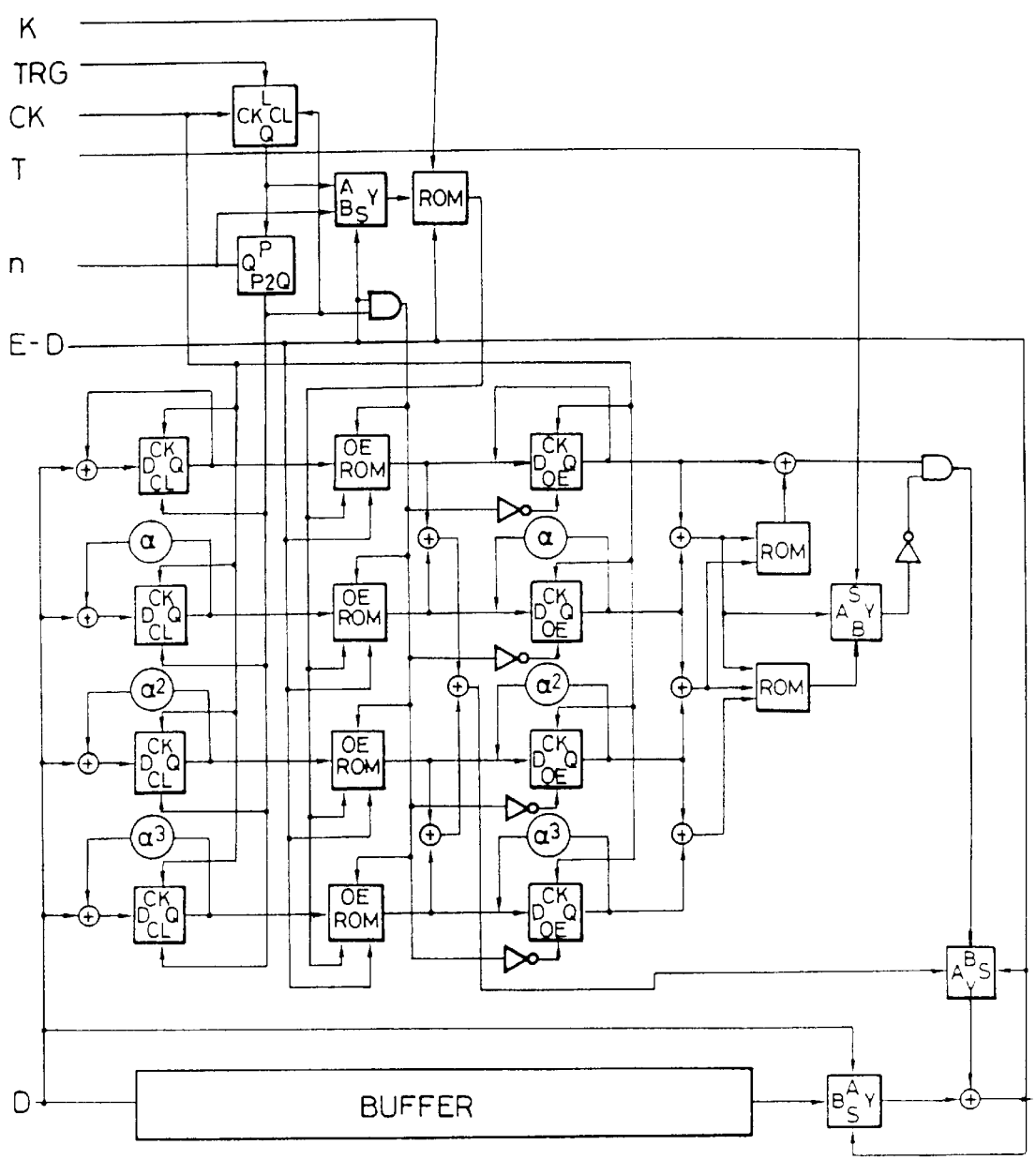
FIG. 17 is an illustration of the construction of an encoding/decoding unit in the first embodiment of the invention.

The decoding and encoding described above can be united with each other by hardware as shown in FIG. 17.

From the following formulae (4) to (11), it will be understood that the algorithm for erasure correction can be realized by multiplying syndromes $S_0$ to $S_3$ by suitable constants and, hence, can be accomplished by the same circuit arrangement as that used for the encoding.

$$\begin{pmatrix} 1 & 1 & \cdots & 1 & 1 \\ \alpha^{n-1} & \alpha^{n-2} & \cdots & \alpha & 1 \\ \alpha^{2(n-1)} & \alpha^{2(n-2)} & \cdots & \alpha^2 & 1 \\ \alpha^{3(n-1)} & \alpha^{3(n-2)} & \cdots & \alpha^3 & 1 \end{pmatrix} \begin{pmatrix} j_1 \\ j_2 \\ \cdot \\ \cdot \\ \cdot \\ j_{n-1} \\ j_n \end{pmatrix} = \begin{pmatrix} S_0 \\ S_1 \\ S_2 \\ S_3 \end{pmatrix} = S \quad (4)$$

$$H \qquad \qquad =J$$

where, $$\begin{pmatrix} j_1 \\ j_2 \\ \cdot \\ \cdot \\ \cdot \\ j_{n-1} \\ j_n \end{pmatrix} = \begin{pmatrix} i_1 \\ i_2 \\ \cdot \\ \cdot \\ \cdot \\ i_{n-1} \\ i_n \end{pmatrix} + \begin{pmatrix} e_1 \\ e_2 \\ \cdot \\ \cdot \\ \cdot \\ e_{n-1} \\ e_n \end{pmatrix} \quad (5)$$

The following condition also is met.

$$S = H \cdot J = H \cdot (I+E) = H \cdot \overset{O}{\overset{\|}{I}} + H \cdot E = H \cdot E \quad (6)$$

Where erasure is taking place in each of positions i, j, k and l, $$\begin{pmatrix} 1 & \ldots & 1 & 1 \\ \alpha^{n-1} & \ldots & \alpha & 1 \\ \alpha^{2(n-1)} & \ldots & \alpha^2 & 1 \\ \alpha^{3(n-1)} & \ldots & \alpha^3 & 1 \end{pmatrix} \cdot \begin{pmatrix} 0 \\ \vdots \\ e_i \\ 0 \\ \vdots \\ 0 \\ e_j \\ 0 \\ \vdots \\ 0 \\ e_h \\ 0 \\ \vdots \\ 0 \\ j_n \end{pmatrix} = \begin{pmatrix} S_0 \\ S_1 \\ S_2 \\ S_3 \end{pmatrix} \quad (7)$$

therefore, $$\underbrace{\begin{pmatrix} 1 & 1 & \ldots 1 & 1 \\ \alpha^{n-i} & \alpha^{n-j} & \alpha^{n-k} & \alpha^{n-l} \\ \alpha^{2(n-i)} & \alpha^{2(n-j)} & \alpha^{2(n-k)} & \alpha^{2(n-l)} \\ \alpha^{3(n-i)} & \alpha^{3(n-j)} & \alpha^{3(n-k)} & \alpha^{3(n-l)} \end{pmatrix}}_{A} \begin{pmatrix} e_i \\ e_j \\ e_k \\ e_l \end{pmatrix} = \begin{pmatrix} S_0 \\ S_1 \\ S_2 \\ S_3 \end{pmatrix} \quad (8)$$

By multiplying both sides by $A^{-1}$, $$\begin{pmatrix} e_i \\ e_j \\ e_k \\ e_l \end{pmatrix} = A^{-1} \begin{pmatrix} S_0 \\ S_1 \\ S_2 \\ S_3 \end{pmatrix} \quad (9)$$

The factor $A^{-1}$ can be definitely determined provided that i, j, k and l are given.

Therefore, when $A^{-1}$ is expressed by the following formula (10), $e_x$(x=i, j, k, l) is determined by the following formula (11).

$$A^{-1} = \begin{pmatrix} a_{i0} & a_{i1} & a_{i2} & a_{i3} \\ a_{j0} & a_{j1} & a_{j2} & a_{j3} \\ a_{k0} & a_{k1} & a_{k2} & a_{k3} \\ a_{l0} & a_{l1} & a_{l2} & a_{l3} \end{pmatrix} \quad (10)$$

$$e_x = \sum_{y=0}^{3} a_{xy} S_y \quad (11)$$

Figure 1:
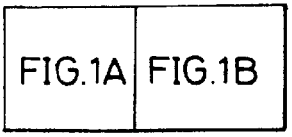
FIG. 1 is an illustration of an encoding/decoding circuit having erasure correction and error correction function, in a first embodiment of the error correction apparatus of the present invention.
Figure 1A:
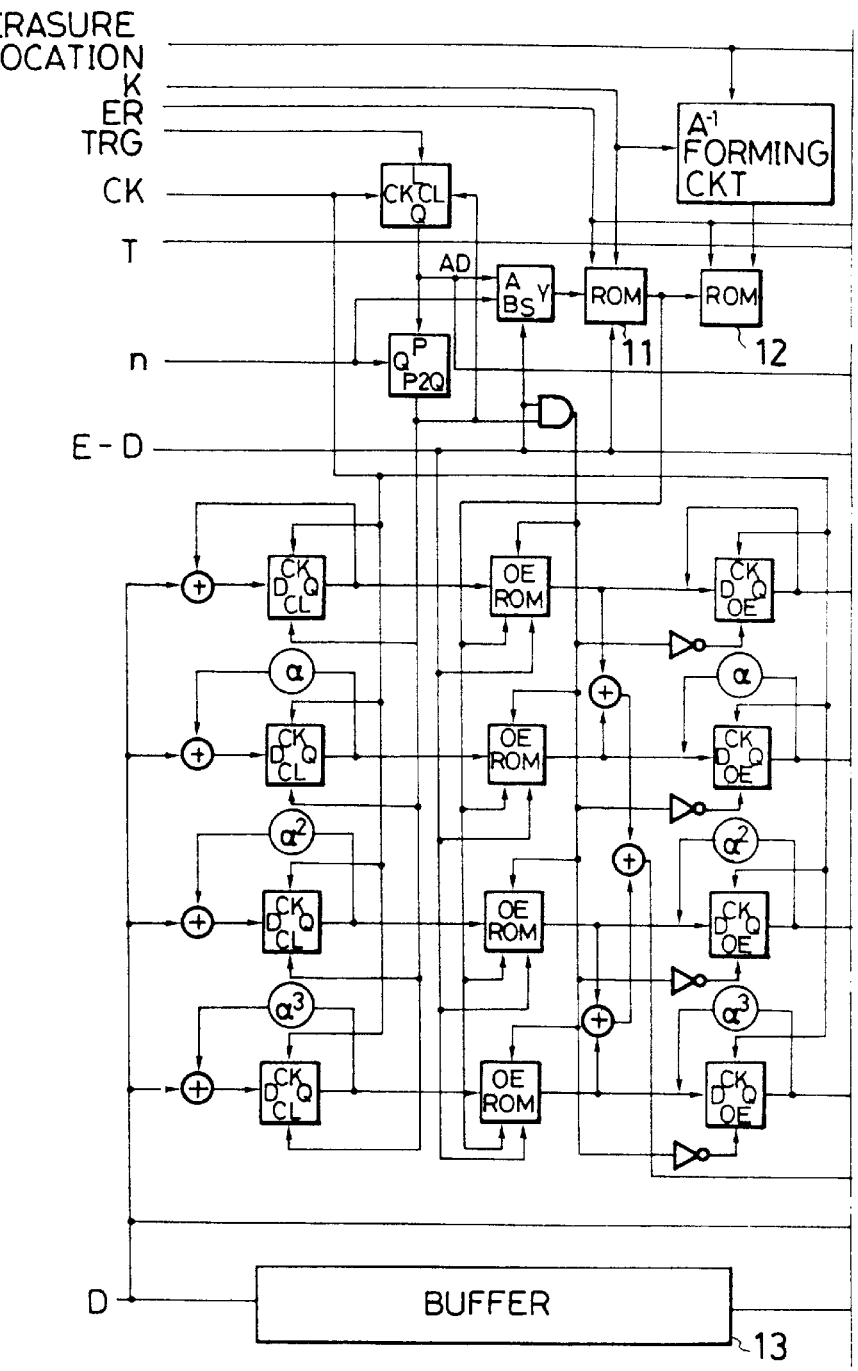
Figure 1B:
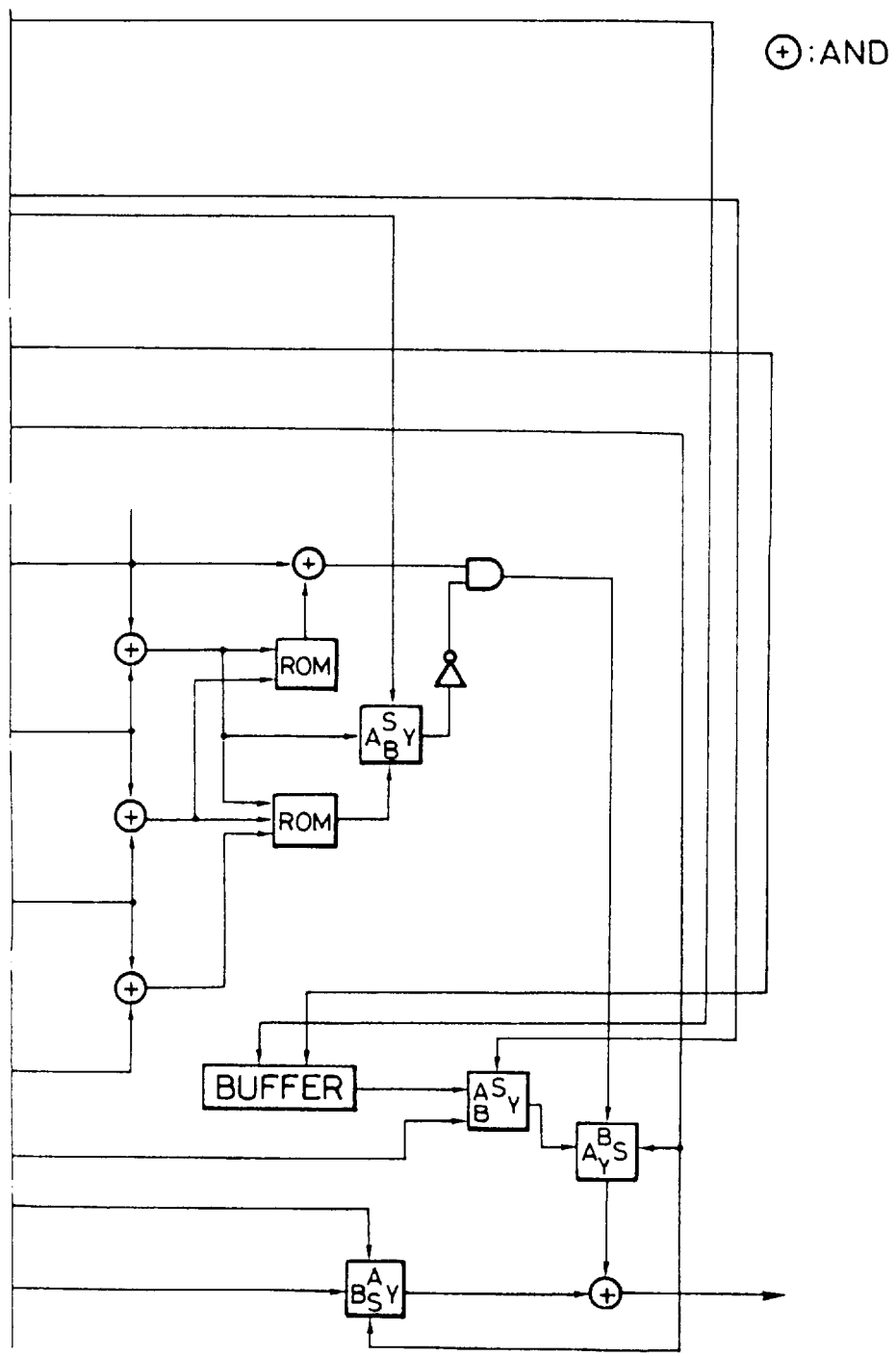
Figure 3:
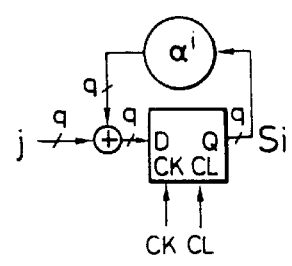
FIG. 3 is an illustration of a syndrome creating circuit for creating syndromes Si.
Figure 18:
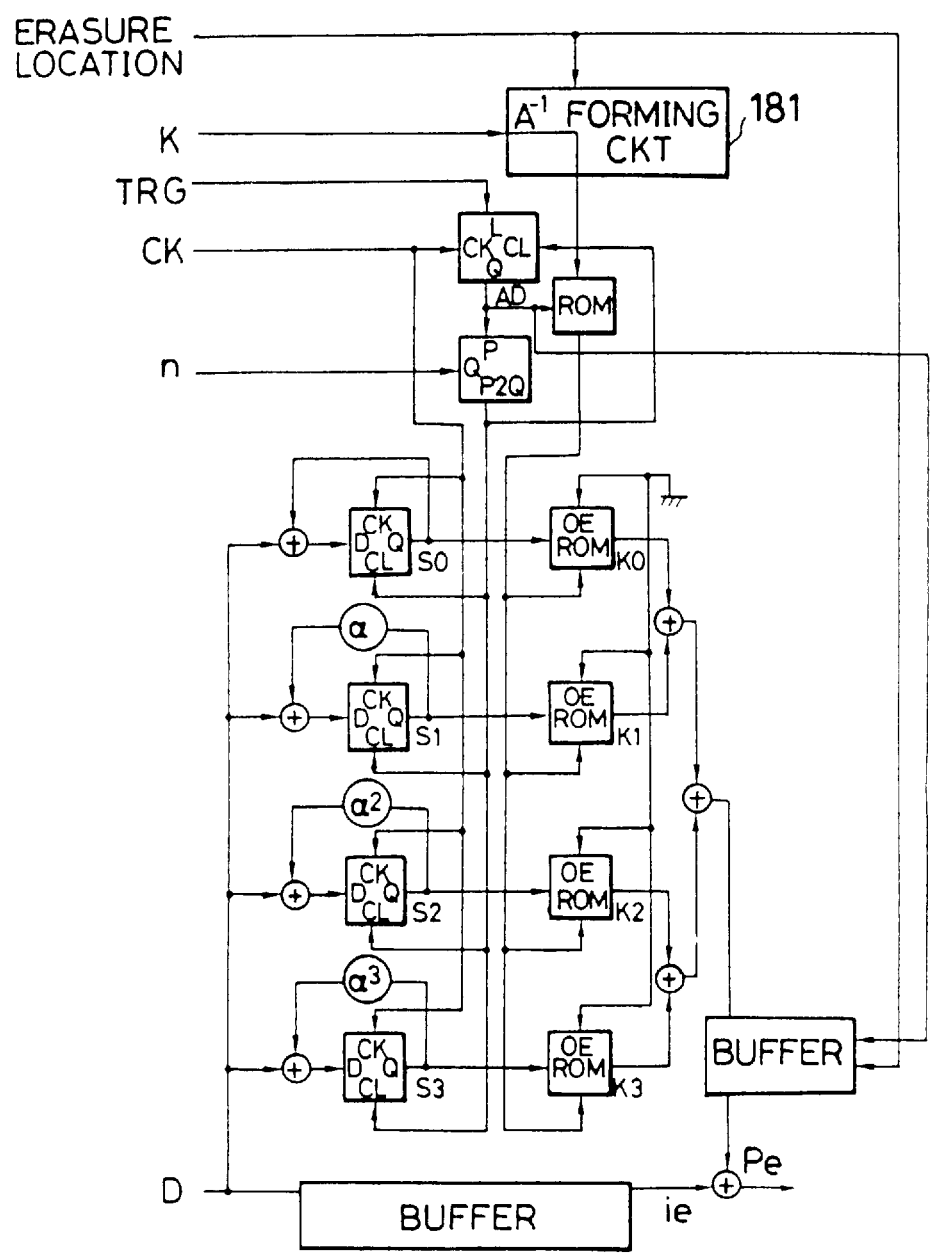
FIG. 18 is an illustration of erasure correction and error correction hardware in the first embodiment of the invention.

FIG. 18 is a block diagram of the erasure correction and error correction circuit. Since i, j, k and l are definite, the $A^{-1}$ creating circuit can be determined by several ROMs. Therefore, the encoding/decoding circuit including the erasure correction function can be constructed as shown in FIG. 1.

In order to enable the operation to be switched between ordinary encoding/decoding mode and the erasure correction mode, it is necessary to conduct a switching between a ROM 11 and a ROM 12 in accordance with an erasure correction select signal ER. To this end, state-controlling ROMs are used as the ROMs 11 and 12.

The correcting operation is delayed behind the generation of syndrome by a period corresponding to one received word. The received word, therefore, has to be temporarily stored in buffer 13. The error pattern computed at the time of generation of syndrome has to be temporarily stored in the addresses i, j, k and l of a buffer 54, in order that the pattern is output at the positions i, j, k and l in synchronization with the output from the buffer 13. When i, j, k and l is output from the AD, this value is output so that the error pattern is output in synchronization with the output from the buffer 13.

When there is no interleave in the error correction code or when the processing is conducted at the doubled speed, this device is used only for a single error correction. In such a case, this device can be used as it is without any modification.

In the case when the error correction code is interleaved, this device is used for two times of error correcting operation. When the interleaved construction of error correction code is adopted, error correction is conducted both in the vertical and horizontal directions as shown by arrows in FIG. 10. The operation of the device at the doubled speed can be conducted by doubling the rates of clock and trigger. In this case, however, a difficulty is encountered due to difference in the format between C1 and C2. The format, however, can be varied by imparting different values of the correction capacity T and code lengths n, k to C1 and C2.

Figure 19:
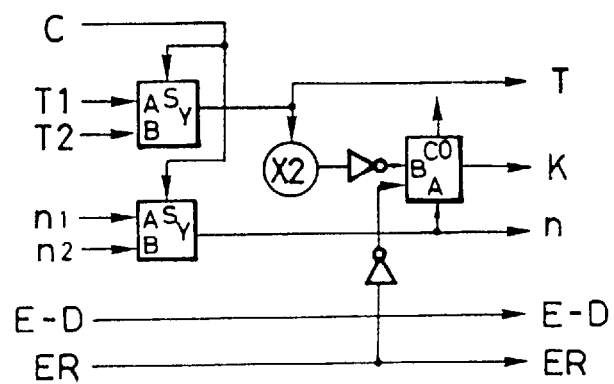
FIG. 19 is an illustration of operation in the case of an interleave.

FIG. 19 shows a circuit which is adopted when the error correction code has an interleaved structure. When n1, n2, T1 and T2 have been set, it is possible to obtain different values of n, T and k for C1 and C2, by changing the level of the select signal C. For instance, different error correction capacities and code lengths are obtained for C1 and C2, by setting the level of the selection signal C as C=0 for C1 and C=1 for C2, respectively. The code length k can be determined by n-2·T·E. It is thus possible to conduct the desired interleaved processing.

It is also possible to select processing in vertical and horizontal directions of the format by selectively setting the signal C as D→1 or 1→D.

As will be understood from the foregoing description, according to this embodiment of the invention, an error correction apparatus can be driven for general purposes. By constructing this apparatus in one chip and designing the same to be adaptable to a variety of formats, it becomes possible to apply the invention not only to optical disk and opto-magnetic disk devices, but also to all types of transmission paths which suffer from large rates of occurrence of error.

It is also possible to prepare a plurality of such chips and to connect them in an interleaved manner, so as to construct an apparatus which can be applied to systems in which the rate of occurrence of error and the processing speed are specifically high.

Figure 20:
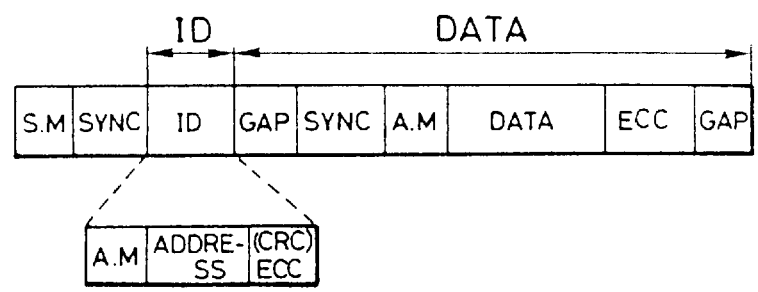
FIG. 20 is an illustration of the position of error correction.

Referring to FIG. 20, a mark S.M. represents a sector mark which indicates the beginning end of a sector. ID is read in accordance with a clock component extracted by SYNC. A symbol A.M. in ID represents an address mark which indicates the beginning of an address. GAP is formed between ID section and DATA section for the purpose of absorbing jitter, thereby to accommodate any offset of ID section from data section including SYNC, S.M. and DATA. The same applies also to the data section. The last GAP is preserved for the purpose of absorbing any offset between the present sector and the next sector. This data structure can be processed by the apparatus of the present invention, even though the address mark and the data section are coded in different formats.

As will be understood from the foregoing description, according to the invention, an error correction apparatus having a general-purpose format selector section and an erasure correction selecting section including erasure position input section is constructed in a single chip so that a single erasure correction and error correction apparatus can operate for a variety of formats.

In addition, when the input data has a plurality of different formats, error correction can be conducted by a single erasure correction and error correction block by employing a select signal for selecting different formats.

It is also to be noted that, in the described embodiment, a control unit may be employed which enables a single erasure correction and error correction block to operate at a doubled speed when the data to be corrected has an interleaved structure and at a normal speed when the error correction code does not have any interleaved structure.

Furthermore, the apparatus of the described embodiment, when applied to erasure correction and error correction of data having a sector construction, the error correction can be conducted not only on the data in the sector, but also on address data of the sector by means of the same erasure correction and error correction block.

[Second Embodiment]

A second embodiment of the present invention will be described hereinunder. In the encoding and decoding of BCH code, the fixed strategy ① and ② are unsuitable for use in the case when the code length and the correction capacity are variable. In such a case, therefore, the flag strategy itself should be variable. Such a variable flag strategy will be referred to as "free strategy" hereinunder. In the Ci decoder, flag generation can be realized by appointing the number Nci in the following cases ⓐ to ⓖ.

ⓐ Sci="0"
ⓑ Sci="1", Lci=1
ⓒ Sci="1", Lci=0
ⓓ Sci="2", Lci=2
ⓔ Sci="2", Lci=1
ⓕ Sci="2", Lci=0
ⓖ Sci="3"

where,

Sci: syndrome received by Ci decoder

Lci: Number of preceding flags Fci coincided with the error locations of Ci decoder Nci: Number of flags Fci received by Ci decoder Flags from the preceding device such as MODEM can be utilized provided that both the C1 and C2 decoders are of free strategy type. Whether the flag is to be copied or set up is controlled by another signal GCL. To this end, when the condition of GCL=H is met, the value of the flags created by the Ci decoder is determined as follows.

Fcx=0: No error

Fcx=Fci: Flags created in the preceding decoder are copied.

In order to turn the Fci and "0" into "1" as the value of Fcx, it is necessary that the condition of GCL=L is met under the required condition.

This principle will be more readily understood from the following description taken in conjunction with FIG. 21.

Figure 24:
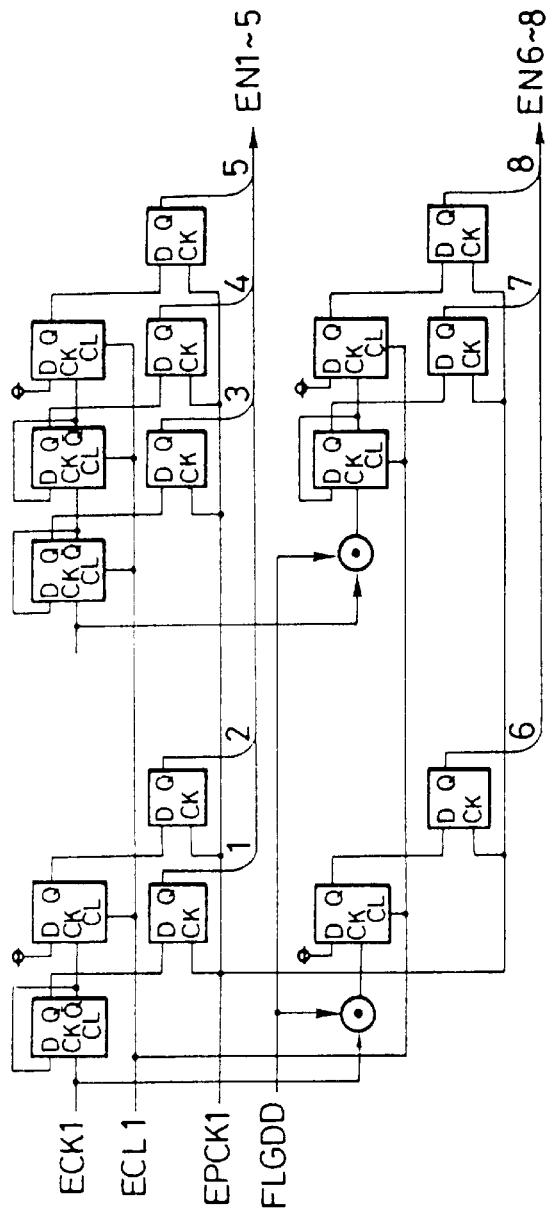
FIG. 24 is an illustration of the construction of an EN output circuit in a second embodiment of the present invention.
Figures 25, 25A:
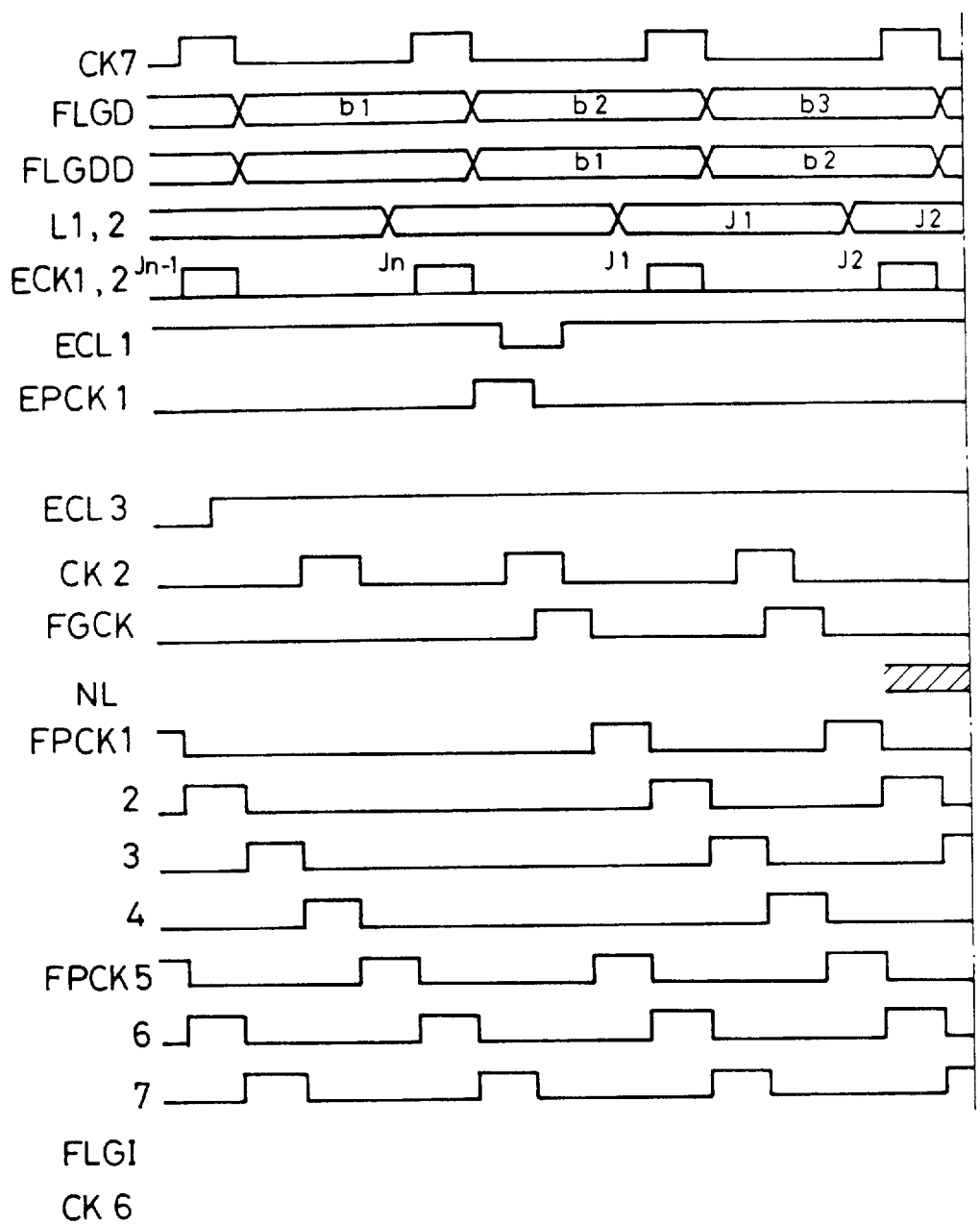
FIG. 25 is an operation timing chart.
Figure 25B:
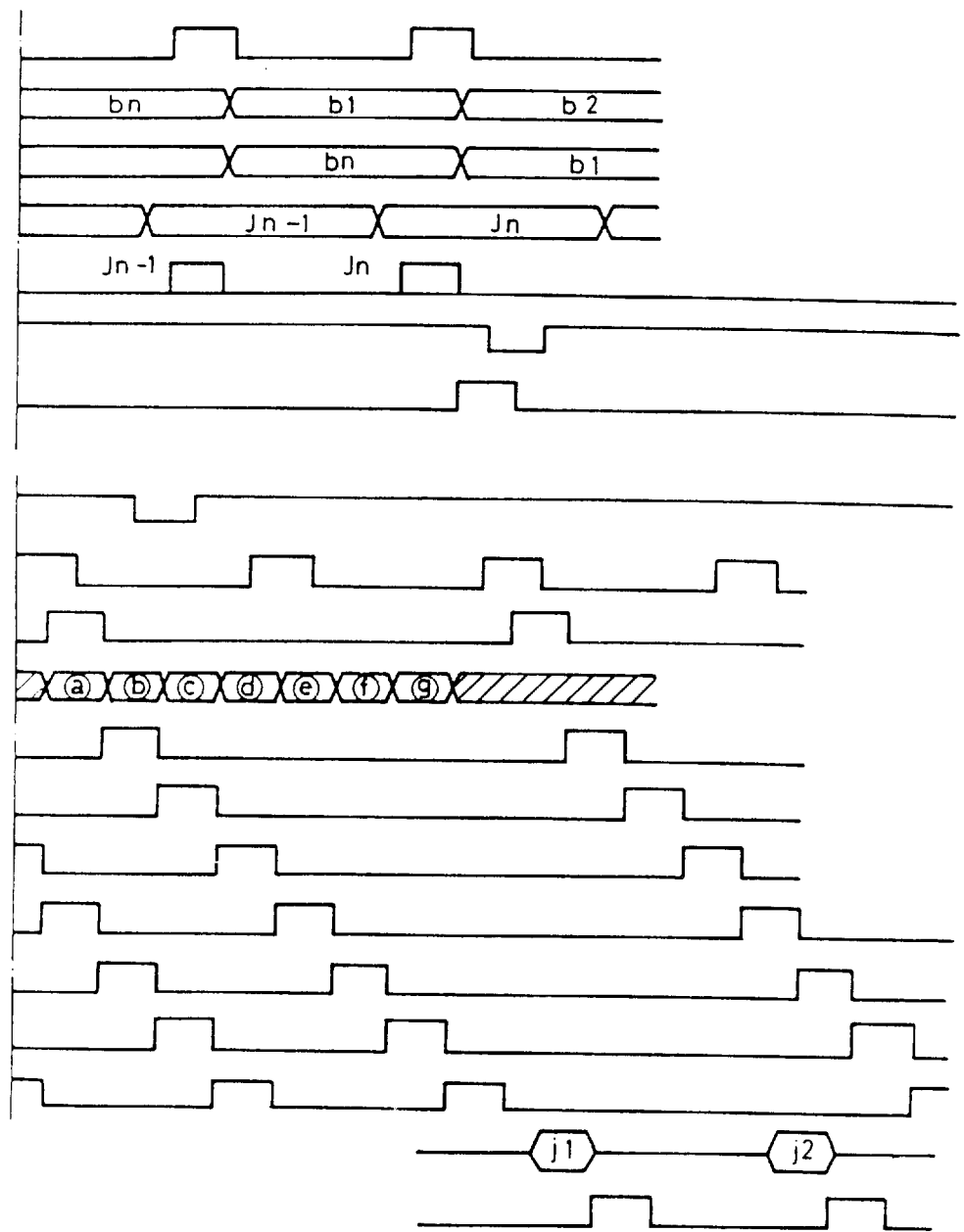

In order to realize the function explained above, a circuit as shown in FIG. 24 is constructed by using L1 and L2 of an algorithm which follows formulae (12) to (21) shown below. The timing of operation of this circuit arrangement is shown in FIG. 25.

Whether any error exists or not can be judged by creating a syndrome.

$$\begin{pmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \alpha^{3(n-1)} & \alpha^{3(n-2)} & \ldots & \alpha^3 & 1 \\ & & \| & & \\ & & H & & \end{pmatrix} \cdot \begin{pmatrix} j1 \\ j2 \\ \cdot \\ \cdot \\ \cdot \\ jn-1 \\ jn \end{pmatrix} = \begin{pmatrix} S0 \\ S1 \\ S2 \\ S3 \end{pmatrix} = S \quad (12)$$

$$= J$$

where, $$\begin{pmatrix} j1 \\ j2 \\ \cdot \\ \cdot \\ \cdot \\ jn-1 \\ jn \end{pmatrix} = \begin{pmatrix} i1 \\ i2 \\ \cdot \\ \cdot \\ \cdot \\ in-1 \\ in \end{pmatrix} + \begin{pmatrix} e1 \\ e2 \\ \cdot \\ \cdot \\ \cdot \\ en-1 \\ en \end{pmatrix} \quad (13)$$

wherein, n represents the code length, H represents the check matrix, J represents the code word, S represents the syndrome, I represents the code word and E represents error.

Thus, the syndrome S is expressed as the product of the error E and the check matrix H, as shown by the following formula (14).

$$S = H \cdot J = H \cdot (I + E) = H \cdot I + H \cdot E = H \cdot E \quad (14)$$

It is assumed here that errors ei and ej exist at positions i and j, respectively.

1) Generation of syndrome $$\begin{pmatrix} S0 \\ S1 \\ S2 \\ S3 \end{pmatrix} = \begin{pmatrix} ei + ej \\ \alpha^{n-i} \cdot ei + \alpha^{n-j} \cdot ej \\ \alpha^{2(n-i)} \cdot ei + \alpha^{2(n-j)} \cdot ej \\ \alpha^{3(n-i)} \cdot ei + \alpha^{3(n-j)} \cdot ej \end{pmatrix} \quad (15)$$

2) Code=length correction $$\begin{pmatrix} S0' \\ S1' \\ S2' \\ S3' \end{pmatrix} = \begin{pmatrix} S0 \\ S1 \cdot \alpha^{-n} \\ S2 \cdot \alpha^{-2n} \\ S3 \cdot \alpha^{-3n} \end{pmatrix} = \begin{pmatrix} ei + ej \\ \alpha^{-i} \cdot ei + \alpha^{-j} \cdot ej \\ \alpha^{-2i} \cdot ei + \alpha^{-2j} \cdot ej \\ \alpha^{-3i} \cdot ei + \alpha^{-3j} \cdot ej \end{pmatrix} \quad (16)$$

3) K-creation (K: 0 ... n)

$$\begin{pmatrix} K0 \\ K1 \\ K2 \\ K3 \end{pmatrix} = \begin{pmatrix} S0' \\ S1' \cdot \alpha^k \\ S2' \cdot \alpha^{2k} \\ S3' \cdot \alpha^{3k} \end{pmatrix} = \begin{pmatrix} ei + ej \\ \alpha^{k-i} \cdot ei + \alpha^{k-j} \cdot ej \\ \alpha^{2(k-i)} \cdot ei + \alpha^{2(k-j)} \cdot ej \\ \alpha^{3(k-i)} \cdot ei + \alpha^{3(k-j)} \cdot ej \end{pmatrix} \quad (17)$$

4) A-creation $$\begin{pmatrix} A0 \\ A1 \\ A2 \end{pmatrix} = \begin{pmatrix} K0 + K1 \\ K1 + K2 \\ K2 + K3 \end{pmatrix} = \quad (18)$$

-continued
$$\begin{pmatrix} ei \cdot (1+\alpha^{k-i}) & + ej \cdot (1+\alpha^{k-j}) \\ ei \cdot (1+\alpha^{k-i}) \cdot \alpha^{(k-i)} & + ej \cdot (1+\alpha^{k-j}) \cdot \alpha^{k-j} \\ ei \cdot (1+\alpha^{k-i}) \cdot \alpha^{2(k-i)} & + ej \cdot (1+\alpha^{k-j}) \cdot \alpha^{2(k-j)} \end{pmatrix}$$

5) Error position $$\begin{pmatrix} L1 \\ L2 \end{pmatrix} = \begin{pmatrix} A0 \\ A0 \cdot A2 + A1^2 \end{pmatrix} = \quad (19)$$

$$\begin{pmatrix} ei \cdot (1+\alpha^{k-i}) + ej \cdot (1+\alpha^{k-j}) \\ ei \cdot ej \cdot (1+\alpha^{k-i} \cdot (1+\alpha^{k-j}) \cdot (\alpha^{2(k-j)} + \alpha^{2(k-j)}) \end{pmatrix}$$

6) Error pattern $$e = K0 + A0^2 \cdot (A0 + A2)^{-1} = (ei + ej) + \quad (20)$$

$$\frac{ei^2 \cdot (1+\alpha^{k-i})^2 + ej^2 \cdot (1+\alpha^{k-j})^2}{ei \cdot (1+\alpha^{k-i})^2 + ej \cdot (1+\alpha^{k-j})^2}$$

7) Judgment

① When there is no error (ei=ej=0)
   L1=0
   L2=0
   e=0

② In case of singular error (ei≠0, ej=0)
   L1: L1=0 only when k=i

L2=0 (21)

e: e=ei only when k=i

Figures 22, 23:
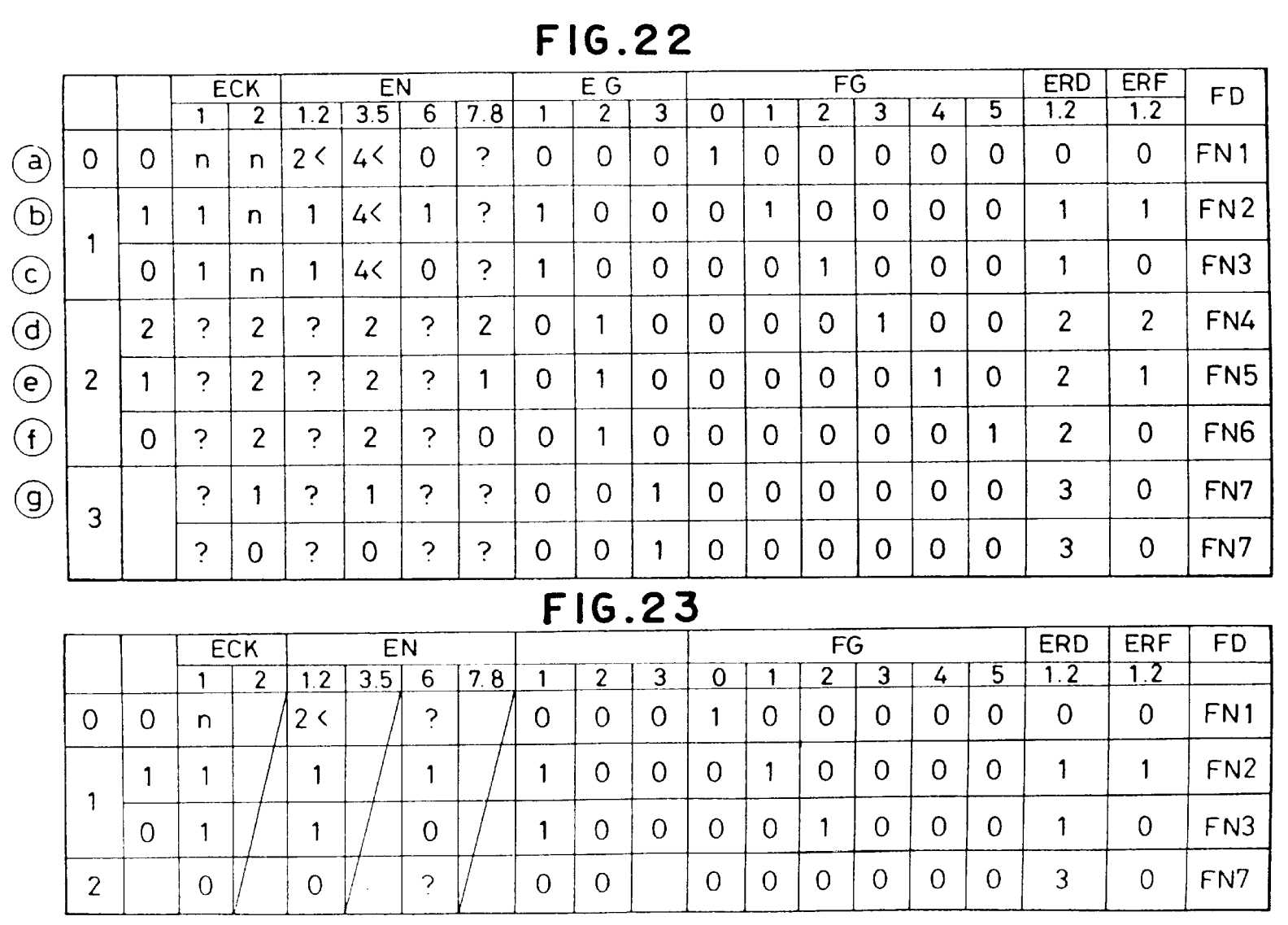

③ In case of double error (ei≠0, ej≠0)
   L1: indefinite
   L2: L2=0 only on conditions of k=i and k=j
   e: e=ei on condition of k=i and e=ej on condition of k=j A clock signal ECK1 is created as NOR of L1 and CKB7 (an inverted signal of CK7) such that ECK1 has H level when L1 is L level. Another signal ECK2 is formed in the same manner for L2. The number of times at which L1 and L2 take L level corresponds to the numbers of clocks ECK1 and ECK2. The numbers of clocks ECK1 and ECK2 given by the formula (21) is shown in FIGS. 22 and 23. More specifically, FIG. 22 shows the clock numbers as obtained when the correction capacity T is set as T=2, while FIG. 23 shows the clock numbers as obtained under the condition of T=1. When T is set as T=1, the signal created by an L2 is meaningless so that it is crossed out by oblique line in FIG. 23. The numbers of clocks ECK1 and ECK2 would be conducted without difficulty by using a counter and a comparator. In this embodiment, however, an EN output having a construction as shown in FIG. 24 is used in the judgment of conditions (a) to (g) in order to reduce the scale of the circuit. In this Figure, a mark ⊙ represents an AND circuit, ⊞ represents an OR circuit, ⊙∘ represents a NAND circuit, and ⊞○ represents a NOR circuit.

EN1 and EN2 represent the count output of the clock ECK1. With these outputs, it is possible to judge whether the number of the clocks ECK1 is 0, 1 or 2 or greater. EN3, EN4 and EN5 are count output of the clocks ECK2. With these signals, it is possible to judge whether the number of clocks ECK2 is 0, 1, 2, 3 or 4 or greater. Clocks ECK1 and ECK2 represent not only the number of errors, but also the positions of the errors. By setting the flags at the same phases as the clocks ECK1 and ECK2 and determining ANDs of the clocks and the flags, it is possible to count the numbers of errors coinciding with the flags. EN6 enables judgment as to whether the number of coincidence between the clocks ECK1 and FLGDD, which is the flag outputs set at the same phase as ECK1, is 0 or 1. EN7 and EN8 enable judgment as to whether the number of coincidence between ECK2 and FLGDD is 0, 1 or 2.

Before arrival of the clocks ECK1 and ECK2 created by the next received word, it is necessary to clear the output by ECL1 so as to re-start the counting. To this end, it is necessary that the output before clearing by ECL1 is stored in the register of the next stage at a timing of a signal EPCK1 shown in FIG. 25. Thus, the processing of flags and error correction are conducted in accordance with the output from the register of the next stage. The gate outputs EG1 to EG3 and FG0 to FG5 representing the states of errors shown in FIGS. 22 and 23 are expressed as follows, by using EN1 to EN8.

$EG1=(T1+T2)\cdot(EN5+T2)\cdot EN1\cdot ENB2$ $EG2=T2\cdot EN4\cdot ENB5$ $EG3=T1\cdot ENB1\cdot ENB2+T2\cdot ENB4\cdot ENB5$ $FG0=T1\cdot EN2+T2\cdot EN2\cdot EN5$ $FG1=EN6\cdot EG1$ $FG2=ENB6\cdot EG1$ $FG3=EN8\cdot EG2$ $FG4=EN7\cdot EG2$ $FG5=ENB7\cdot ENB8\cdot EG2$ Thus, EG1 takes H level only in the case of a singular error, while EG2 takes H level only in the case of a double error. Note that EG2 takes L level whenever the correction capacity T is set as T=1. EG3 takes H level in the case of (g), i.e., only when the number of errors exceed the correction capacity. FG0 to FG5 take H level on conditions of (a) to (f), respectively. In FIGS. 22 and 23, ERD represent the number of errors, while ERF represent the number of coincidence between the errors and flags as follows.

$ERD1=EG1+EG3$ $ERD2=EG2+EG3$ $ERF1=FG1+FG4$ $ERF2=FG3$

Figure 26:
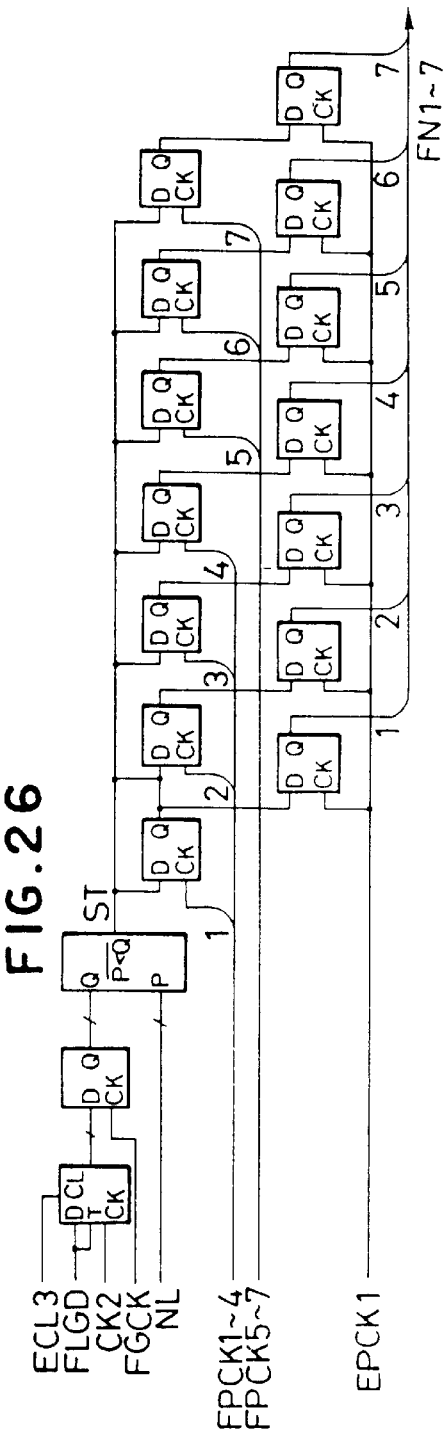
FIG. 26 is an illustration of the construction of an FN output circuit in a second embodiment of the present invention.

An FN output circuit as shown in FIG. 26 is used in order to externally determine whether the flag process is to be conducted with respect to the cases to ⓐ to ⓖ.

Figure 9:
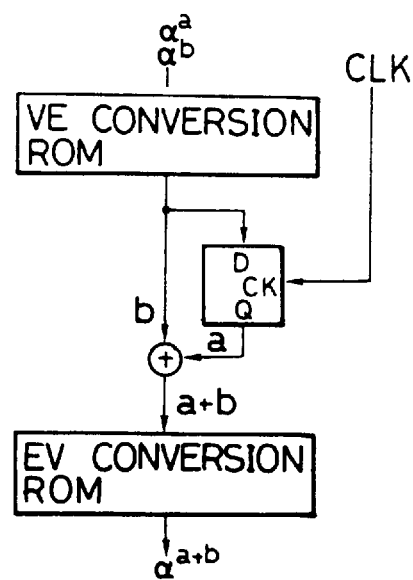

The EN output circuit as shown in FIG. 26 is adapted for counting the number of flags by a counter. The output is latched and a comparison is conducted between the latched output and the externally-given value of strategy selection pin NL for each of ⓐ to ⓖ, whereby a judgment is conducted by ST as to whether the number of the flags received is greater than each value of NL. The values of NL corresponding to the conditions ⓐ to ⓖ are input successively so that the results of comparison between these numbers and the flag number are output by ST in the same sequence and the thus output results are latched by FPCK1 to FPCK7 in accordance with a timing as shown in FIG. 9.

The latched result of comparison is stored in the next register by EPCK1. The outputs from this register are represented by FN1 to FN7. Thus, the outputs FN1 to FN7 take H level provided that the number of flags received with respect to the respective conditions (a) to (g) are below the corresponding values of NL and take L level when the flag numbers are equal to or below the values of the corresponding NL.

Figure 27:
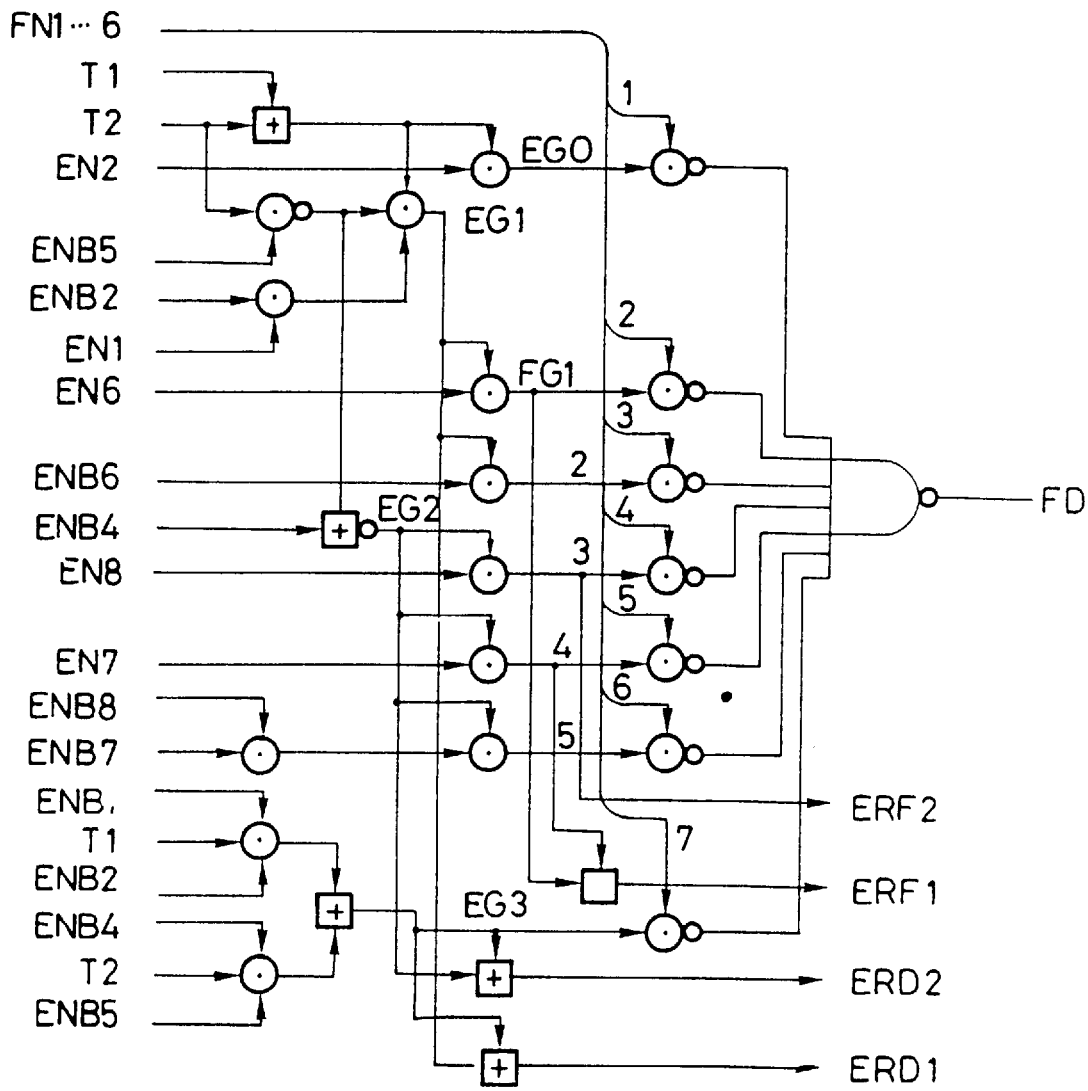
FIG. 27 is an illustration of the construction of an DN output circuit in a second embodiment of the present invention.

Then, NANDs of the error states FG0 to FG5 and EG3 and the results FN1 to FN7 of the external strategy selection are obtained and then the NAND of all these NAND outputs is determined as FD (see FIG. 27: FD output circuit).

Figure 28:
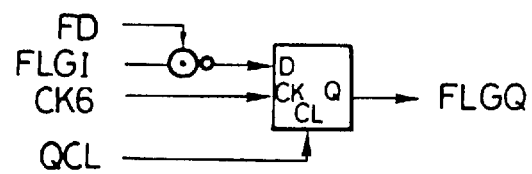
FIG. 28 is an illustration of the construction of a flag output circuit in accordance with GCL control.

A flag output circuit as shown in FIG. 28 is used for the purpose of controlling the flag output by FD. The flag output circuit produces AND of FD and the flag FLGI and latches the AND output as FLG0. It will be seen that the AND output is delivered as it is when GCL is externally set at H level, but is delivered as FLG0=H when GCL is externally set at L level. As a result, flag copy is executed on a condition of GCL=H and while an operation for setting the flag up is executed on condition of GCL=L. The timing of the flag copy and flag raising operations is shown in FIG. 25.

As will be understood from the foregoing description, this embodiment provides a free strategy setting circuit which enables the flag strategy to be set freely, as well as the setting as to whether the flag is to be set up.

[Third Embodiment]

A description will be made hereinunder as to a third embodiment of the present invention, particularly to an encoding and decoding circuit of an error correction apparatus suitable for use in an optical disk device DAT or a similar device.

Figure 29:
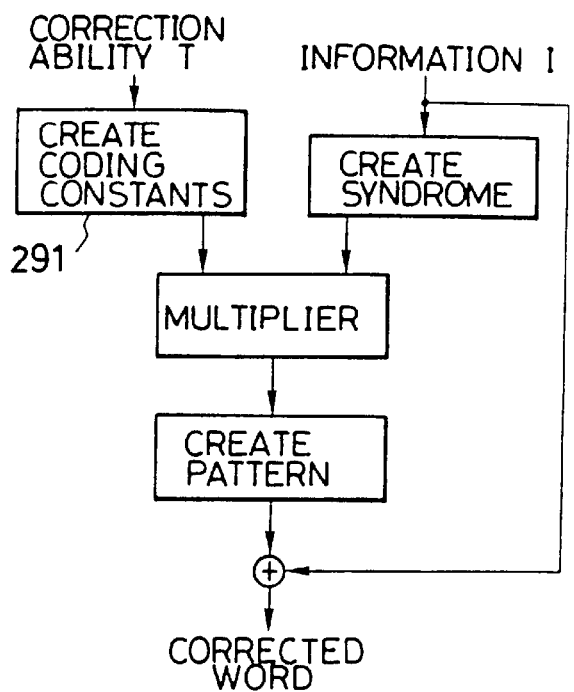
FIG. 29 is a block diagram of an encoding circuit.
Figure 30:
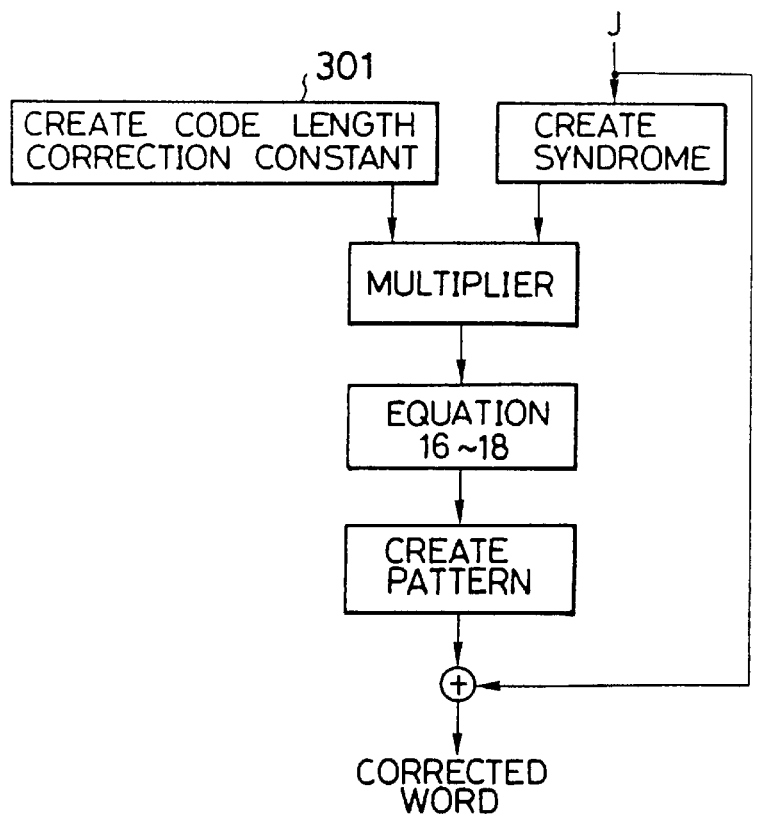
FIG. 30 is a block diagram of a decoding circuit.

It is assumed here that the encoding process is conducted in accordance with the following formulae (22) to (29), while decoding is conducted in accordance with the following formulae (30) to (39). The encoding process and the decoding process have common steps: namely, generation of syndromes and multiplication of the syndromes with constants. The constants used in the encoding process are encoding constants shown by formulae (28) and (29), while constants used in decoding process are code length correction constants $\alpha^{-n}$ to $\alpha^{-3n}$ appearing in formula (34). The encoding process and the decoding process can be represented by block diagrams as shown in FIG. 29 and 30. The pattern creating circuit for use in the encoding process may be a circuit which produces EXOR of the syndromes and the encoding constants at every 4 clocks (S0 to S3) so that a parity is created for every 4 clocks. The pattern creating circuit used in the decoding process also may be a circuit which produces EXOR at every four clocks because it can create an error pattern e when two clocks other than $k_0$ and $A_0^2/(A_0+A_1)$ are 0 in the output from the processing blocks of formulae (35) to (37). This means that a single pattern creating circuit can be used commonly both for the encoding and decoding processes. In the coding process, a code word is created by adding the output from the pattern creating circuit to the trailing end of the data I, where the data I is 0 in a case of in-3 to in 0, while the pattern creation output is 0 in the cases other than parity. In the decoding process, correction can be attained by obtaining EXOR with the received word J.

A description will be made first as to the encoding. The relationship between the check matrix H which constitutes the base of the Reed Solomon code and the code word I can be expressed by the following formula (22).

$$\underbrace{\begin{pmatrix} 1 & 1 & \cdots & 1 & 1 \\ \alpha^{n-1} & \alpha^{n-2} & \cdots & \alpha & 1 \\ \alpha^{2(n-1)} & \alpha^{2(n-2)} & \cdots & \alpha^2 & 1 \\ \alpha^{3(n-1)} & \alpha^{3(n-2)} & \cdots & \alpha^3 & 1 \end{pmatrix}}_{H} \cdot \begin{pmatrix} i1 \\ i2 \\ \vdots \\ in-1 \\ in \end{pmatrix} = \begin{pmatrix} 0 \\ 0 \\ 0 \\ 0 \end{pmatrix} = I \quad (22)$$

where, n represents code length, H represents check matrix, I represents code word, i1 to in-4 represent data and in-3 to in represent parity.

Then, the formula (22) is divided into parity portion and data portion, as shown by the formula (23) below.

$$\underbrace{\begin{pmatrix} 1 & 1 & \cdots & 1 \\ \alpha^{n-1} & \alpha^{n-2} & \cdots & \alpha^4 \\ \alpha^{2(n-1)} & \alpha^{2(n-2)} & \cdots & \alpha^8 \\ \alpha^{3(n-1)} & \alpha^{3(n-2)} & \cdots & \alpha^{12} \end{pmatrix}}_{B} \cdot \begin{pmatrix} i1 \\ i2 \\ \vdots \\ in-4 \end{pmatrix} = \underbrace{\begin{pmatrix} 1 & 1 & 1 & 1 \\ \alpha^3 & \alpha^2 & \alpha & 1 \\ \alpha^6 & \alpha^4 & \alpha^2 & 1 \\ \alpha^9 & \alpha^6 & \alpha^3 & 1 \end{pmatrix}}_{A} \cdot \begin{pmatrix} in-3 \\ in-2 \\ in-1 \\ in \end{pmatrix} \quad (23)$$

Both sides of formula (23) are multiplied by $A^{-1}$.

$$\begin{pmatrix} in-3 \\ in-2 \\ in-1 \\ in \end{pmatrix} = A^{-1} \cdot \begin{pmatrix} 1 & 1 & \cdots & 1 \\ \alpha^{n-1} & \alpha^{n-2} & \cdots & \alpha^4 \\ \alpha^{2(n-1)} & \alpha^{2(n-2)} & \cdots & \alpha^8 \\ \alpha^{3(n-1)} & \alpha^{3(n-2)} & \cdots & \alpha^{12} \end{pmatrix} \cdot \begin{pmatrix} i1 \\ i2 \\ \vdots \\ in-4 \end{pmatrix} \quad (24)$$

B is decomposed as follows.

$$\begin{pmatrix} in-3 \\ in-2 \\ in-1 \\ in \end{pmatrix} = A^{-1} \cdot \underbrace{\begin{pmatrix} 1 & 0 & 0 & 0 \\ 0 & \alpha^3 & 0 & 0 \\ 0 & 0 & \alpha^6 & 0 \\ 0 & 0 & 0 & \alpha^9 \end{pmatrix}}_{C} \cdot \underbrace{\begin{pmatrix} 1 & 1 & \cdots & 1 \\ \alpha^{n-4} & \alpha^{n-5} & \cdots & \alpha \\ \alpha^{2(n-4)} & \alpha^{2(n-5)} & \cdots & \alpha^2 \\ \alpha^{3(n-4)} & \alpha^{3(n-5)} & \cdots & \alpha^3 \end{pmatrix}}_{SI} \cdot \begin{pmatrix} i1 \\ i2 \\ \vdots \\ in-4 \end{pmatrix} \quad (25)$$

The following formulae (26) and (27) are obtained by combining $A^{-1}$ and C.

$$\begin{pmatrix} in-3 \\ in-2 \\ in-1 \\ in \end{pmatrix} = \overset{A^{-1} \cdot B}{\begin{pmatrix} \alpha^{212} & \alpha^{156} & \alpha^{158} & \alpha^{218} \\ \alpha^{156} & \alpha^{5} & \alpha^{141} & \alpha^{161} \\ \alpha^{158} & \alpha^{141} & \alpha^{8} & \alpha^{162} \\ \alpha^{218} & \alpha^{161} & \alpha^{162} & \alpha^{221} \end{pmatrix}} \cdot \overset{SI}{\begin{pmatrix} S0 \\ S1 \\ S2 \\ S3 \end{pmatrix}} \quad (26)$$

$$\begin{pmatrix} \alpha^{212} & \alpha^{156} & \alpha^{158} & \alpha^{218} \\ \alpha^{156} & (\alpha^{4} \cdot \alpha^{2}) & (\alpha^{139} \cdot \alpha^{2}) & (\alpha^{158} \cdot \alpha^{3}) \\ \alpha^{158} & (\alpha^{139} \cdot \alpha^{2}) & (\alpha^{4} \cdot \alpha^{4}) & (\alpha^{156} \cdot \alpha^{6}) \\ \alpha^{218} & (\alpha^{158} \cdot \alpha^{3}) & (\alpha^{156} \cdot \alpha^{6}) & (\alpha^{212} \cdot \alpha^{9}) \end{pmatrix} \cdot \begin{pmatrix} S0 \\ S1 \\ S2 \\ S3 \end{pmatrix} \quad (27)$$

Therefore, the following condition is met.

$$in-3 = \overset{SI}{[\alpha^{212}\,\alpha^{156}\,\alpha^{158}\,\alpha^{218}]} \cdot [S0\ \ S1\ \ S2\ \ S3]^T$$

$$in-2 = \overset{SII}{[\alpha^{156}\,\alpha^{4}\ \ \alpha^{139}\,\alpha^{158}]} \cdot [S0\,\alpha \cdot S1\,\alpha^2 \cdot S2\,\alpha^3 \cdot S3]^T$$

$$in-1 = \overset{SIII}{[\alpha^{158}\,\alpha^{139}\,\alpha^{4}\ \ \alpha^{156}]} \cdot [S0\,\alpha^2 \cdot S1\,\alpha^4 \cdot S2\,\alpha^6 \cdot S3]^T$$

$$in = \overset{SIV}{[\alpha^{218}\,\alpha^{158}\,\alpha^{156}\,\alpha^{212}]} \cdot [S0\,\alpha^3 \cdot S1\,\alpha^6 \cdot S2\,\alpha^9 \cdot S3]^T$$
↑ double correction encoding constant The same applies also to singular correction encoding constant.

$$in-1 = [\alpha^{230}\,\alpha^{231}\,0\,0] \cdot [S0\ \ S1\ \ S2\ \ S3]^T \quad (29)$$

$$[\alpha^{231}\,\alpha^{230}\,0\,0] \cdot [S0\,\alpha \cdot S1\,\alpha^2 \cdot S2\,\alpha^3 \cdot S3]^T$$
↑ singular correction encoding constant A description will be made hereinunder as to decoding. Whether there is any error can be judged by creating a syndrome.

$$\underbrace{\begin{pmatrix} 1 & 1 & \ldots & 1 & 1 \\ \alpha^{n-1} & \alpha^{n-2} & \ldots & \alpha & 1 \\ \alpha^{2(n-1)} & \alpha^{2(n-2)} & \ldots & \alpha^2 & 1 \\ \alpha^{3(n-1)} & \alpha^{3(n-2)} & \ldots & \alpha^3 & 1 \end{pmatrix}}_{H} \begin{pmatrix} j1 \\ j2 \\ \cdot \\ \cdot \\ jn-1 \\ jn \end{pmatrix} = J \begin{pmatrix} S0 \\ S1 \\ S2 \\ S3 \end{pmatrix} = S \quad (30)$$

where, $$\underbrace{\begin{pmatrix} j1 \\ j2 \\ \cdot \\ \cdot \\ jn-1 \\ jn \end{pmatrix}}_{I} = \begin{pmatrix} i1 \\ i2 \\ \cdot \\ \cdot \\ in-1 \\ in \end{pmatrix} = \begin{pmatrix} e1 \\ e2 \\ \cdot \\ \cdot \\ en-1 \\ en \end{pmatrix} \quad (31)$$

wherein, n represents code length, H represents check matrix, J represents code word, S represents syndrome, I represents code word and E represents error.

Thus, the syndrome S is expressed as the product of the error E and the check matrix H, as shown by the following formula (32).

$$S = H \cdot J = H \cdot (I+E) = H \cdot \overset{0}{I} + H \cdot E = H \cdot E \quad (32)$$

It is assumed here that errors ei and ej exist at positions i and j, respectively.

1) Generation of syndrome $$\begin{pmatrix} S0 \\ S1 \\ S2 \\ S3 \end{pmatrix} = \begin{pmatrix} ei & + & ej \\ \alpha^{n-i} \cdot ei & + & \alpha^{(n-j)} \cdot ej \\ \alpha^{2(n-i)} \cdot ei & + & \alpha^{2(n-j)} \cdot ej \\ \alpha^{3(n-i)} \cdot ei & + & \alpha^{3(n-j)} \cdot ej \end{pmatrix} \quad (33)$$

2) Code-length correction $$\begin{pmatrix} S0' \\ S1' \\ S2' \\ S3' \end{pmatrix} = \begin{pmatrix} S0 \\ S1 \cdot \alpha^{-n} \\ S2 \cdot \alpha^{-2n} \\ S3 \cdot \alpha^{-3n} \end{pmatrix} = \quad (34)$$

$$\begin{pmatrix} ei & + & ej \\ \alpha^{-i} \cdot ei & + & \alpha^{-j} \cdot ej \\ \alpha^{-2i} \cdot ei & + & \alpha^{-2j} \cdot ej \\ \alpha^{-3i} \cdot ei & + & \alpha^{-3j} \cdot ej \end{pmatrix}$$

3) K-creation (K: 0 ... n)

$$\begin{pmatrix} K0 \\ K1 \\ K2 \\ K3 \end{pmatrix} = \begin{pmatrix} S0' \\ S1' \cdot \alpha^{k} \\ S2' \cdot \alpha^{2k} \\ S3' \cdot \alpha^{3k} \end{pmatrix} = \quad (35)$$

$$\begin{pmatrix} ei & + & ej \\ \alpha^{k-i} \cdot ei & + & \alpha^{k-j} \cdot ej \\ \alpha^{2(k-i)} \cdot ei & + & \alpha^{2(k-j)} \cdot ej \\ \alpha^{3(k-i)} \cdot ei & + & \alpha^{3(k-j)} \cdot ej \end{pmatrix}$$

4) A-creation $$\begin{pmatrix} A0 \\ A1 \\ A2 \end{pmatrix} = \begin{pmatrix} K0 + K1 \\ K1 + K2 \\ K2 + K3 \end{pmatrix} = \quad (36)$$

$$\begin{pmatrix} ei \cdot (1+\alpha^{k-i}) & + ej \cdot (1+\alpha^{k-j}) \\ ei \cdot (1+\alpha^{k-i}) \cdot \alpha^{k-i} & + ej \cdot (1+\alpha^{k-j}) \cdot \alpha^{k-j} \\ ei \cdot (1+\alpha^{k-i}) \cdot \alpha^{2(k-i)} & + ej \cdot (1+\alpha^{k-j}) \cdot \alpha^{2(k-j)} \end{pmatrix}$$

5) Error position $$\begin{pmatrix} L1 \\ L2 \end{pmatrix} = \begin{pmatrix} A0 \\ A0 \cdot A2 + A1^2 \end{pmatrix} = \quad (37)$$

$$\begin{pmatrix} ei \cdot (1+\alpha^{k-i}) & + ej \cdot (1+\alpha^{k-j}) \\ ei \cdot ej \cdot (1+\alpha^{k-i}) \cdot (1+\alpha^{k-j}) \cdot (\alpha^{2(k-i)}+\alpha^{2(k-j)}) \end{pmatrix}$$

6) Error pattern $$e = K0 + A0^2 \cdot (A0 + A2)^{-1} = (ei + ej) + \qquad (38)$$

$$\frac{ei^2 \cdot (1 + \alpha^{k-i})^2 + ej^2 \cdot (1 + \alpha^{k-j})^2}{ei \cdot (1 + \alpha^{k-i})^2 + ej \cdot (1 + \alpha^{k-j})^2}$$

Figure 31:
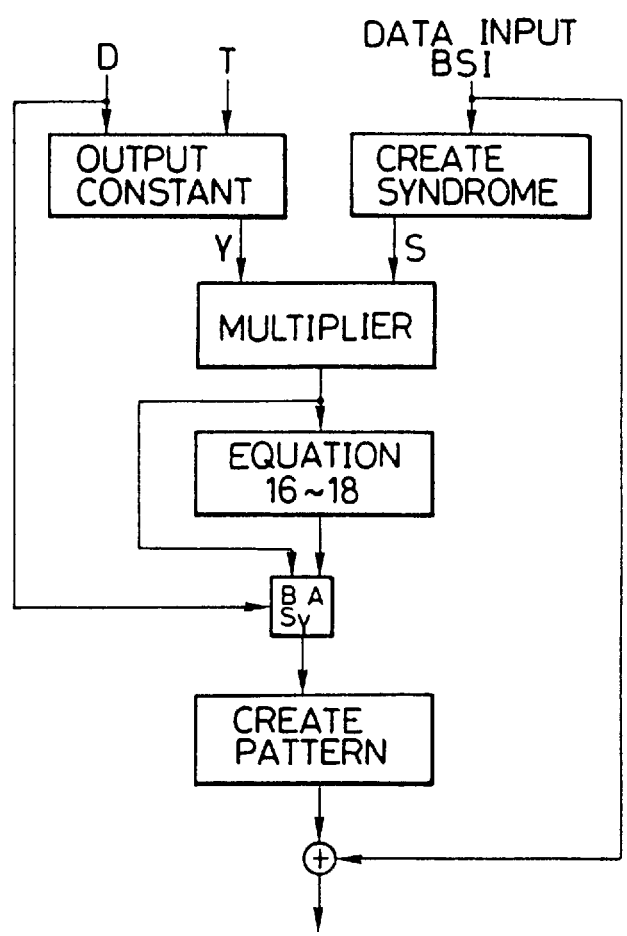
FIG. 31 is a block diagram of an encoding/decoding circuit in a third embodiment of the present invention.

7) Judgment
  ① When there is no error (ei=ej=0)
    L1=0
    L2'20
    e=0
  ② In case of singular error (ei≠0, ej=0) . . . (39)
    L1: L1=0 only when k=i
    L2=0
    e: e=ei only when k=i
  ③ In case of double error (ei≠0, ej≠0)
    L1: indefinite
    L2: L2=0 only on conditions of k=i and k=j
    e: e=ei on condition of k=i and e=ej on condition of k=j It is therefore possible to selectively conduct encoding and decoding processes by designing an encoding and decoding circuit in which, as shown in FIG. 31, an encoding circuit is used as an unknown and a constant output circuit is formed by adding selector and encoding constant output circuit 291 to a code length correction constant generating circuit 301. Each of the blocks can have a simplified construction as follows.

[Syndrome generating circuit]

When a single multiplier is used as in FIG. 31, it is necessary that the signal output from the syndrome generating circuit is conducted in a serial manner by means of a BUS line. In the case of encoding, the serial output can be conducted provided that the input in-3 to in corresponding to the parity portion is 0. However, if the input in-3 to in is not zero, the following operation is necessary.

In order to realize S1 to SIV shown in formula (28) in double-error correction encoding, the syndrome creation circuit should be operated with the input data in-3 to in set at 0. To this end, the clear input to be supplied to the register which latches the received word J is held at L level during the period corresponding to in-3 to in. Therefore, syndromes SI [S0, S1, S2, S3] are formed by the words received in the period between i1 and in-4, when in-3 is being input. The syndrome creating circuit continues to operate even during receiving in-2=0 so that syndromes SII [S0, α·S1, α²·S2, α³²·S3] are created. Similarly, when in−1=0 and in=0 are input, syndromes SIII [S0, α²·S1, α⁴·S2, α⁶·S3] and SIV [S0, α³·S1, α⁶·S2, α⁹·S3] are formed.

Figure 32:
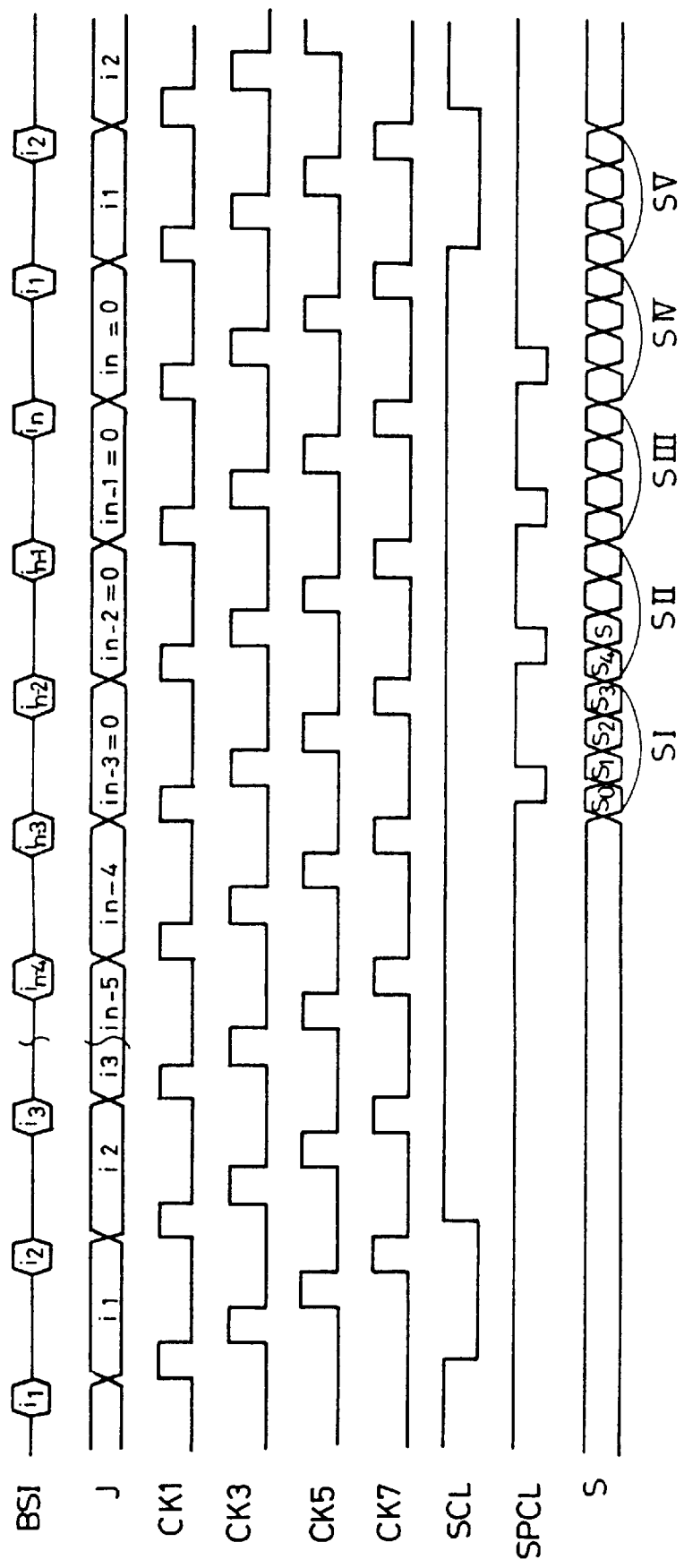
FIG. 32 is a timing chart of operation of a syndrome creating circuit in the encoding mode.

The same also applies to the case of singular error. Namely, when in-1=0 is being input, syndromes SI [S0, S1] are created in accordance with inputs in the period between i1 to in-2, and, when the next input in=0 is being received, syndromes SII [S0, α·S1] are created. Thus, the encoding syndrome creation circuit can be realized simply by controlling the SPCL of the decoding syndrome generating circuit. The timing of this control is shown in FIG. 32.

[Constant output circuit]

Figure 33:
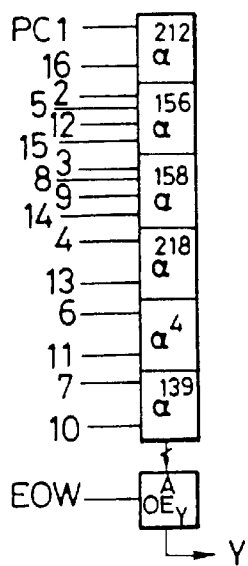
FIG. 33 is a block diagram of a double-error correction encoding constant circuit.

In the double-error correction encoding, after determination of the syndromes SI to SIV by the syndrome creating circuit, it is necessary to multiply the syndromes with double-error correction encoding constant, in order to create the parity in-3 to in. As shown in formulae (28) and (29), a single encoding constant is used fixedly in each of the singular error correction and double-error correction. Thus, the multiplication can be conducted by a circuit which multiplies the syndromes with the corresponding constant in synchronization with these syndromes. FIG. 33 shows a block diagram of an example of such a circuit.

Figure 35:
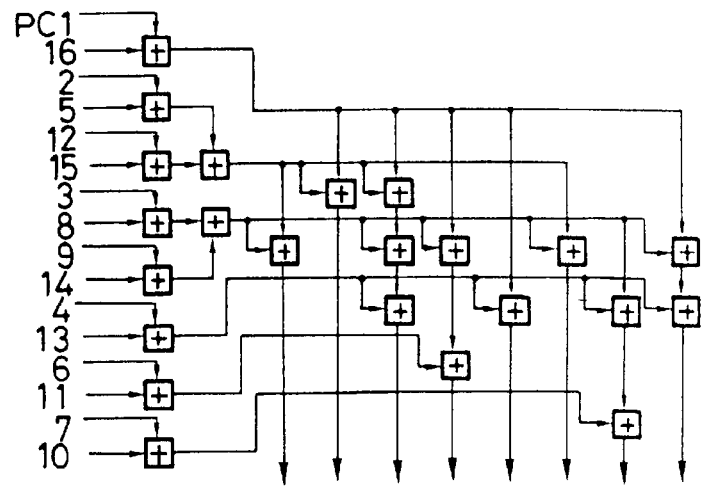
FIG. 35 is an illustration of a double-error correction encoding constant output circuit.
Figure 34:
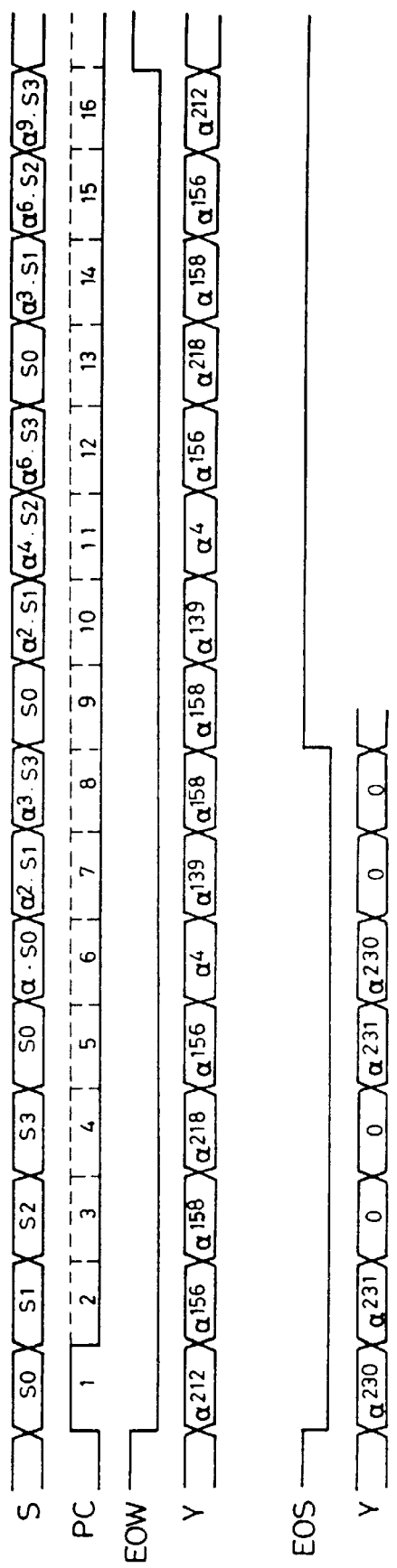
FIG. 34 is a timing chart showing the operation of the encoding constant circuit.

PC1 to PC16 are the outputs obtained by shifting PC1 shown in FIG. 34 by means of a shift register. By the outputs PC1 to PC16, constants are assigned to the respective syndromes SI to SIV in accordance with the formula (28) and are output at BUS line Y. FIG. 33 shows a circuit which is adapted for conducting EOW control on the thus assigned double-error correction encoding constant outputs and for delivering the result of this control to the input BUS line Y of the multiplier. The double-error correction encoding constant output circuit making use of PC1 to PC16 can have a construction as shown in FIG. 35.

Figure 36:
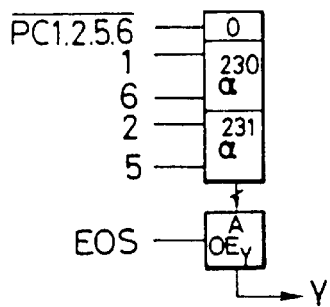
FIG. 36 is a block diagram of a singular-error correction encoding constant circuit.
Figure 37:
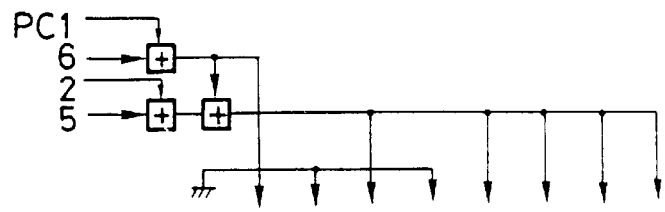
FIG. 37 is an illustration of a singular-error correction encoding constant output circuit.

In the case of singular-error correction encoding operation, SCL takes L level when the syndrome SIII is created, so that only PC1 to PC8 are used. Namely, encoding constants corresponding to SI and SII are assigned by means of PC1 to PC8. In this case, S2 and S3 have no significance, so that 0 is output with respect to S2 and S3. It will be understood that the singular-error correction encoding setting circuit can have the same construction and operation principle as the double-error correction encoding circuit, as shown in FIGS. 36 and 37. The operation timing of this circuit is shown in FIG. 34.

Figure 38:
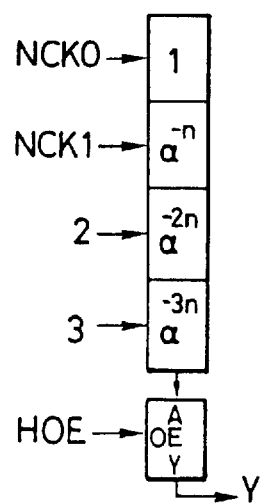
FIG. 38 is a code-length correction constant circuit.
Figure 39:
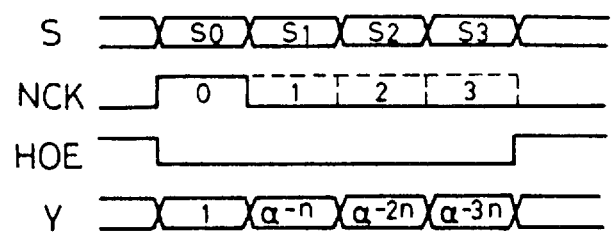
FIG. 39 is a timing chart showing the operation of the code-length correction constant circuit.

As in the case of the encoding constant, the code-length correction constant 1 is created by a circuit having blocks as shown in FIG. 38. The operation timing of this circuit is shown in FIG. 39. In the case when the length n is fixed, 1 and $\alpha^{-n}$ to $\alpha^{-3n}$ can be created by an OR circuit.

Figure 40:
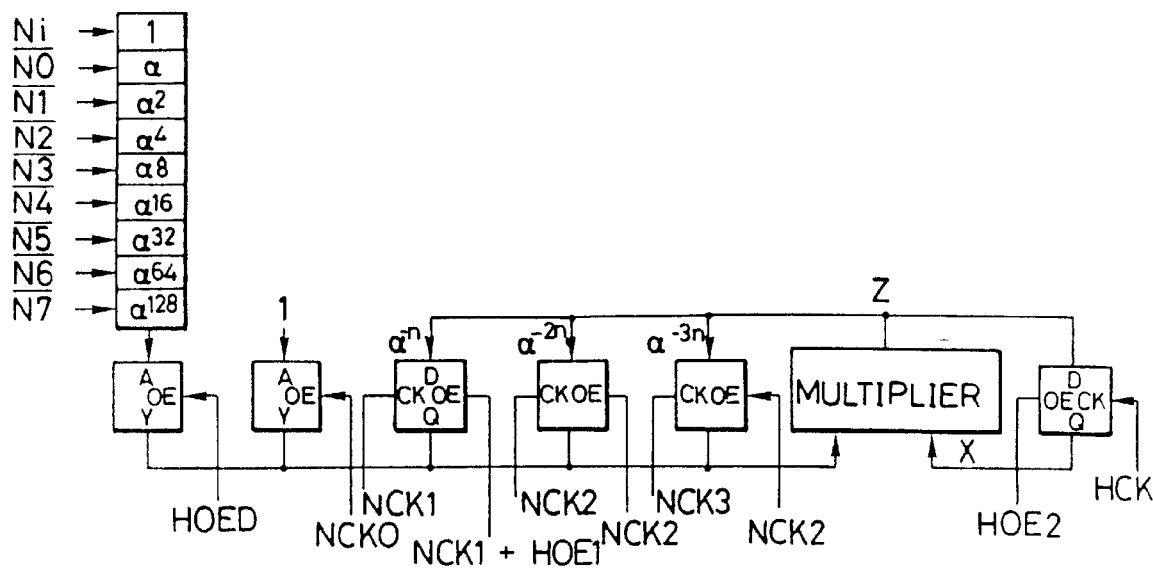
FIG. 40 is a block diagram of a variable-code-length correction circuit.
Figure 41:
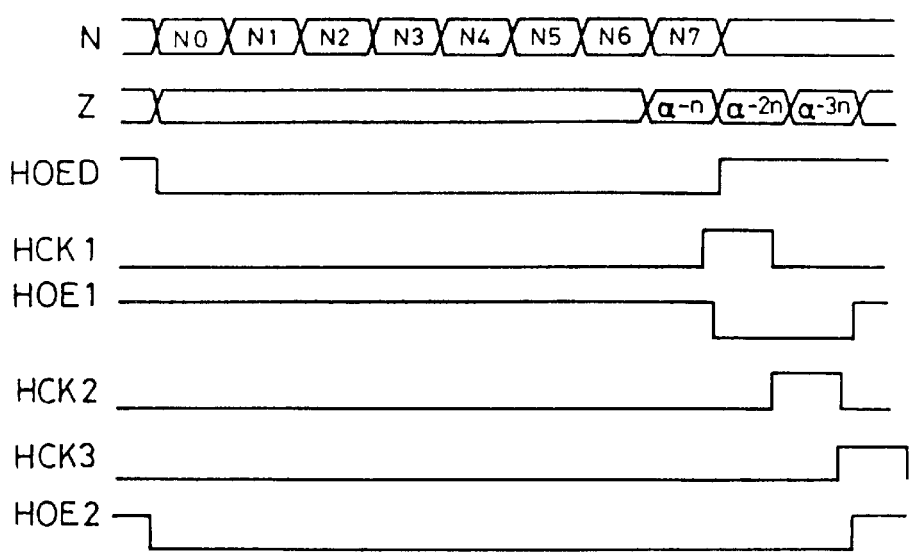
FIG. 41 is a timing chart showing the operation of the variable-code-length correction circuit.

When the length n is variable, the code-length correction circuit may be constructed by a ROM or a later-mentioned exponent/vector conversion circuit, as follows. Namely, the arrangement may be such that $\alpha^{-n}$ is created by a multiplier in the period of creation of the first syndrome, and then $\alpha^{-2n}$ and $\alpha^{-3n}$ are created by the multiplier, the outputs being latched by a three-state register which in turn is OE-controlled at NCK1 to NCK3. An example of such a code-length correction circuit is shown by a block diagram in FIG. 40, while the operation timing of this circuit is shown in FIG. 41.

As to the selection signal, encoding and decoding are expressed by D, while the correction capacity is represented by T. EOW (encoding, T=2), EOS (encoding, T=1) and HOE (decoding) are executed by the setting of T and D. When T and D are not set, EOW, EOS and HOE take H level.

[Pattern generating circuit]

Figure 42:
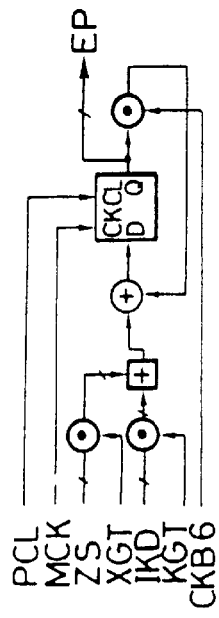
FIG. 42 is a block diagram of a pattern creating circuit.
Figure 43:
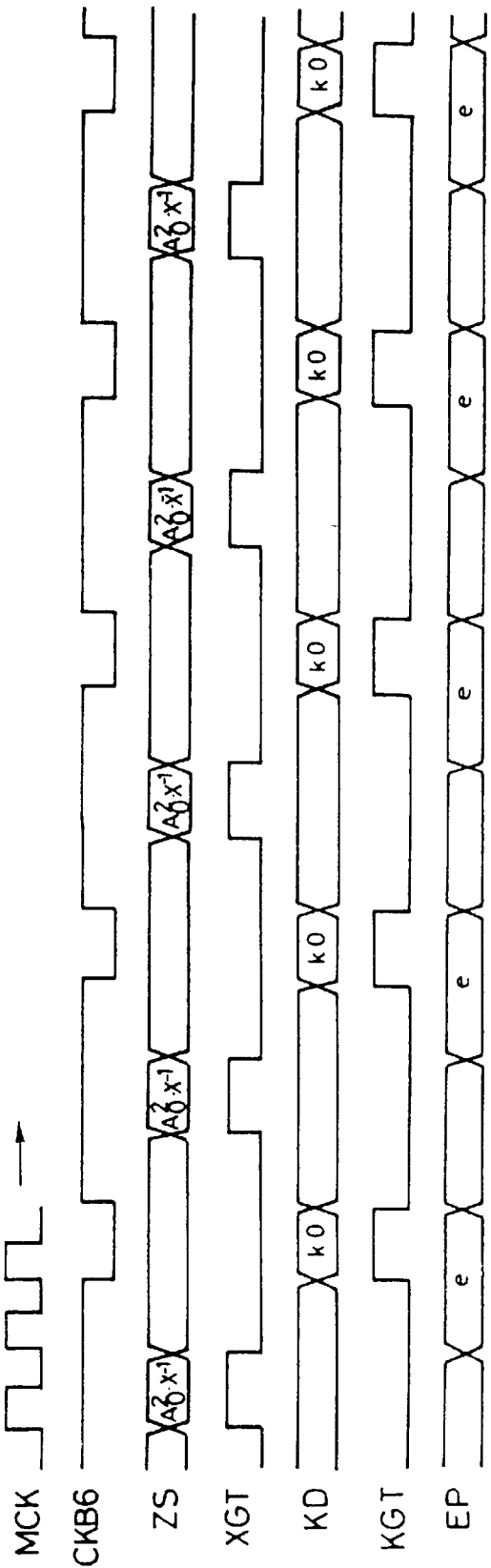
FIG. 43 is a timing chart showing the operation of a pattern creating circuit in decoding mode.

The operation shown in formula (38) can be executed by a circuit shown in FIG. 42. K0 is extracted from KD by computing AND of KD and KGT and the thus extracted K0 is input to a register. Then, the output $X^{254} \cdot A0^2$, i.e., $A0^2 \cdot (A0+A1)^{-1}$ is extracted from the output ZS of the selector shown in FIG. 31, and EXOR of the thus extracted output and the output of the register is computed, whereby an error pattern is created. In other cases, EXOR is computed by setting the output as 0, by applying a condition of KGT=XGT=0. This operation is commonly adopted in singular and double error correction. The timing of operation of this circuit is shown in FIG. 43. In the case of decoding, however, a condition of PCL=H applies.

Figure 44:
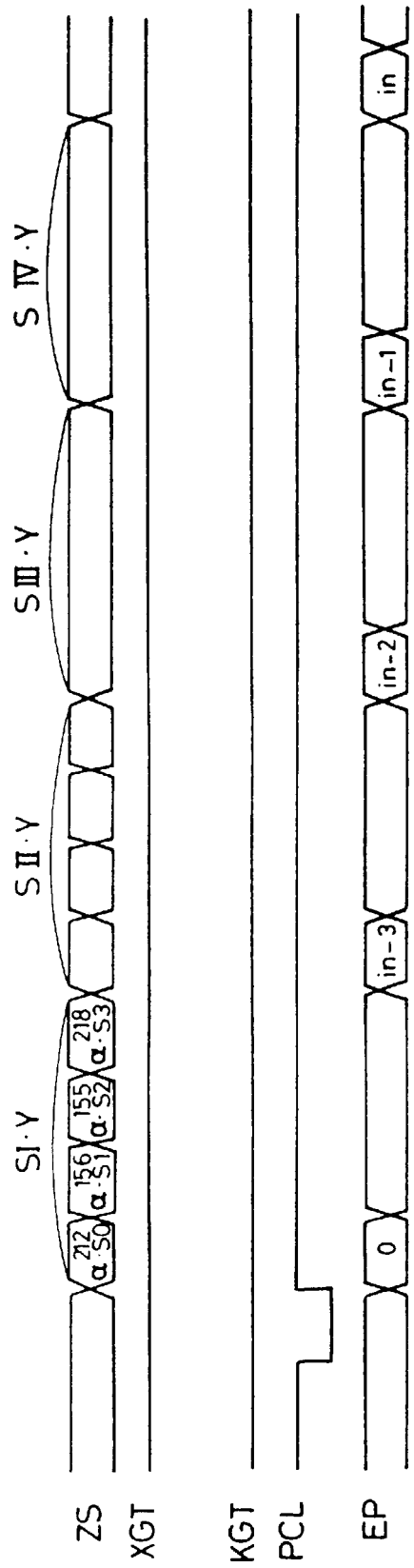
FIGS. 44 and 45 are timing charts showing the operation of the pattern creating circuit in encoding mode.
Figure 45:
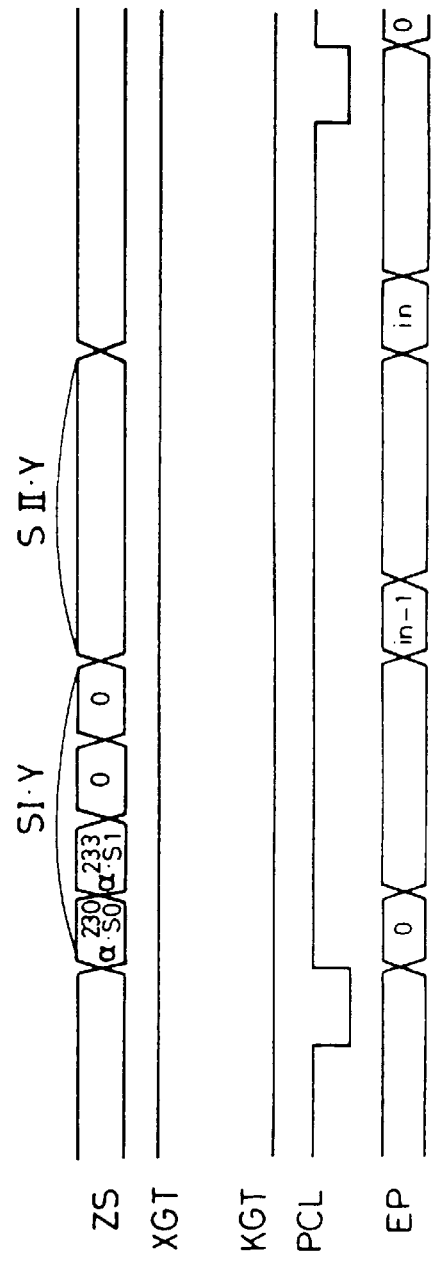

The creation of parity is conducted during encoding. In the case of double-error correction coding, values obtained by multiplying the syndromes SI to SIV by encoding constants are derived from ZS. It is therefore possible to generate parities in-3 to in successively, by continuously producing EXOR of the ZS output and the output of the register cleared by CKB6 on condition of XGT=H and KGT=L until the register output is cleared again by CKB6. The above-described operation is conducted only in the period in which syndromes S1 to SW are output from ZS. Other outputs of EP has no meaning. Therefore, by setting PCL at the L level, the output of EP is set at "0". This operation is shown in FIG. 44. The operation performed in singular-error correction encoding is shown in FIG. 45.

The operation of the formula (35) is realized, as in the case of the syndrome creating circuit, multiplying the syndromes Si by $\alpha^i$ for k times. The operation of formula (36) can be conducted through an EXOR operation. The operation of formula (37) can be realized by multiplication of EXOR and $A1^2$. The formula (37), however, does not matter on the pattern creating operation expressed by the formula (38). Operations other than $X^2$ computation are ordinary operations and, hence, can be realized by a simple circuit. The $X^2$ computation also can be conducted without substantial difficulty by the arrangement shown in FIG. 46.

A description will be made hereinunder as to a modification of this embodiment.

The encoding operation is conducted in accordance with the aforementioned formulae (22) to (29). Briefly, the encoding process is to determine syndromes SI to SIV, multiplying these syndromes with encoding constants determined by formulae (28) and (29) and computing EXORs of these outputs for every 4 clocks (S0 to S3), whereby parities are generated at every four clocks. Thus, the encoding operation can be conducted by a circuit having blocks as shown in FIG. 29, including a single multiplication circuit, a syndrome creating circuit capable of outputting syndromes SI to SIV in serial manner, a circuit for serially outputting encoding constants, and an EXOR circuit for computing EXOR for every four clocks.

Figure 47:
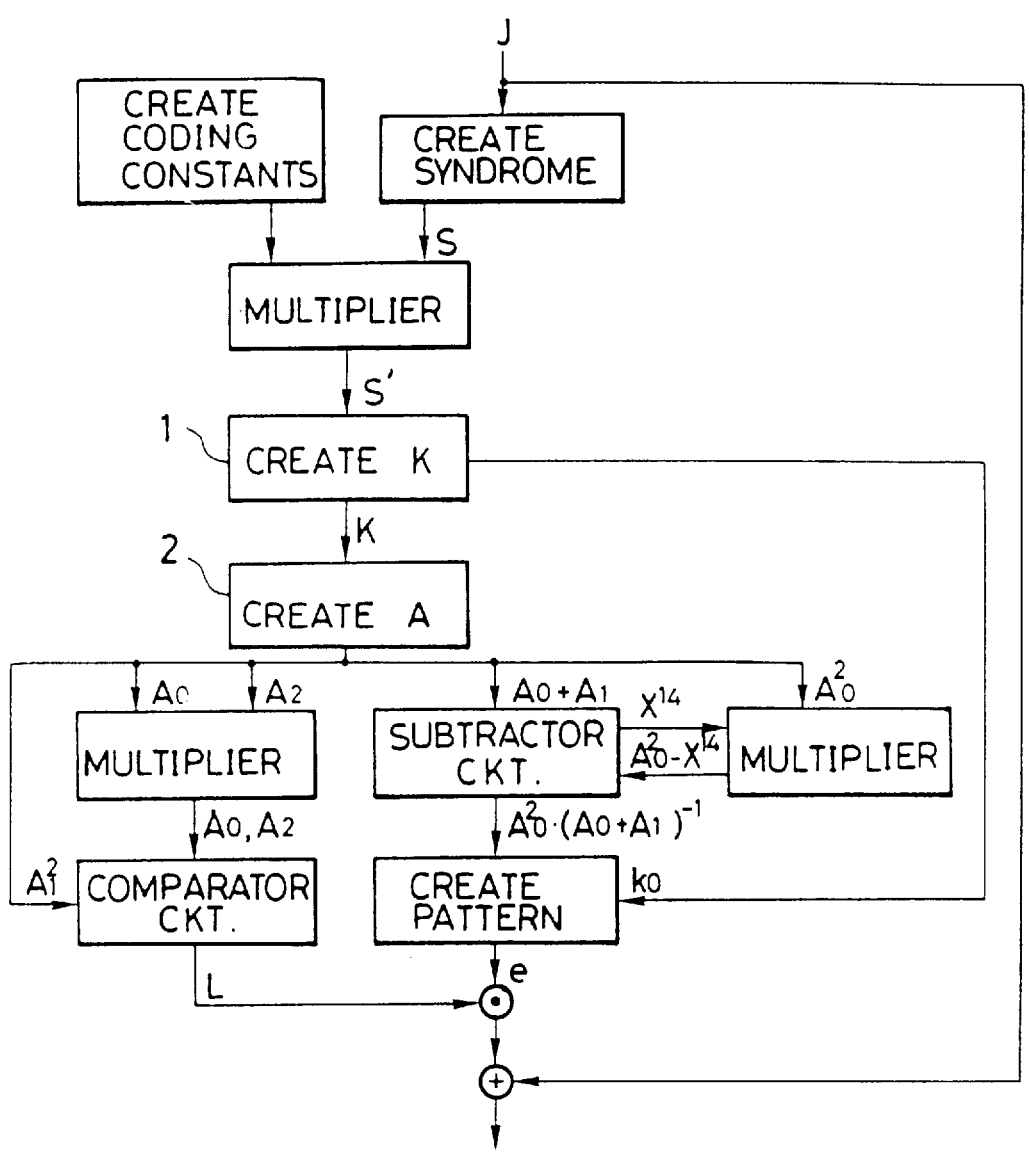
FIG. 47 is a block diagram of an encoding circuit.

The decoding operation is conducted by arithmetic operations in formulae (30) to (39). The first step can be conducted by the same construction as the encoding operation, because the operation in this step is to multiply the syndromes S with the code-length correction constants $\alpha^{-n}$ to $\alpha^{-3n}$, though the values of constants are different in both modes. Then, the arithmetic operation in accordance with formulae (11) to (20) is conducted by a circuit as shown in FIG. 47. Assuming here that this pattern generating circuit is an EXOR circuit which operates with a period of four clocks, such a circuit can be commonly used both in the encoding and decoding operations.

A discussion will be made hereinunder as to an attempt for combining three multipliers in FIG. 47 into a single multiplier.

The division of $A_0^2(A_0+A_1)^{-1}$ can be conducted by a later-mentioned circuit which incorporates a multiplier adapted to conduct multiplication corresponding to four clocks. Since the syndrome creating circuits $S_0$ to $S_3$ operate at a period corresponding to four clocks, it is possible to consider four clocks as the basis period. In formulae (30) to (39), the multiplication $A_0 \cdot A_2$ and the multiplication of $y \cdot x^{14}$ used in the division circuit are to be conducted. The code-length correction are conducted in terms of code table and not in the code word basis.

The operation for multiplying by $\alpha^{-n}$ to $\alpha^{-3n}$ is conducted in the period of three clocks so that a time corresponding to one clock is left unused. The multiplication $A_0 \cdot A_2$ is conducted in this period. The multiplication of $y \cdot x^{14}$ is not conducted only when the code-length correction is to be executed. In such a case, the creation of an error pattern fails with respect to the code word which requires code-length correction. This, however, does not cause any substantial problem if this code word is set in the parity portion.

Figure 48:
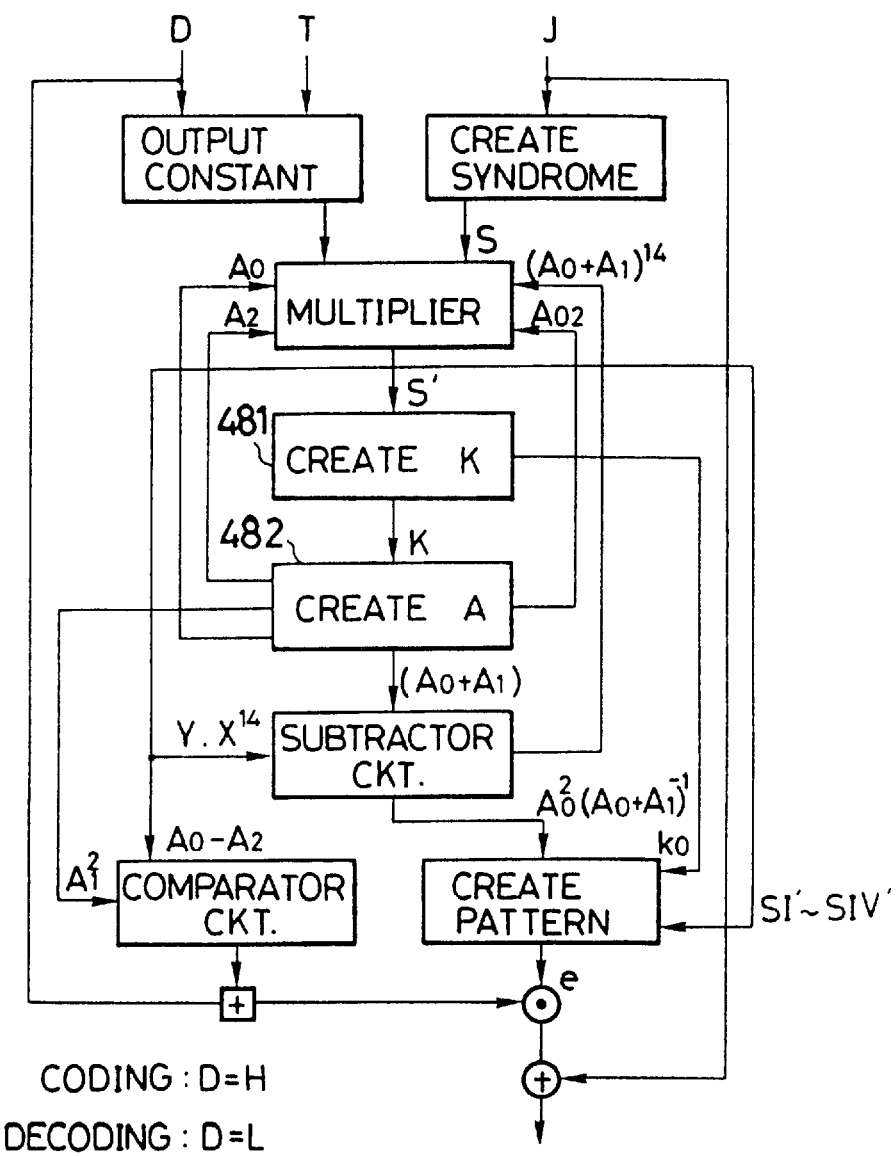
FIG. 48 is a block diagram of an encoding/decoding circuit in a modification of the third embodiment.

It is thus possible to simplify the encoding and decoding circuit by adopting the circuit arrangement as shown in FIG. 48.

The syndrome creating circuit, constant output circuit and the pattern output circuit are the same as those described before, so that detailed description thereof is omitted. A description, therefore, will be started again with respect to the K-creating circuit, comparator circuit, and A-creating circuit.

[K-creating circuit]

Figure 51:
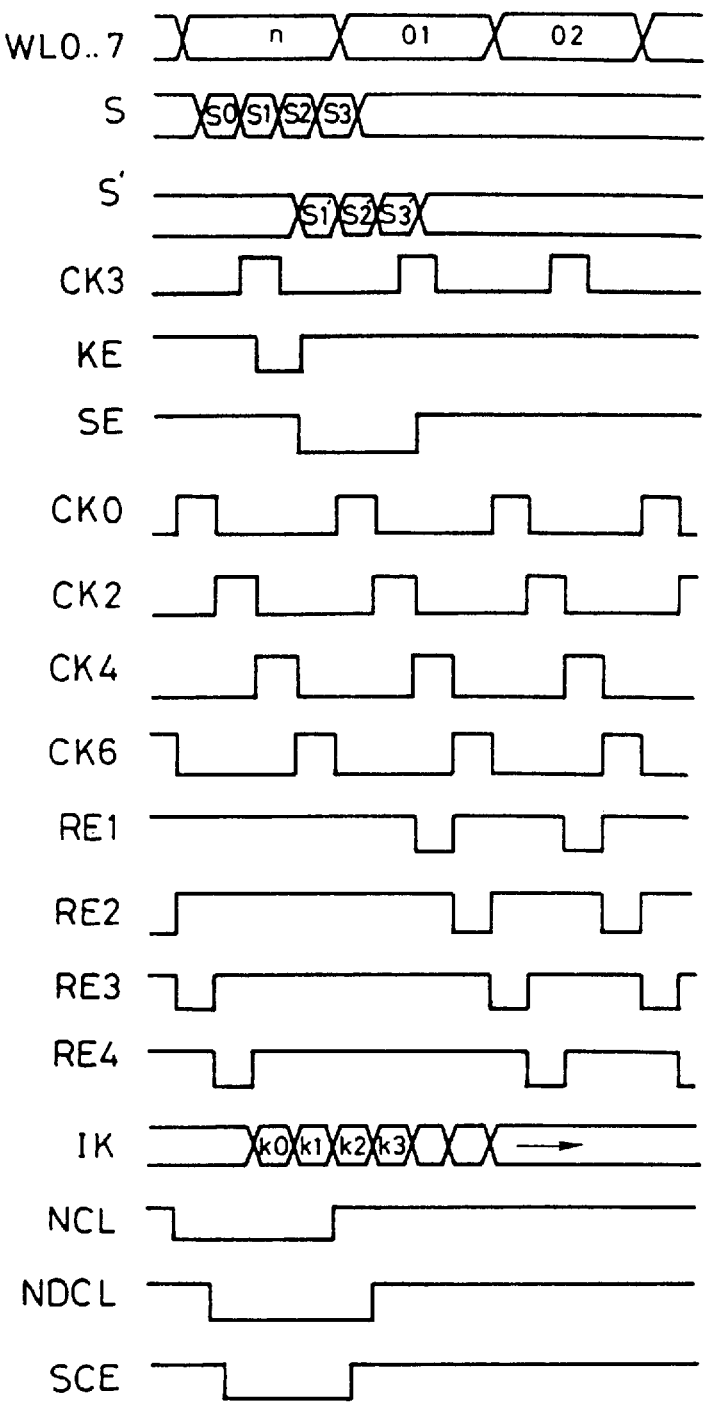
FIG. 51 is an illustration of timing of operation of the K-creating circuit.

The K-creating circuit 481 is a circuit for multiplying the syndrome Si' after code-length correction of formula (34) by $\alpha^{-i}$ for a time corresponding to the code length, thus executing the operation of formula (35). This circuit, therefore, relates only to decoding operation and may be realized by a circuit arrangement similar to the syndrome generating circuit. Practically, however, a circuit as shown in FIG. 49 is used, because in this case, the computation of EXOR with the received word is not necessary. By using a three-state control switch as the switch shown in FIG. 49 and by adopting a BUS line control construction similar to that of the syndrome generating circuit, a circuit as shown in FIG. 50 is obtained. The syndrome S0 does not require code-length correction of the formula (34), but syndromes S1 to S3 have to be converted into S1' to S3' through code-length correction. The code-length correction is conducted by multiplying the respective syndromes with code-length correction constants. When the arrangement is such that corrected syndromes S1' to S3' are output in synchronization with SE, S0 is latched at CK3 and is output at KE so as to make the timing of S0 coincide with the timing of S0' so that corrected syndromes S', including S0' to S3', are input to the K-creating circuit in the mentioned order. Therefore, the output enable signals RE1 to RE4 of latches for K0 to K3 operate in a competing a manner as in the case of the timing chart shown in FIG. 32. These signals RE1 to RE4, however, have to be kept on in the period in which S' is being received by KE and SE. The timing of this operation is shown in FIG. 51. As in the case of the syndrome creating circuit, this circuit has an advantage that it can create K with a small-scale circuit under the supply of the corrected syndromes S' of BUS line structure. Consequently, K0 to K3 are output at a period corresponding to four clocks.

[Comparator circuit]

Figure 52:
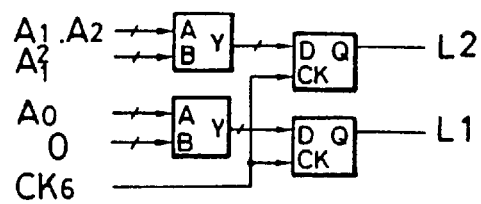
FIG. 52 is a block diagram of a comparator circuit.

FIG. 52 is a block diagram of the comparator circuit. The comparator circuit is intended for a comparison between $A0 \cdot A1$ and $A1^2$ so as to judge whether they coincide with each other or not, i.e., whether $L2=A1^2+A0, A2=0$ or $L2 \neq 0$ (formula (39)), and latches the result at CK6, thereby detecting the position of the double-error to be corrected. The position of singular-error is conducted by judging, in accordance with formula (39), whether $L1=A0=0$ or $L1 \neq 0$ and then latching the result at CK6.

[A-creating circuit]

Figure 53:
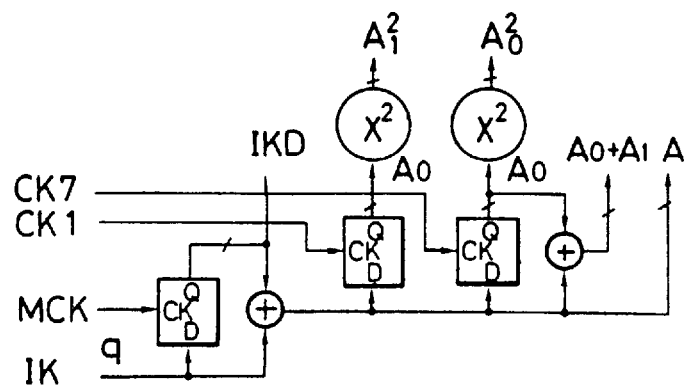
FIG. 53 is a block diagram of an A-creating circuit.
Figure 54:
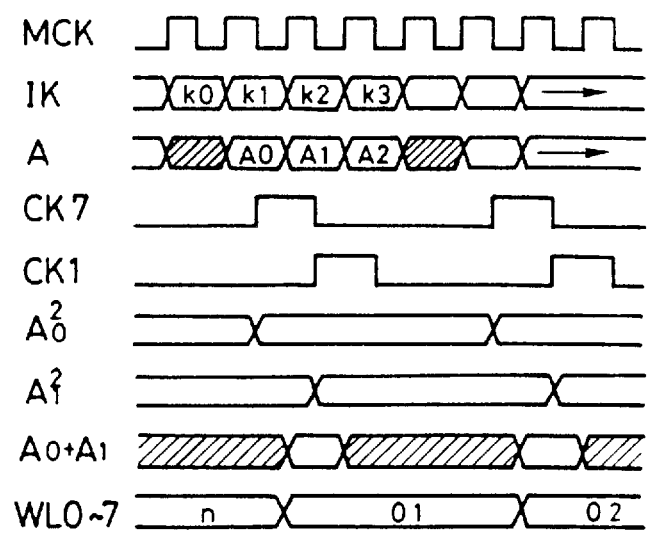
FIG. 54 is an illustration of timing of operation of the A-creating circuit.

The A-creating circuit is composed of a circuit which computes, in accordance with the formula (36), EXOR of K0 to K3 created by the K-creating circuit so as to create A0 to A2, and a circuit for creating A0+A1, $A0^2$ and $A1^2$. The A-creating circuit takes part only in the decoding operation. Because of use of a BUS line type construction, the K0 to K3 are not input simultaneously. It is therefore, necessary to latch K by MCK by one clock and computing the EXOR of the output delayed by one clock and K, in order to create A. The arrangement of a circuit for realizing such an operation and the timing of operation of this circuit are shown in FIGS. 53 and 54, respectively. In FIGS. 54 onward, signals shown by hatching are invalid signals. The next portion of A2 is K3+K0 which has no significance in the subsequent algorithms. The output of A0+A1 is conducted only in the portions of A synchronous with A1 and other portions of A do not have any meaning. Signal A is latched at CK7 and CK1 so as to form A0 and A1 thereby creating $A0^2$, $A1^2$. This operation is conducted for attaining as timing optimum for the computation of formulae (37) and (38).

As to the $x^2$ circuit, representing the vector expression of x by $P(x)=x^8+x^4+x^3+x^2+1$, where x is represented by $x=V7 \cdot \alpha^7+V6 \cdot \alpha^6+V5 \cdot \alpha^5+V4 \cdot \alpha^4+V3 \cdot \alpha^3+V2 \cdot \alpha^2+V1 \cdot \alpha+V0$, $x^2$ can be developed as follows.

$$\begin{aligned}x^2 &= V7 \cdot \alpha^{14} + V6 \cdot \alpha^{12} + V5 \cdot \alpha^{10} + V4 \cdot \alpha^8 + V3 \cdot \alpha^6 + \\ & \quad V2 \cdot \alpha^4 + V1 \cdot \alpha^2 + V0 \\ &= V7 \cdot (\alpha^4 + \alpha + 1) + V6 \cdot (\alpha^7 + \alpha^6 + \alpha^3 + \alpha^2 + 1) + \\ & \quad V5 \cdot (\alpha^6 + \alpha^5 + \alpha^4 + \alpha 2) + V4 \cdot (\alpha^4 + \alpha^3 + \alpha^2 + 1) + \\ & \quad V3 \cdot \alpha^6 + V2 \cdot \alpha^4 + V1 \cdot \alpha^2 + V0 \\ &= V6 \cdot \alpha^7 + (V6 + V5 + V3)\alpha^6 + V5 \cdot \alpha^5 + (V7 + V5 + \\ & \quad V4 + V2) \cdot \alpha^4 + (V6 + V4) \cdot \alpha^3 + (V6 + V5 + V4 + V1) \cdot \\ & \quad \alpha^2 + V7 \cdot \alpha + (V7 + V6 + V4 + V0)\end{aligned}$$

Thus, $x^2$ can be determined by a circuit having a construction shown in FIG. 46, as explained before.

As will be understood from the foregoing description, this embodiment enables the scale of the circuit to be reduced by virtue of common use of circuit arrangements both by encoding and decoding and multiplied use of the circuit, while maintaining the high speed of encoding and decoding operation and while allowing the correction capacity and the code length to be varied.

Consequence, this embodiment contributes to a reduction in the size and improvement in the performance of any device which incorporates this embodiment of the error correction apparatus of the invention.

[Fourth Embodiment]

A description will be made hereinunder as to a syndrome creating circuit in a BHC encoding or decoding circuit suitable for use in a fourth embodiment.

Figure 55:
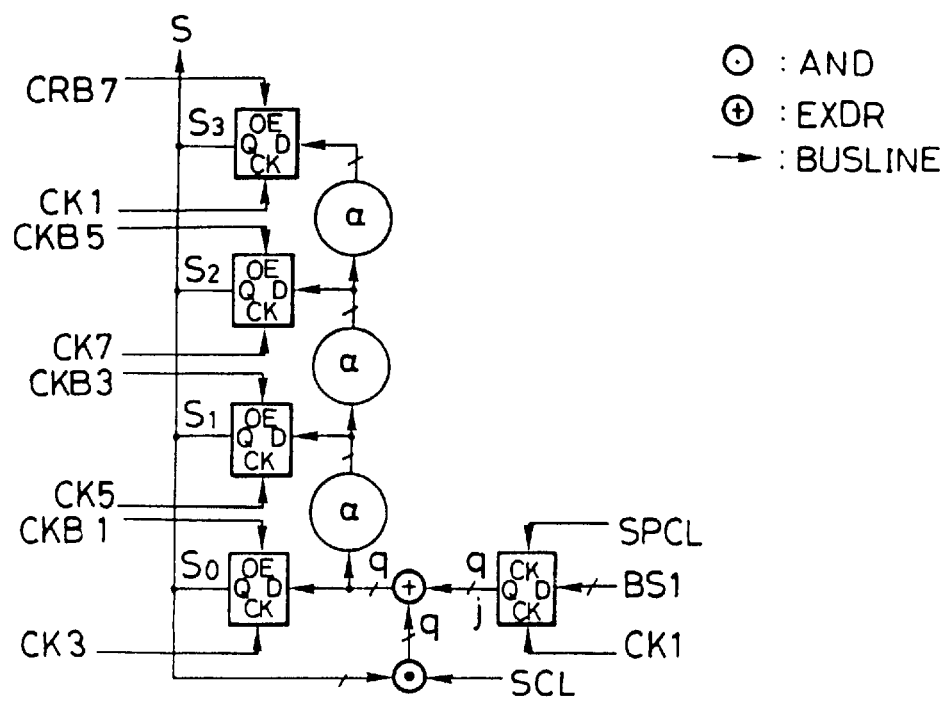
FIG. 55 is an illustration of a syndrome creating circuit in a fourth embodiment of the present invention.
Figure 56:
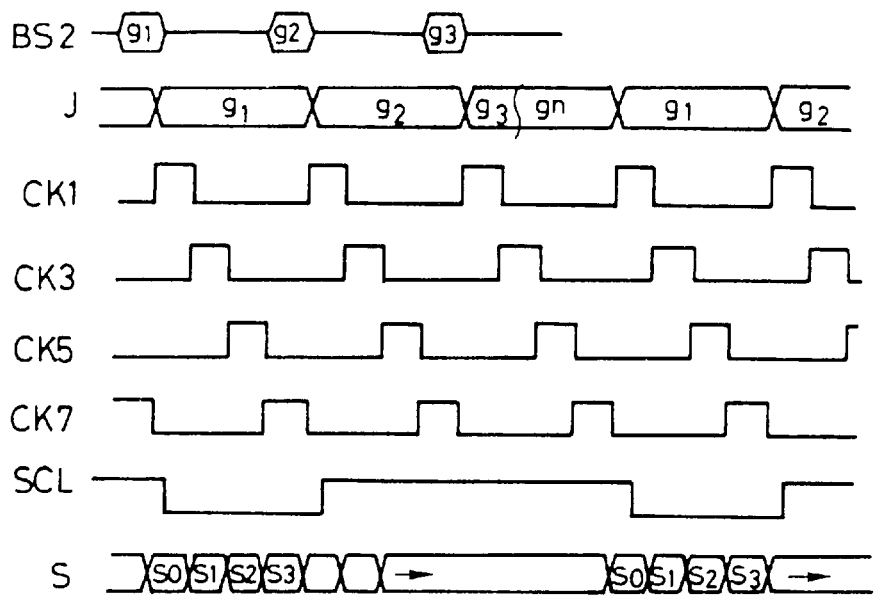
FIG. 56 is an illustration of a timing signal.

FIG. 55 shows the construction of this embodiment. The circuit shown in FIG. 55 does not incorporate independent circuits for $\alpha^i$ but, rather, the scale of the circuit is reduced by making use of the fact that the root $\alpha^i$ of the BHC code in formula (2) is progressively carried up from $\alpha^r$ (r being any number and set as r=0 in this case) such as $\alpha^{r+1}$, $\alpha^{r+1}$ and so forth. At the same time, a BUS-line structure is used for S0 to S3. Since the BUS-line type structure is used for S0 to S3, it is necessary that CK and OE (output enable) have to be used in a competing manner in the period corresponding to S0 to S3. The CK and OE used for the respective one of S0 to S3 are controlled by a signal which is shown in FIG. 56. Signals CKB1, CKB3, CKB5 and CKB7 are signals obtained through inversion of CK1, CK3, CK5 and CK7, by substituting H with L and vice versa. It is therefore necessary that the input J has to be input for each ji in synchronization with CK1. SCL is a signal which takes the L level when the first received word j1 is input. Therefore, S0 to S3 are output for every four clocks and the final answer is given in response to each SCL. It is to be understood, however, SPCL is always H in the case of the decoding operation.

The computation of the formula (2) explained above can be applied also to solution of questions in digital FOURIER transformation DFT.

When it is required that the multiplication by $\alpha^r$ is conducted beforehand, an $\alpha^r$ circuit is connected between EXOR and the register which outputs J.

The arrangement also may be such that an $\alpha^{r-l}$ circuit (l represents any positive number) is placed between EXOR and the register which outputs J, while an $\alpha l$ circuit is placed between EXOR and the register of S0 and the $\alpha$ circuit.

Figure 4:
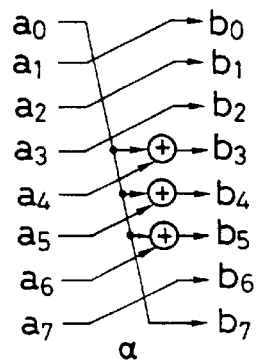
FIG. 4 is an illustration of an α circuit.
Figure 5:
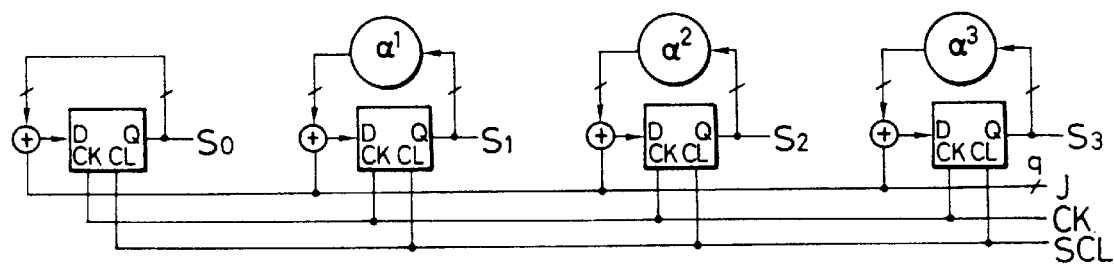
FIG. 5 is an illustration of a known syndrome creating circuit.
Figure 6:
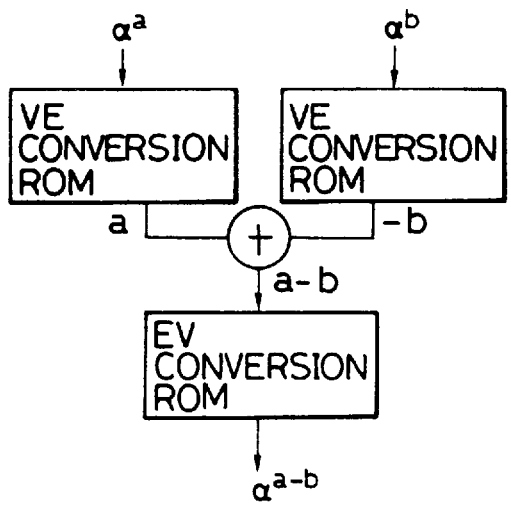
FIGS. 6 and 7 are illustrations of a construction of a known division circuit.
Figure 7:
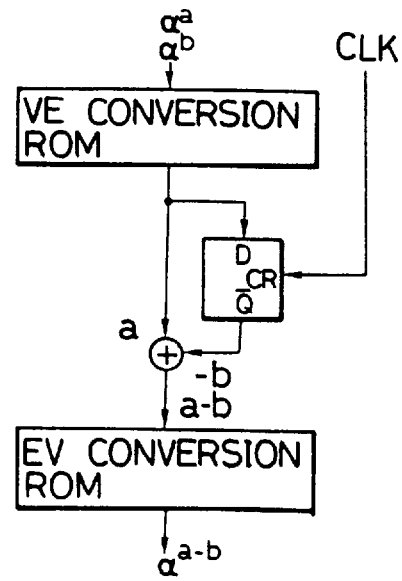
Figure 8:
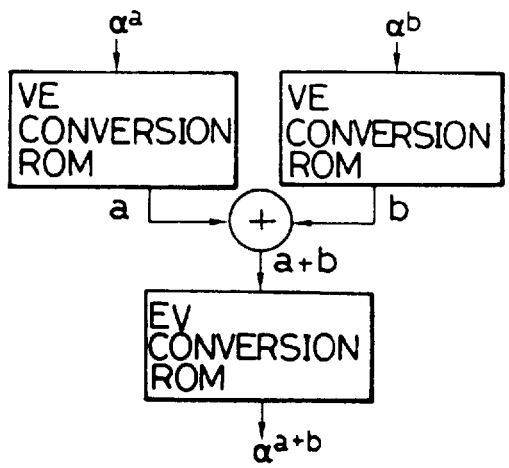
FIGS. 8 and 9 are illustrations of a known multiplication circuit.
Figure 57:
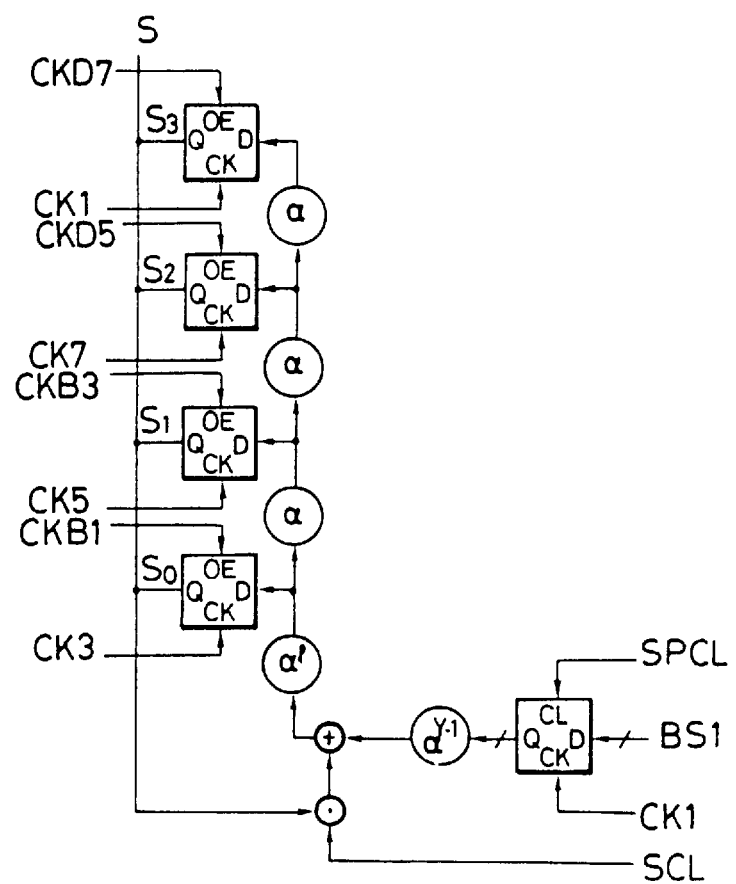
FIG. 57 is an illustration of another example of the syndrome circuit used in the error correction apparatus of the present invention.

FIG. 57 illustrates an arrangement which is suitable for use in the case when multiplication by $\alpha^r$ is necessary. An $\alpha^x$ circuit can be realized by stacking the $\alpha$ circuit shown in FIG. 4 in x-stages.

Thus, the described embodiment offers the advantages pointed out above, while reducing the scale or size of the circuit, even when the number q of the Galois function GF(2q) is large or when the number i of the syndromes Si is large or when the syndromes Si are connected through BUS line.

It will be understood that the sizes of the devices, such as optical disk device, optical card device, opto-magnetic disk device and DAT can be remarkably reduced by using the circuit of this embodiment.

[Fifth Embodiment]

A fifth embodiment of the invention will be described hereinunder.

The inputs x and y are expressed as follows, with respect to a multiplication circuit on a Galois function $GF(2^8)$.

$$\begin{aligned}x &= x_7 \cdot \alpha^7 + x_6 \cdot \alpha^6 + x_5 \cdot \alpha^5 + \\ & \quad x_4 \cdot \alpha^4 + x_3 \cdot \alpha^3 + x_2 \cdot \alpha^2 + x_1 \cdot \alpha + x_0 \\ y &= y_7 \cdot \alpha^7 + y_6 \cdot \alpha^6 + y_5 \cdot \alpha^5 + \\ & \quad y_4 \cdot \alpha^4 + y_3 \cdot \alpha^3 + y_2 \cdot \alpha^2 + y_1 \cdot \alpha + y_0\end{aligned}$$

Therefore, the product Z of x and y ($Z=x \cdot y$) is expressed as follows.

$$\begin{aligned}z &= x_7 \cdot (y \cdot \alpha^7) + x_6 \cdot (y \cdot \alpha^6) + \ldots + \\ & \quad x_2 \cdot (y \cdot \alpha^2) + x_1 \cdot (y \cdot \alpha) + x_0 \cdot y\end{aligned}$$

Figure 58:
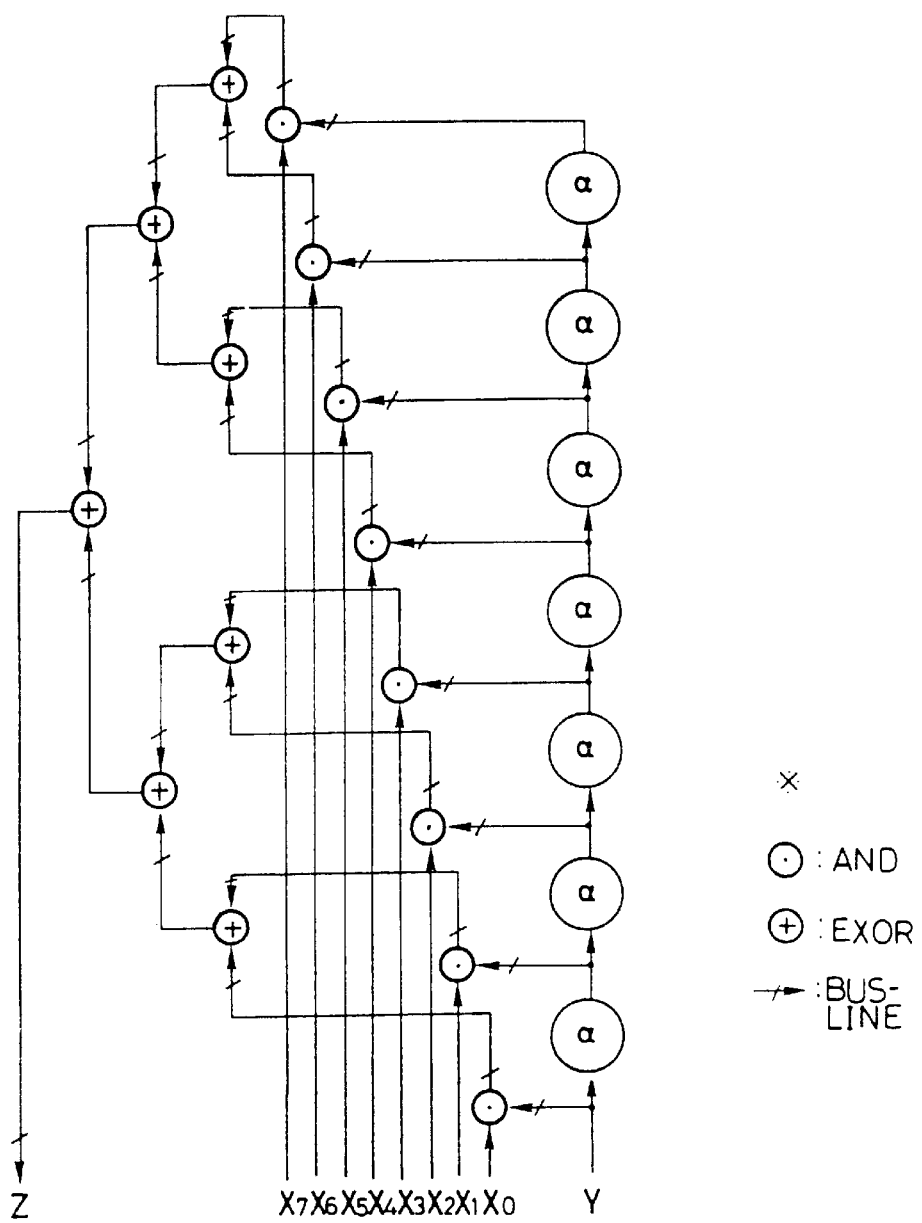
FIG. 58 is an illustration of a multiplication circuit used in a fifth embodiment of the present invention.

Therefore, the product Z is created by multiplying the value of y with 1 to $\alpha^7$ and allowing the passage of output $y \cdot \alpha^i$ when $x_i$ (i=0 to 7) is 1, while passing 0 when $x_i$ is 0, and then computing EXOR of the outputs. The multiplication can be conducted by a circuit having blocks as shown in FIG. 58.

Figure 59:
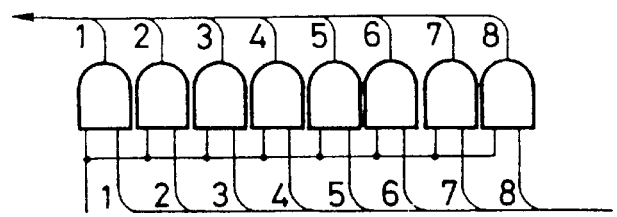
FIG. 59 is an illustration of the construction of an AND circuit incorporated in the circuit shown in FIG. 58.

FIG. 59 shows the construction of the circuit as marked by ⊙. In this circuit, successive values of y are multiplied with $\alpha$ the $\alpha$ circuit shown in FIG. 4 and known per se, and ANDs of these outputs and $x_i$ (i=0 to 7)·$y_7$ are computed. The AND outputs are then processed through an EXOR circuit ⊕, whereby the output Z is obtained. In this Figure, a mark ⊁ shows a BUS line.

Figures 60, 60A:
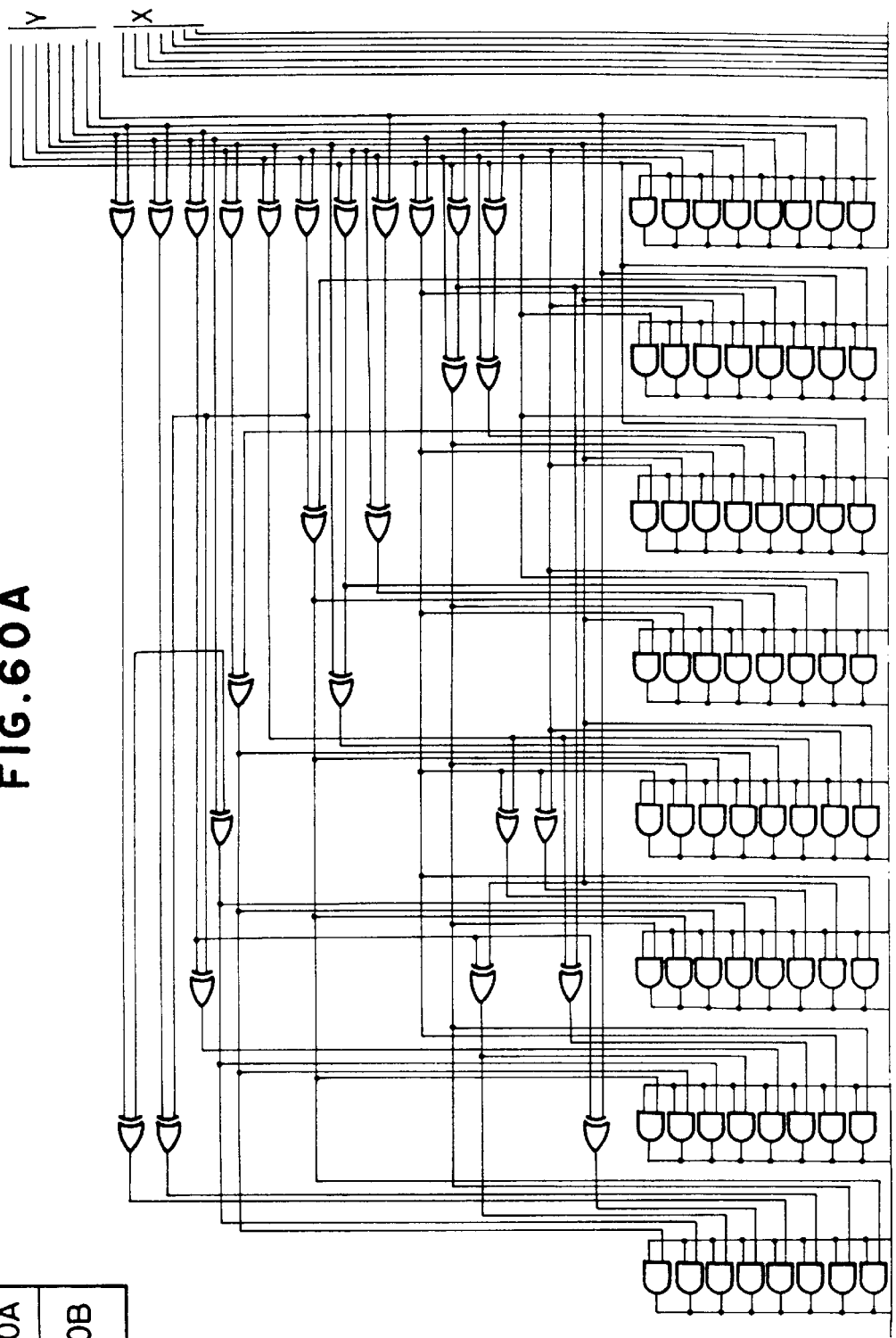
FIG. 60 is an illustration of an improvement in the multiplication circuit.
Figure 60B:
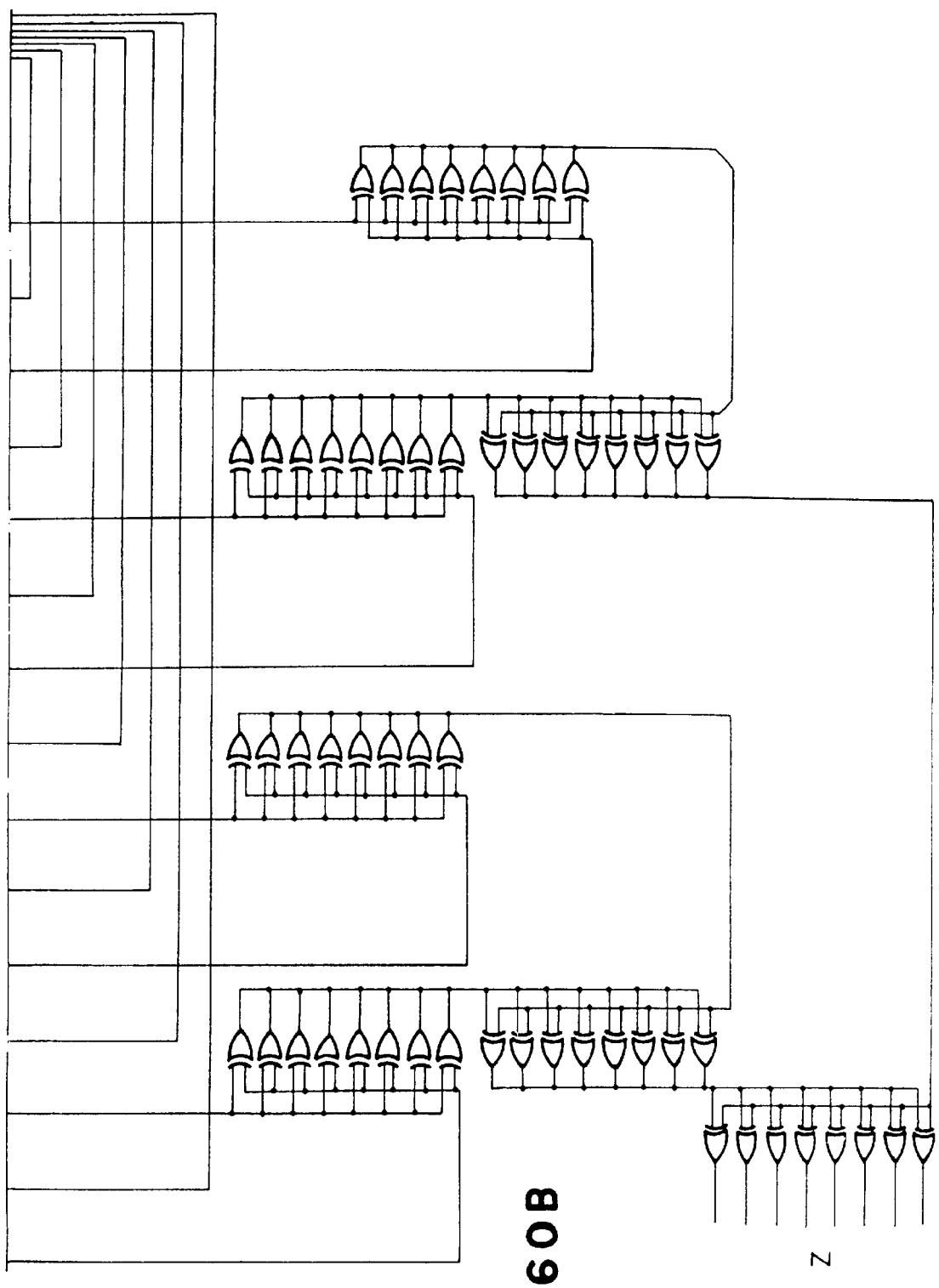

FIG. 60 shows a modification intended for minimizing delay time in the gate circuit which is formed by stacking of $\alpha$ circuits in seven stages as explained before. This modification therefore can increase the maximum processing speed.

A description will be made hereinunder as to the division circuit.

On a Galois function expressed by, for example, $GF(\alpha^{254})$, y/x is expressed as follows, due to the cyclic nature of the Galois function.

$$y/x = y \cdot x^{-1} = y \cdot x^{254} (\because \alpha^{255} = 1 = \alpha^0 \text{ so that } \alpha^{254} = \alpha^{-1})$$

Computation of $\alpha^{254}$ can be conducted without difficulty by a ROM. In this embodiment, however, this computation is conducted by making use of a gate circuit. Due to the nature of the Galois function, a circuit for computing any Galois function expressed by $x^{2m}$ (m=1, 2, ... ) can be constructed easily. This, however, is not the case of $x^{254}$. This embodiment, therefore, proposes a circuit which makes use of an $x^{2m}$ circuit and a multiplication circuit which are combined in a manner as simple as possible. It is also assumed here that the creation of $x^{254}$ from x has to be conducted within four clocks. To this end, $x^{254}$ is decomposed as follows.

$$x^{254} = x^{14} \cdot (x^{14} \cdot x^{16})^8$$

Therefore, provided that $x^{14}$ is determined, $x^{254}$ can be created by two multiplying operations, i.e., within two clocks. This means that two clocks may be used for two multiplying operations for determining $x^{14}$.

$$x^{14}=x^2 \cdot x^4 \cdot x^8$$

Thus, $x^2$ and $x^4$ are determined from x and $x^6$ is created in the period of first clock.

In the period of the second clock, $x^{14}$ is created from $x^6$ and $(x^4)^2$.

In the period of the third clock, $x^{30}$ is created from $x^{14}$ and $(x^8)^2$.

In the period of the fourth clock, $x^{254}$ is created from $x^{14}$ and $(x^{30})^2$.

If the requirement is only to determine $x^{254}$, the above-described multiplications are enough. In this case, however, it is necessary that $y \cdot x^{254}$ also is to be computed in the period of the fourth clock. To this end, $x^{14} \cdot y^2$ is used in place of $x^{14}$ used in the fourth clock. It is assumed that $x^{14} \cdot y$ is computed by another multiplication circuit.

Figure 61:
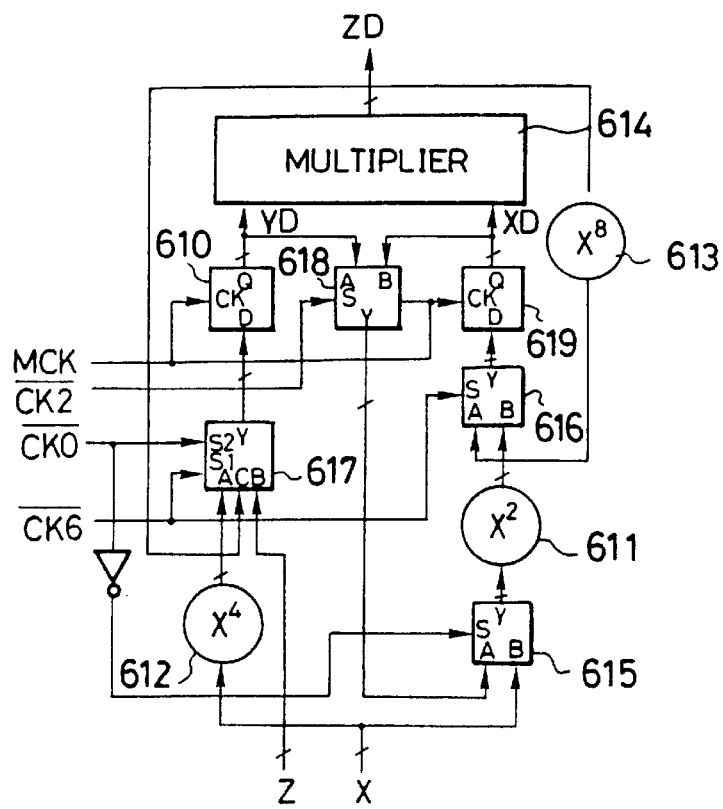
FIG. 61 is a block diagram of a division circuit used in the fifth embodiment of the invention.
Figure 63:
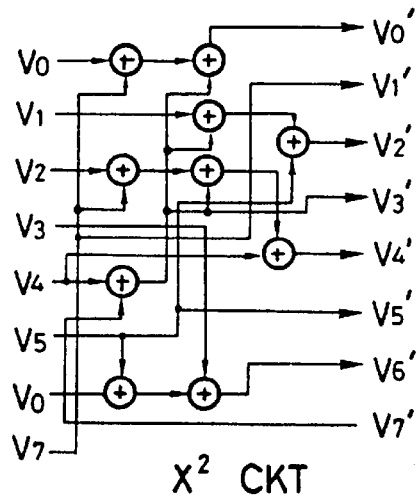
FIG. 63 is an illustration of the construction of an $X^2$ circuit in the division circuit.
Figure 64:
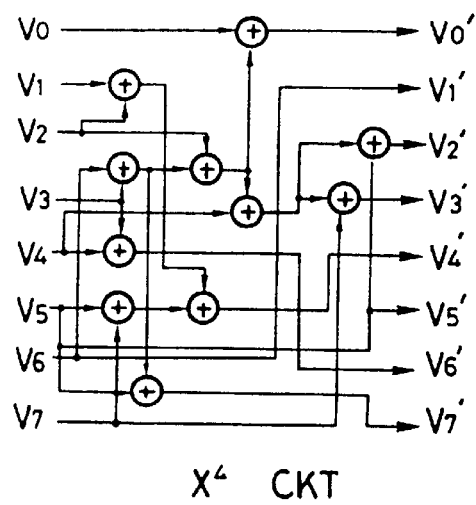
FIG. 64 is an illustration of the construction of an $X^4$ circuit.
Figure 65:
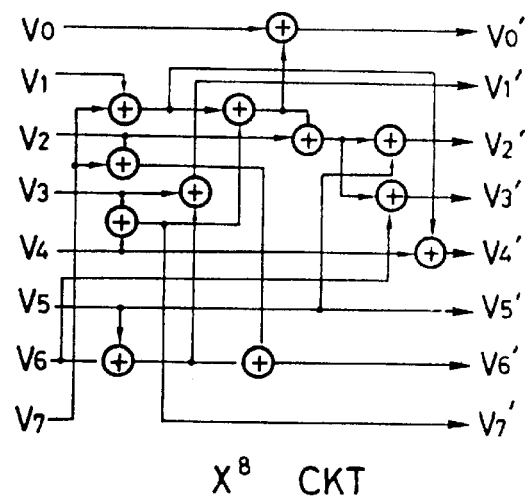
FIG. 65 is an illustration of the construction of an $X^8$ circuit.

FIG. 61 shows a block diagram of a circuit which is designed for conducting the above-described series of operations. This circuit is composed of $x^2$, $x^4$ and $x^8$ circuits 611, 612 and 613, a multiplier 4 and selections 615, 616, 617 and 618 for selecting the inputs and latches 619, 610 for correcting the delay by the gate. The constructions of the $x^2$, $x^4$ and $x^8$ circuits 611, 612 and 613 are shown in FIGS. 63, 64 and 65, respectively. A symbol $\oplus$ represents an Exclusive OR circuit, while a symbol represents a BUS line.

On condition of $x=V_7 \cdot \alpha^7 + V_6 \cdot \alpha^6 + V_5 \cdot \alpha^5 + V_4 \cdot \alpha^4 + V_3 \cdot \alpha^3 + V_2 \alpha^2 + V_1 \alpha + V_0$, $x^2$, $x^4$ and $x^8$ in the primitive polynominants $P(x)=x^8+x^4+x^3+x^2+1$ are expressed as follows.

$$\begin{aligned}
x^2 &= v_6\alpha^7 + (v_6 + v_5 + v_3)\,\alpha^6 + v_5\alpha^5 + (v_7 + v_5 + v_4 + v_2)\,\alpha^4 + (v_6 + v_4)\,\alpha^3 + (v_6 + v_5 + v_4 + v_1)\,\alpha^2 + v_7\alpha + (v_7 + v_6 + v_4 + v_0) \\
x^4 &= (v_6 + v_5 + v_3)\,\alpha^7 + (v_4 + v_3)\,\alpha^6 + v_5\alpha^5 + (v_7 + v_5 + v_2 + v_1)\,\alpha^4 + (v_7 + v_6 + v_4) + v_3 + v_2)\,\alpha^3 + v_6 + v_5 + v_4 + v_3 + v_2)\,\alpha^2 + v_6\alpha + (v_6 + v_3 + v_2 + v_0) \\
x^8 &= (v_4 + v_3)\,\alpha^7 + (v_7 + v_6 + v_5 + v_2)\,\alpha^6 + v_5\alpha^5 + (v_7 + v_4 + v_1)\,\alpha^4 + (v_7 + v_5 + v_4 + v_3 + v_2 + v_1)\,\alpha^3 + (v_7 + v_6 + v_4 + v_3 + v_2 + v_1)\,\alpha^2 + (v_6 + v_5 + v_3)\,\alpha + (v_7 + v_4 + v_3 + v_1 + v_0) + v_7\alpha + (v_7 + v_6 + v_4 + v_0)
\end{aligned}$$

Figure 62:
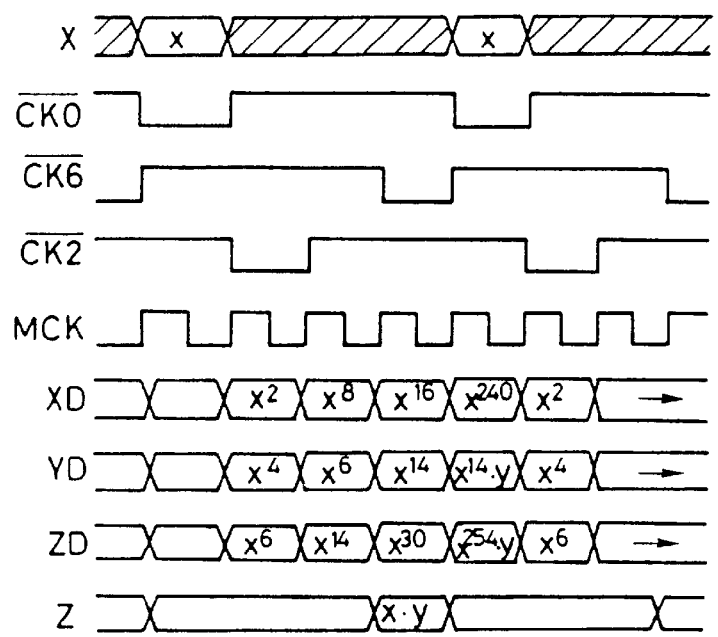
FIG. 62 is a timing chart showing the operation of the fifth embodiment.

FIG. 62 is a timing chart illustrating the operation of the circuit shown in FIG. 61.

Figures 66, 66A:
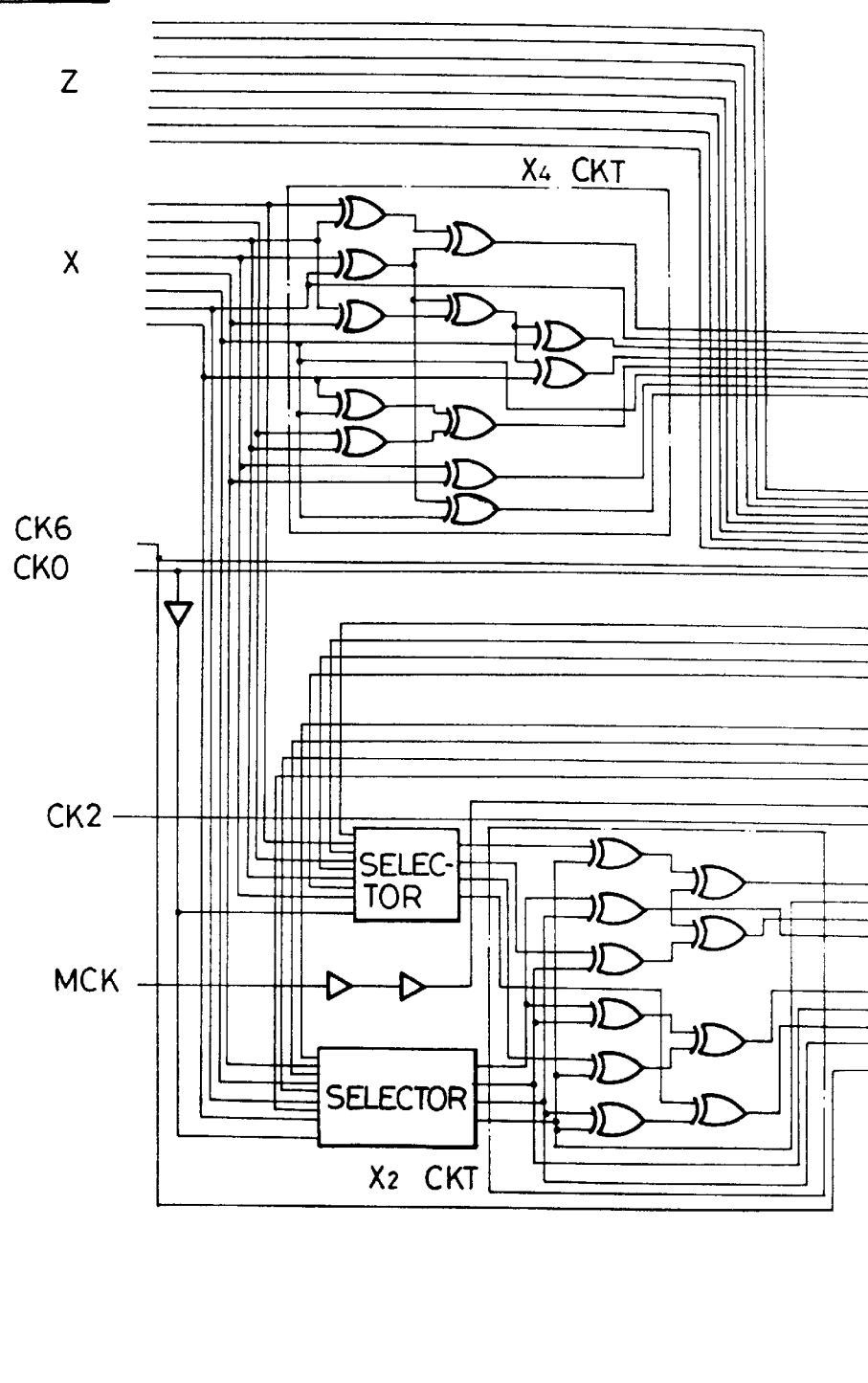
FIG. 66 is an illustration of an improvement in the division circuit.
Figure 66B:
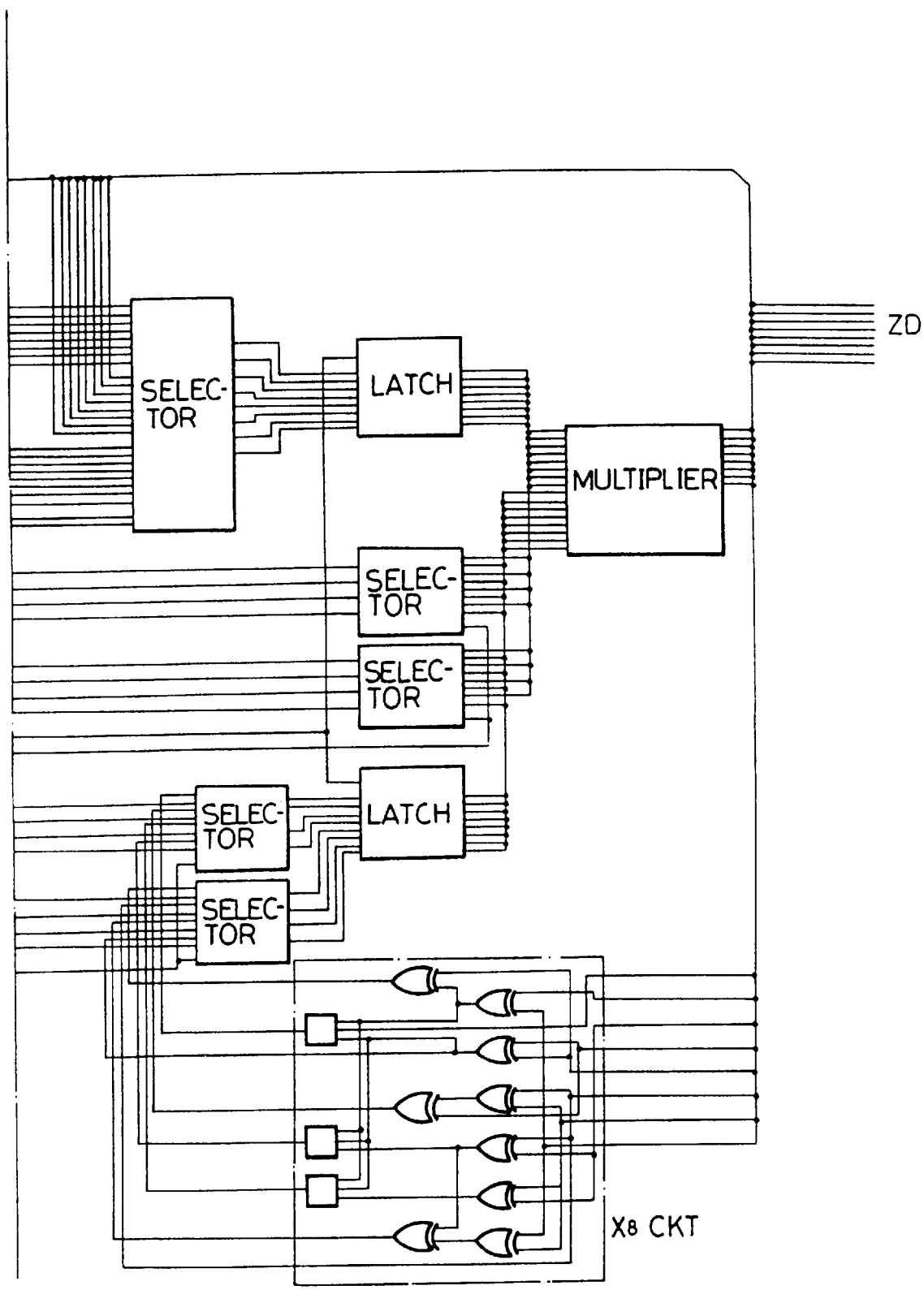

FIG. 66 shows a division circuit having different forms of the $x^2$, $x^4$ and $x^8$ circuits 61, 62 and 63, which improve the processing speed of the division circuit considerably.

A description will be made as to an exponent/vector conversion circuit. When the Galois function is the one which is represented by $GF(2^8)$, the exponent n is input to the exponent/vector conversion circuit in a binary form (N7 to N0: Ni=1 or 0) and is expressed as follows. The exponent n is then decomposed for the purpose of creation of $\alpha^n$.

$$\begin{aligned}
n &= N7 \cdot 128 + N6 \cdot 64 + N5 \cdot 32 + N4 \cdot 16 + N3 \cdot 8 + N2 \cdot 4 + N1 \cdot 2 + N0 \cdot 1 \\
\alpha^n &= \alpha^{N7 \cdot 128} \cdot \alpha^{N6 \cdot 64} \cdot \alpha^{N5 \cdot 32} \cdot \alpha^{N4 \cdot 16} \cdot \alpha^{N3 \cdot 8} \cdot \alpha^{N2 \cdot 4} \cdot \alpha^{N1 \cdot 2} \cdot \alpha^{N0}
\end{aligned}$$

Thus, the exponent/vector conversion can be accomplished by constructing a circuit which outputs $\alpha^{2^i}$ when Ni (i=0, ..., 7) is 1, and successively multiplying the outputs of such a circuit. An example of such a circuit is shown by block diagram in FIG. 67, while the timing of operation of this circuit is shown in FIG. 68. When binary expressions of a code length n are successively fed starting with N0 and ending with N7, outputs $\alpha^{N0}$ to $\alpha^{N7 \cdot 128}$ are successively obtained at the BUS line Y and are sent to a multiplication circuit 672. The output Z of the multiplication circuit 672 successively produces values multiplied with a $\alpha^{N0}$ to $\alpha^{N7 \cdot 128}$ These outputs are registered in a register 3 and are input to another input terminal x of the multiplication circuit 672. It is to be noted that the content of the register is beforehand set such that 1 is output to the terminal X when the Y initially outputs $\alpha^{N0}$, so that $\alpha^n$ is produced when $\alpha^{N7 \cdot 128}$ is output.

Figure 69:
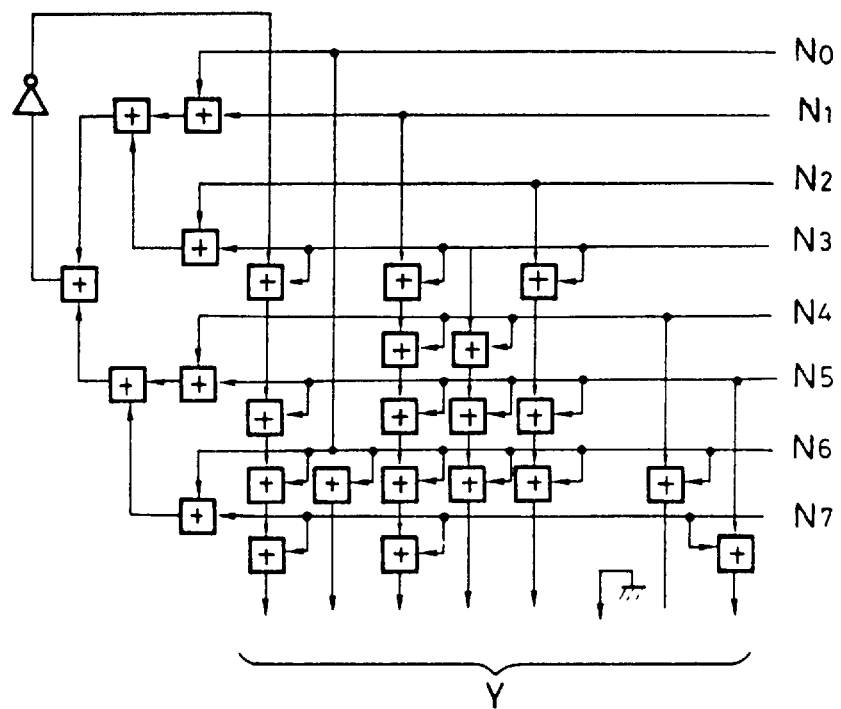
FIG. 69 is an illustration of the construction of an exponent/vector circuit.

The construction of the exponent/vector conversion circuit 671, which is adapted to successively output $\alpha^{N0}$ to $\alpha^{N7 \cdot 128}$ in accordance with binary-coded exponents N0 to N7, is shown in FIG. 69.

Hitherto, this circuit has been constituted by a ROM. In contrast, the described embodiment realizes this circuit by combination of gates. In FIG. 69, a symbol represents an OR circuit.

When the irreducible polynomial is expressed by $P(x)=x^8+x^4+x^3+x^2+1$ and on condition of Ni=1 (i=0→7), the circuit shown in FIG. 69 successively outputs $\alpha=(01000000)$, $\alpha^2=(00100000)$, $\alpha^4=(00001000)$, $\alpha^8=(10111000)$, $\alpha^{16}=(00110010)$, $\alpha^{32}=(10111001)$, $\alpha^{64}=(11111010)$ and $\alpha^{128}=(10100001)$, and outputs 1 on condition of Ni=0.

It is thus possible to conduct conversion of an exponentially expressed value n into vector expression $\alpha^n$ by a simplified gate circuit arrangement, in contrast to conventional art in which this conversion is conducted by a ROM.

Figure 67:
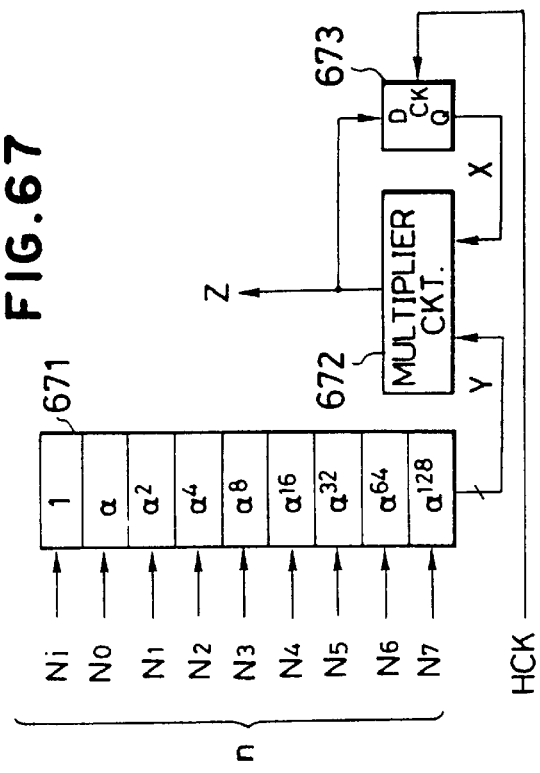
FIG. 67 is a block diagram of an exponent/vector conversion circuit used in the fifth embodiment of the invention.
Figure 68:
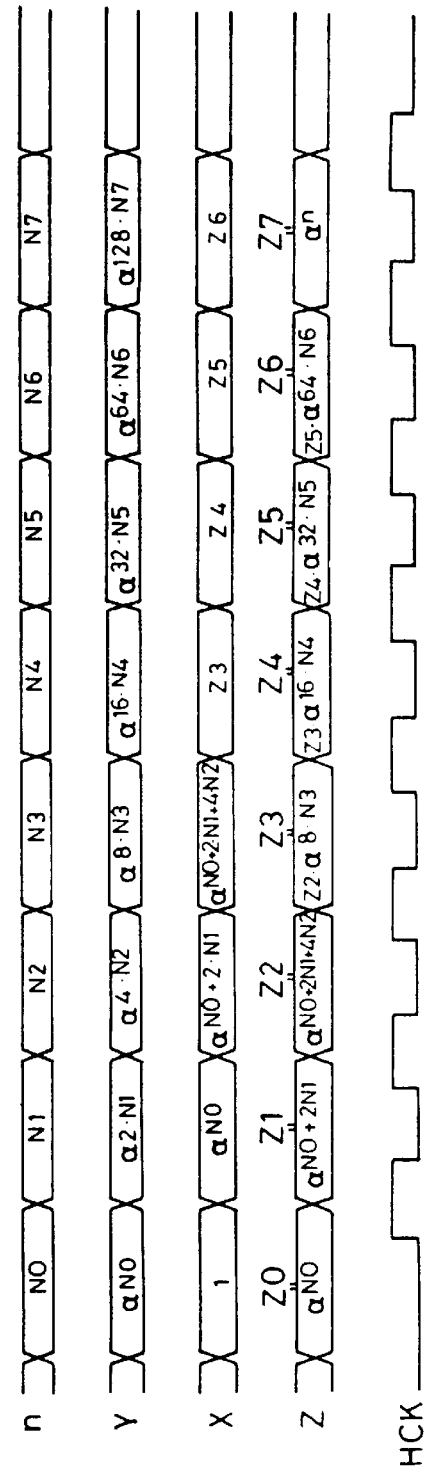
FIG. 68 is a timing chart showing the operation of the circuit shown in FIG. 67.

The circuit shown in FIG. 67 necessitates 8 clocks for serially outputting N0 to N7 until $\alpha^n$ is formed. When it is desired to reduce the number of clock inputs, the arrangement may be modified such that N0 to N7 are output in a parallel form and a plurality of multiplication circuits are used to reduce the number of input clocks. In such a modification, however, the size of the circuit will be slightly increased as compared with that of the described embodiment.

What is claimed is:

1. An exponent/vector conversion apparatus for converting an exponential expression of an element $\alpha^n$ on a Galois field $GF(2^m)$ into a vector expression using $\alpha^j$ ($0 \leq j \leq m-1$) as a basis thereof, where $\alpha$ is a primitive element and $n=2^{m-1} \cdot N_{m-1} + 2^{m-2} \cdot N_{m-2} + \ldots + 2 \cdot N_1 + N_0$, comprising:

logic circuit means for outputting a vector expression of $\alpha^{2^i}$ when 1 is input to an i-th input terminal and for outputting 1 when 0 is input to the j-th input terminal, said logic circuit means being input Ni (i=0 ... m-1) from the i-th input terminal thereof and outputting $\alpha^{2^i \cdot Ni}$, successively;

register means for storing data; and multiplication circuit means for successively multiplying the outputs from said logic circuit means and a content of said register means, and successively updating the content of said register means by the result of multiplication, thereby outputting the vector expression of the element $\alpha^n$ as the result of m-th multiplication.

2. An apparatus according to claim 1, wherein said logic circuit means includes a plurality of exclusive OR gates.

3. An apparatus according to claim 1, wherein said logic circuit means includes an inverter.

4. An apparatus according to claim 1, wherein m=8 and $\alpha$ is a root of $x^8+x^4+x^3+x^2+1=0$.

* * * * *

UNITED STATES PATENT AND TRADEMARK OFFICE
CERTIFICATE OF CORRECTION

PATENT NO. : 5,774,389

DATED : June 30, 1998

INVENTOR : KEIICHI IWAMURA

It is certified that error appears in the above-identified patent and that said Letters Patent is hereby corrected as shown below:

IN THE DRAWINGS

Sheet 31:

Figure 47, "SUBTRACTOR" should read --SUBTRACTER--.

Sheet 32:

Figure 48, "SUBTRACTOR" should read --SUBTRACTER--.

IN THE DISCLOSURE

COLUMN 1:

Line 49, "read solomon" should read --Reed-Solomon--; and
Line 67, "Consequence," should read --Consequently,--.

COLUMN 4:

Line 27, "primitive," should read --primitive--.

UNITED STATES PATENT AND TRADEMARK OFFICE
CERTIFICATE OF CORRECTION

PATENT NO. : 5,774,389

DATED : June 30, 1998

INVENTOR : KEIICHI IWAMURA

It is certified that error appears in the above-identified patent and that said Letters Patent is hereby corrected as shown below:

COLUMN 5:

Line 10, "unknown" should read --unknowns--;
Line 23, "which is improved to enable" should read --which enables the--;
Line 24, "as number" should read --as the number--;
Line 25, "to be alive in" should read --to be applicable to a--; and
Line 64, "a" should read --an--.

COLUMN 7:

Line 50, "Reed Solomon" should read --Reed-Solomon--; and
Line 64, "when" should read --case when--.

COLUMN 9:

Line 24, "$\alpha^{n-k} \alpha^{n-i}$" should read --$\alpha^{n-k} \alpha^{n-1}$--.

COLUMN 11:

Line 14, "the apparatus" should read --in the apparatus--.

UNITED STATES PATENT AND TRADEMARK OFFICE
CERTIFICATE OF CORRECTION

PATENT NO. : 5,774,389

DATED : June 30, 1998

INVENTOR : KEIICHI IWAMURA

It is certified that error appears in the above-identified patent and that said Letters Patent is hereby corrected as shown below:

COLUMN 13:

Line 61, "output" should read --outputs--.

COLUMN 14:

Line 3, "is" should read --are--.

COLUMN 15:

Line 18, "and" should be deleted; and
    Line 65, "Reed Solomon" should read --Reed-Solomon--.

COLUMN 17:

Line 2, "$A^{-1} \cdot B$" should read --$A^{-1} \cdot B$--;

Line 37, "$S1 \quad S2$" should read --$S1 \overset{SI}{=} S2$--; and

UNITED STATES PATENT AND TRADEMARK OFFICE
CERTIFICATE OF CORRECTION

PATENT NO. : 5,774,389

DATED : June 30, 1998

INVENTOR : KEIICHI IWAMURA

It is certified that error appears in the above-identified patent and that said Letters Patent is hereby corrected as shown below:

COLUMN 17 (cont'd):

Line 38, "$S1\alpha^2 \cdot S2\alpha^3$" should read
$$\begin{matrix} SII \\ \| \\ S1\alpha^2 \quad S2\alpha^3 \end{matrix}$$

COLUMN 18:

Line 64, "$ei \cdot (1+\alpha^{ki}) + ej \cdot (1+\alpha^{kj})$" should read
--$ei \cdot (1+\alpha^{k-i}) + ej \cdot (1+\alpha^{k-j})$--.

COLUMN 19:

Line 11, "L2'20" should read --L2 = 0--; and
    Line 47, "$\alpha^{32} \cdot S3$" should read --$\alpha^3 \cdot S3$--.

COLUMN 21:

Line 2, "has" should read --have--.

COLUMN 22:

Line 32, "a manner" should read --manner--; and

UNITED STATES PATENT AND TRADEMARK OFFICE
CERTIFICATE OF CORRECTION

PATENT NO. : 5,774,389

DATED : June 30, 1998

INVENTOR : KEIICHI IWAMURA

It is certified that error appears in the above-identified patent and that said Letters Patent is hereby corrected as shown below:

COLUMN 22 (cont'd):

Line 59, "computing" should read --compute--.

COLUMN 23:

Line 3, "for attaining as timing optimum" should read --for attaining optimum timing--;
    Line 12, "α2" should read --$\alpha^2$--; and
    Line 25, "Consequence," should read --Consequently,--.

COLUMN 24:

Line 35, "the" should read --by the--.

COLUMN 25:

Line 27, "symbol" should read --symbol $j$--;
    Line 28, "$V_5 \cdot ^5$" should read --$V_5 \cdot \alpha^5$--;
    Line 29, "polynominants" should read --polynomial--; and

UNITED STATES PATENT AND TRADEMARK OFFICE
CERTIFICATE OF CORRECTION

PATENT NO.   : 5,774,389

DATED        : June 30, 1998

INVENTOR     : KEIICHI IWAMURA

It is certified that error appears in the above-identified patent and that said Letters Patent is hereby corrected as shown below:

COLUMN 25 (cont'd):

Line 37, "$(v_7+v_6+v_4)+v_3+v_2)\ \alpha^3$" should read --$(v_7+v_6+v_4+v_3+v_2)\ \alpha^3$-- and "$v_6+v_5+$" should read --$(v_6+v_5+$--.

COLUMN 26:

Line 8, "$\alpha^{N7 \cdot 128}$" should read --$\alpha^{N7 \cdot 128}$.--.

Signed and Sealed this

Eighth Day of June, 1999

Attest:

Q. TODD DICKINSON

*Attesting Officer*   *Acting Commissioner of Patents and Trademarks*